(12) United States Patent
Valenti et al.

(10) Patent No.: US 10,637,199 B2
(45) Date of Patent: Apr. 28, 2020

(54) COMMUNICATION CONNECTOR TO WITHSTAND POWER OVER ETHERNET

(71) Applicant: Panduit Corp., Tinley Park, IL (US)

(72) Inventors: Joshua A. Valenti, Ferndale, MI (US); Satish I. Patel, Roselle, IL (US); Robert E. Fransen, Orland Park, IL (US); Michael B. Verbeek, Crown Point, IN (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 16/177,607

(22) Filed: Nov. 1, 2018

(65) Prior Publication Data

US 2019/0074647 A1    Mar. 7, 2019

Related U.S. Application Data

(63) Continuation of application No. 15/058,349, filed on Mar. 2, 2016, now abandoned.

(51) Int. Cl.
| | |
|---|---|
| *H01R 24/64* | (2011.01) |
| *H01R 13/66* | (2006.01) |
| *H01R 107/00* | (2006.01) |
| *H01R 24/62* | (2011.01) |

(52) U.S. Cl.
CPC ......... *H01R 24/64* (2013.01); *H01R 13/6658* (2013.01); *H01R 24/62* (2013.01); *H01R 2107/00* (2013.01); *H05K 2201/09709* (2013.01); *Y10S 439/9241* (2013.01)

(58) Field of Classification Search
CPC ......... H05K 12/75; H05K 2201/09709; H01R 24/62; H01R 24/64; Y10S 439/9241
USPC .......................................................... 439/676
See application file for complete search history.

(56) References Cited

U.S. PATENT DOCUMENTS

| | | | |
|---|---|---|---|
| 7,252,554 B2 * | 8/2007 | Caveney | H05K 1/028 439/676 |
| 9,419,391 B2 | 8/2016 | Bolouri et al. | |
| 9,531,135 B2 | 12/2016 | Navarro et al. | |
| 2013/0090011 A1 * | 4/2013 | Bolouri-Saransar | H01R 13/6461 439/620.15 |
| 2014/0273633 A1 * | 9/2014 | Navarro | H01R 13/665 439/620.01 |

* cited by examiner

*Primary Examiner* — Abdullah A Riyami
*Assistant Examiner* — Justin M Kratt
(74) *Attorney, Agent, or Firm* — Christopher S. Clancy; James H. Williams; Peter S. Lee

(57) ABSTRACT

The present invention generally relates to the field of telecommunication, and more particularly, to the field of connectors such as plugs and/or jacks used to interconnect electronic equipment. In an embodiment, the present invention is a shielded RJ45 network jack with an inter-jack connection method that has an electrical disengagement point outside of any electrical mating points, while still allowing for a relatively short distance to compensation from the plug/jack mating interface.

4 Claims, 54 Drawing Sheets

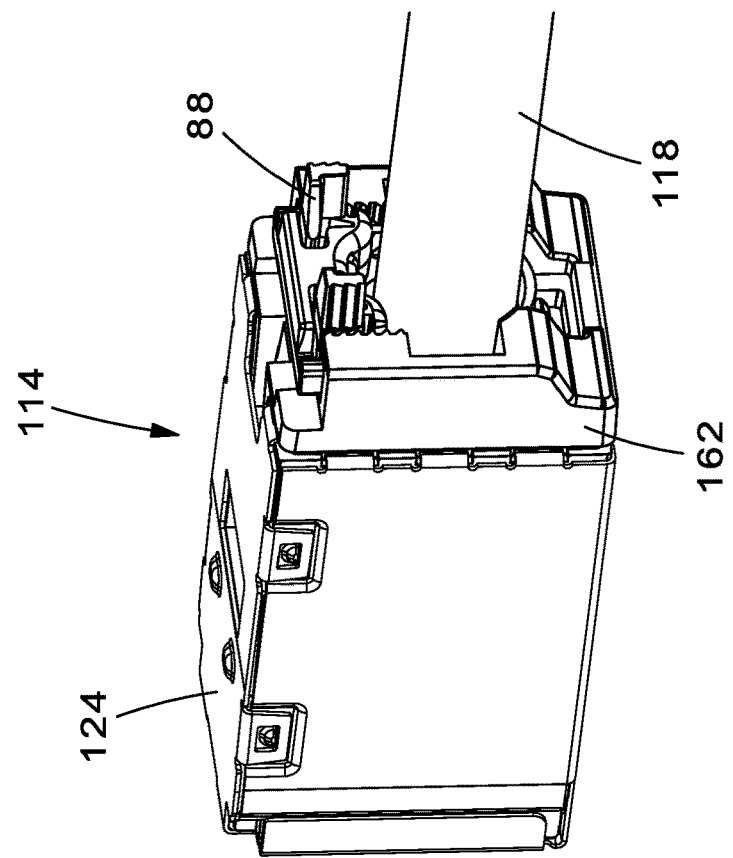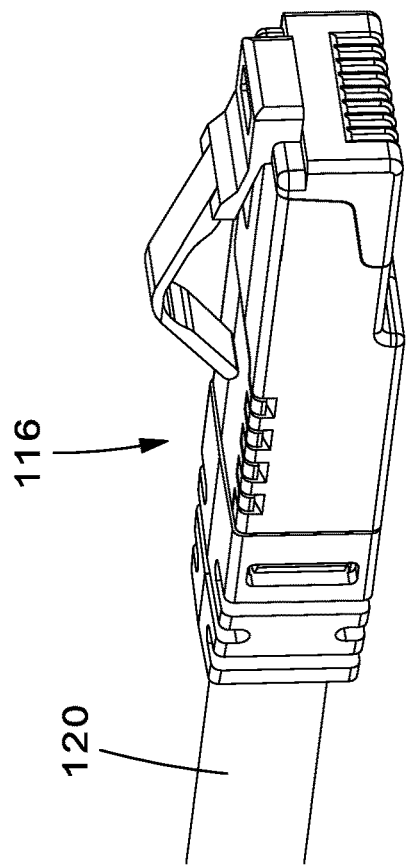
Fig.5

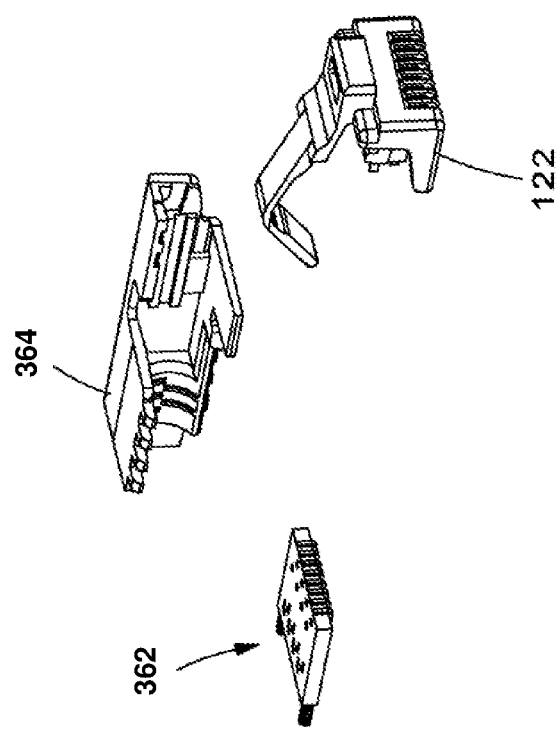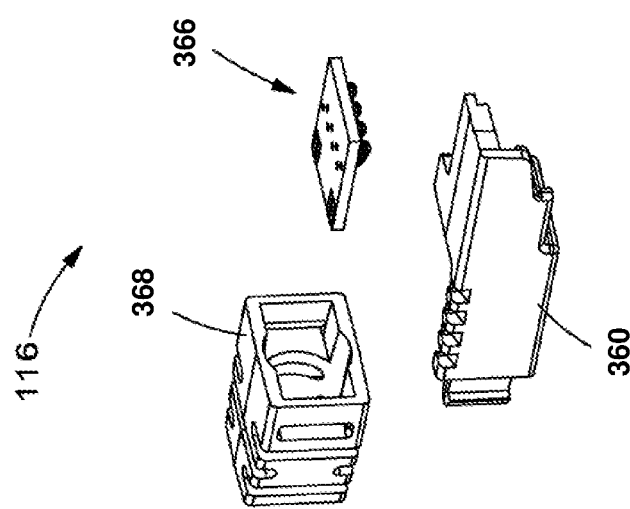
Fig.51

COMMUNICATION CONNECTOR TO WITHSTAND POWER OVER ETHERNET

CROSS REFERENCE TO RELATED APPLICATIONS

This application is a continuation of U.S. patent application Ser. No. 15/058,349, filed Mar. 2, 2016, the subject matter of which is hereby incorporated by reference in its entirety.

FIELD OF INVENTION

The present invention generally relates to the field of telecommunication, and more particularly, to the field of connectors such as plugs and/or jacks used to interconnect electronic equipment.

BACKGROUND

It is common practice to use modular (e.g., RJ45) plugs and jacks in combination with twisted pair cabling to interconnect electronic equipment. While the primary purpose of this type of connectivity is to enable the flow of data, it is also possible to use the same medium to transmit limited amounts of power. This is generally referred to as Power over Ethernet (PoE).

PoE allows a single cable to provide both electrical power and data connections, which may eliminate the need for additional power cables and devices such as transformers and AC outlets. Some non-limiting examples of PoE devices include Voice over Internet Protocol (VoIP) phones, wireless access points, network routers, switches, industrial devices (controllers, meters, sensors, etc.), nurse call stations, IP security cameras, televisions, LED lighting fixtures, remote point of sale kiosks, and physical security devices. PoE was launched into the market in 2003, standardized under IEEE 802.3af, and allowed for a power draw of 12.95 W and 350 mA per pair (Type 1). POE+ was launched into the market in 2009, standardized under IEEE 802.3at, and allowed for a power draw of 25.5 W and 600 mA per pair (Type 2). As the need for more and more power becomes apparent, non-standard applications, such as Cisco's Universal Power over Ethernet (UPoE) at 60 W and Power over HDBaseT (100 W), with 1000 mA per pair of current capacity, have arisen. As of 2015 there is a proposal for an IEEE 802.3bt (PoE++) standard with 49 W (Type 3) to 100 W (Type 4) of power draw and 600 mA (Type 3) to 1000 mA (Type 4) per pair of power, and other potential future applications may require a current capacity of 1500 mA per pair or more.

While the earlier-designed connectors could withstand the rigors of the relatively low power required for earlier PoE applications, these connectors lack the design for durability needed to sustain the ever-increasing power demands. One particular issue is the need to reduce damage that occurs to the plug and/or jack during the mating and disconnection.

In a PoE application, upon disconnection (and/or insertion) of the plug and jack connector combination there is an electrical discharge that can damage the plug and jack mating interfaces. This electrical discharge can be an electrical arc (spark) or a corona discharge. A spark is a fast single event that is time independent and may cause a large distinct crater on the plug contacts of the plug, the plug interface contacts (PICs) of the jack, or both. A corona discharge is a relatively slower event that is time dependent, has multiple events, and causes many shallow craters or pits that erode the plug contacts, PICs, or both. These effects are worsened after multiple insertions as erosion caused by mechanical abrasion also damages the plug/jack mating interfaces of both the plug contacts and the PICs. IEC 60603-7 requires a minimum of 750 plug insertions into a jack module. Many vendors test to a higher amount of insertion cycles as for some applications 750 plug insertions is relatively low. The effects of this damage can be seen in the form of physical damage, electrical interface degradation, and, over time, corrosion of the contacts.

Additional constraints on the design are imposed by the need of the connectors to handle a certain amount of bandwidth while at the same time meeting particular parameters such as, for example, near end crosstalk (NEXT), far end crosstalk (FEXT), return loss, and insertion loss requirements. As such, these and other design concerns give rise to the need for robust connectors designed to withstand current and future demands of PoE.

SUMMARY

Accordingly, at least some embodiments of the present invention are directed towards devices, systems, and methods which are related to connectors designed to withstand current and future PoE demands.

In an embodiment, the present invention is a shielded RJ45 network jack with an inter-jack connection method that has an electrical disengagement point outside of the plug/jack mating point, while still allowing for a relatively short distance to compensation from the plug/jack mating interface.

In another embodiment, the present invention is an RJ45 plug assembly with an inter-plug connection method that has an electrical disengagement point outside of preferred mating points.

In yet another embodiment, the present invention is a communication connector that includes a connector housing, a plurality of first contacts positioned at least partially within the connector housing, each of the first contacts configured to interface with one of a plurality of interface contacts of a corresponding connector, a printed circuit board (PCB), the plurality of first contacts being positioned on the PCB, the PCB further including a plurality of second contacts, each of the second contacts being connected to one of the first contacts and having a mating portion and a disconnect portion; and a plurality of third contacts, each of the third contacts having a mating section configured to interface with one of the mating portions and a disconnect section configured to interface with one of the disconnect portions.

In still yet another embodiment, the present invention is a communication connector that includes a connector housing, a plurality of first contacts positioned at least partially within the connector housing, each of the first contacts configured to interface with one of a plurality of interface contacts of a corresponding connector, a printed circuit board (PCB), the plurality of first contacts being positioned on the PCB, the PCB further including a plurality of second contacts, each of the second contacts being connected to one of the first contacts and having a mating portion and a disconnect portion, and a plurality of third contacts, each of the third contacts having a preferred mating leg configured to interface with one of the mating portions and a sacrificial leg configured to interface with one of the disconnect portions.

In still yet another embodiment, the present invention is a communication connector connectable to at least one of a communication cable and communication equipment, the communication connector capable of transmitting power over Ethernet. The communication connector includes means for interfacing the communication connector with a corresponding connector, means for establishing an electrical path between the corresponding connector and the at least one of the communication cable and the communication equipment, the means for establishing the electrical path being located within the communication connector and occurring over a first physical path, and means for breaking the electrical path between the corresponding connector and the at least one of the communication cable and the communication equipment, the means for breaking the electrical path being located within the communication connector and occurring over a second physical path.

In still yet another embodiment, the present invention is a communication system that includes a communication plug including a plurality of plug contacts and a plurality of plug cable contacts, and a communication jack including a plurality of plug interface contacts (PICs) and a plurality of jack cable contacts. The communication plug is configured to mate with the communication jack such that each of the plug contacts comes into contact with one of the PICs, a current path being established between each of the plug cable contacts and one of the jack cable contacts when the communication plug is mated with the communication jack, the communication plug is further configured to disconnect from the communication jack such that each the current path is broken while each of the plug contacts maintains contact with one of the PICs.

In still yet another embodiment, the present invention is a communication system that includes a communication plug including a plurality of plug contacts and a plurality of plug cable contacts, and a communication jack including a plurality of plug interface contacts (PICs) and a plurality of jack cable contacts. The communication plug is configured to mate with the communication jack such that each of the plug contacts comes into contact with one of the PICs, a current path being established between each of the plug cable contacts and one of the jack cable contacts when the communication plug is mated with the communication jack, the communication plug is further configured to disconnect from the communication jack such that each the current path is broken at a point other than between each of the plug contacts and respective one of the PICs.

In still yet another embodiment, the present invention is a communication system that includes, a communication plug including a plurality of plug contacts and a plurality of plug cable contacts, and a communication jack including a plurality of plug interface contacts (PICs) and a plurality of jack cable contacts. The communication plug is configured to mate with the communication jack such that each of the plug contacts comes into contact with one of the PICs, a current path being established between each of the plug cable contacts and one of the jack cable contacts when the communication plug is mated with the communication jack, each the current path traversing one of the plug contacts and respective one of the PICs. The communication plug is further configured to disconnect from the communication jack such that at least one the current path is broken while respective one of the plug contacts maintains contact with respective one of the PICs.

In still yet another embodiment, the present invention is a communication system including a communication plug and a communication jack. The communication system includes means for connecting the communication plug to a plug-cable having at least one conductor. The communication system also includes means for connecting the communication jack to a jack-cable having at least one conductor.

The communication system also includes means for electrically and physically interfacing the communication plug with the communication jack. The communication system also includes means for transmitting a current between the at least one conductor of the plug-cable and the at least one conductor of the jack-cable. The communication system also includes means for breaking the current at a point that does not include the means for electrically and physically interfacing the communication plug with the communication jack.

These and other features, aspects, and advantages of the present invention will become better-understood with reference to the following drawings, description, and any claims that may follow.

BRIEF DESCRIPTION OF THE DRAWINGS

FIGS. 3-5 are isometric views of the RJ45 jack and the RJ45 plug of FIG. 2 in an unmated state.

FIGS. 51-53 are isometric exploded views of an RJ45 plug according to an embodiment of the present invention

DETAILED DESCRIPTION

Figure 1:
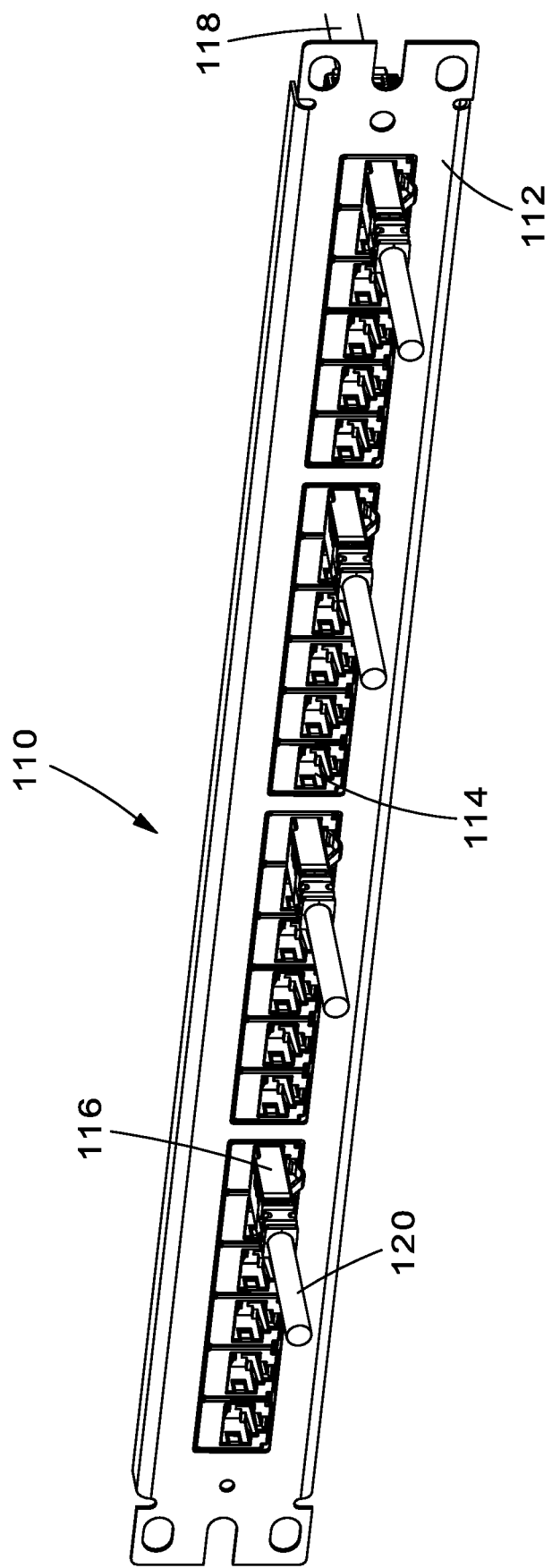
FIG. 1 is a communication system according an embodiment of the present invention.

An exemplary embodiment of the present invention is illustrated in FIG. 1, which shows a communication system 110, which includes a patch panel 112 with RJ45 jacks 114 and corresponding RJ45 plugs 116. Respective cables 120 are terminated to plugs 116, and respective cables 118 are terminated to jacks 114. Once a plug 116 mates with a jack 114 data can flow in both directions through these connectors. Although the communication system 110 is illustrated in FIG. 1 as having a patch panel, alternative embodiments can include other active or passive equipment. Examples of passive equipment can be, but are not limited to, modular patch panels, punch-down patch panels, coupler patch panels, wall jacks, etc. Examples of active equipment can be, but are not limited to, Ethernet switches, routers, servers, physical layer management systems, and power-over-Ethernet equipment as can be found in data centers and or telecommunications rooms; security devices (cameras and other sensors, etc.) and door access equipment; and telephones, computers, fax machines, printers, and other peripherals as can be found in workstation areas. Communication system 110 can further include cabinets, racks, cable management and overhead routing systems, and other such equipment.

Figure 2:
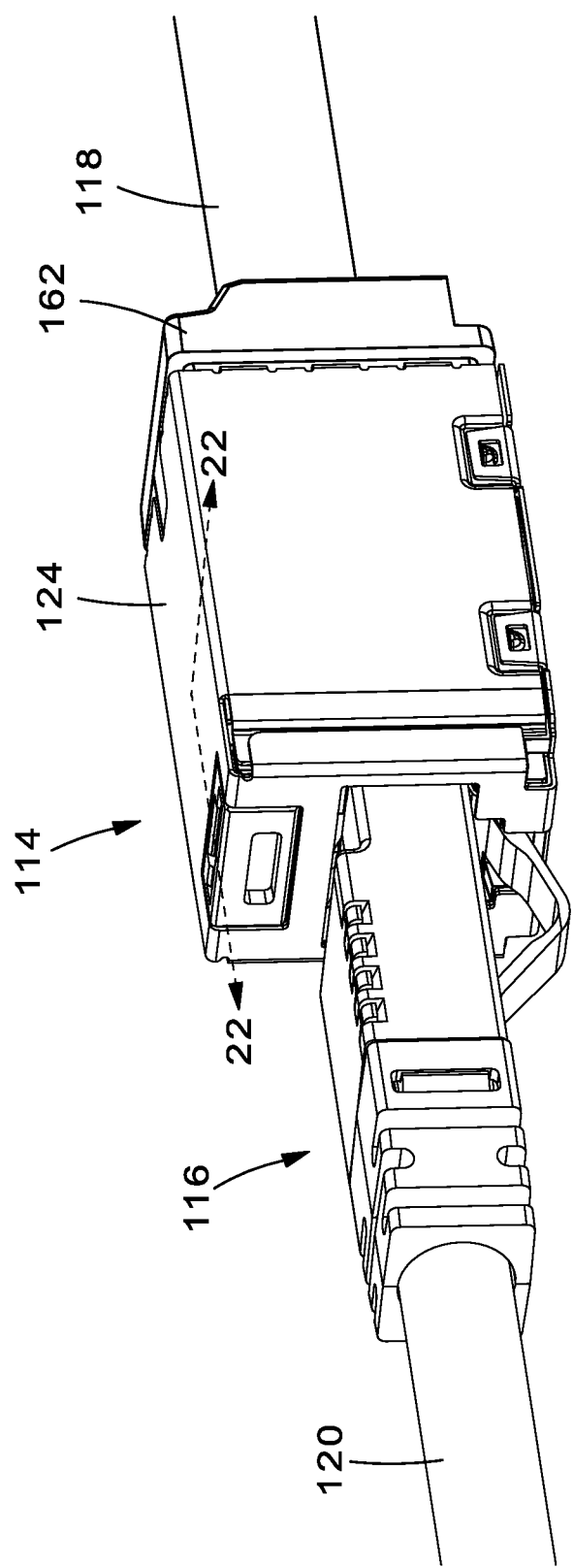
FIG. 2 is an isometric view of an RJ45 network jack mated with an RJ45 network plug according to an embodiment of the present invention.
Figure 3:
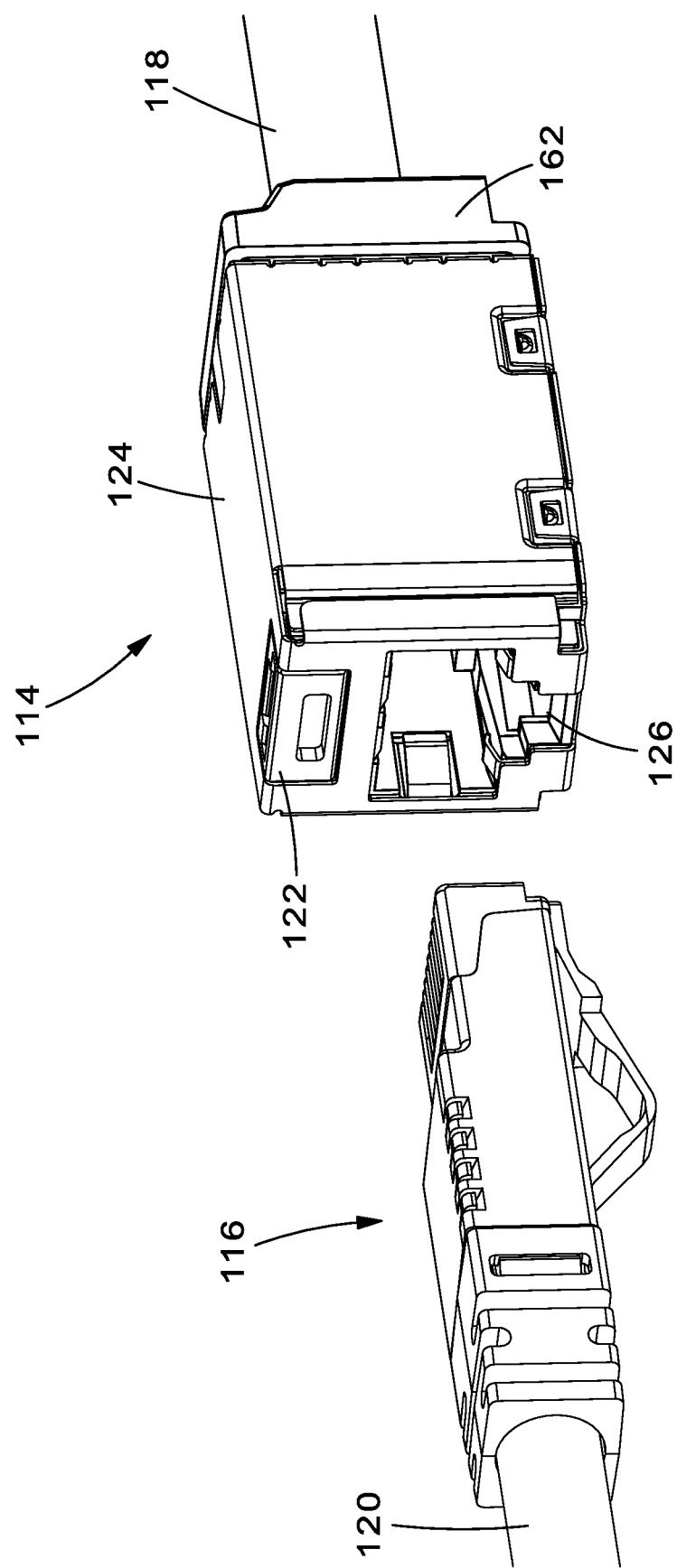
Figure 4:
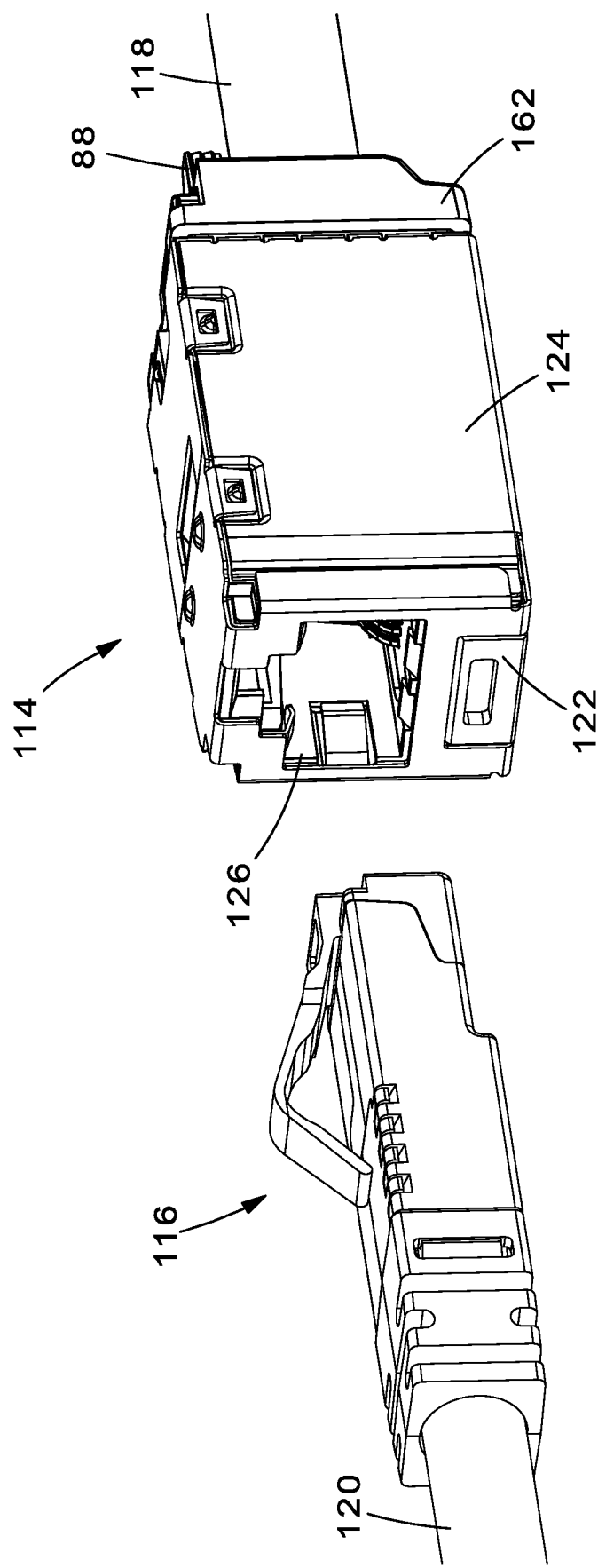

With the patch panel 112 removed, FIG. 2 illustrates the RJ45 jack 114 and the RJ45 plug 116 in a mated configuration, and FIGS. 3-5 illustrate the RJ45 jack 114 and the RJ45 plug 116 in an unmated configuration with FIG. 4 being rotated 180° about the central axis of cable 118 relative to FIG. 3, and FIG. 5 illustrating a rear isometric view relative to FIGS. 3 and 4.

Figure 6:
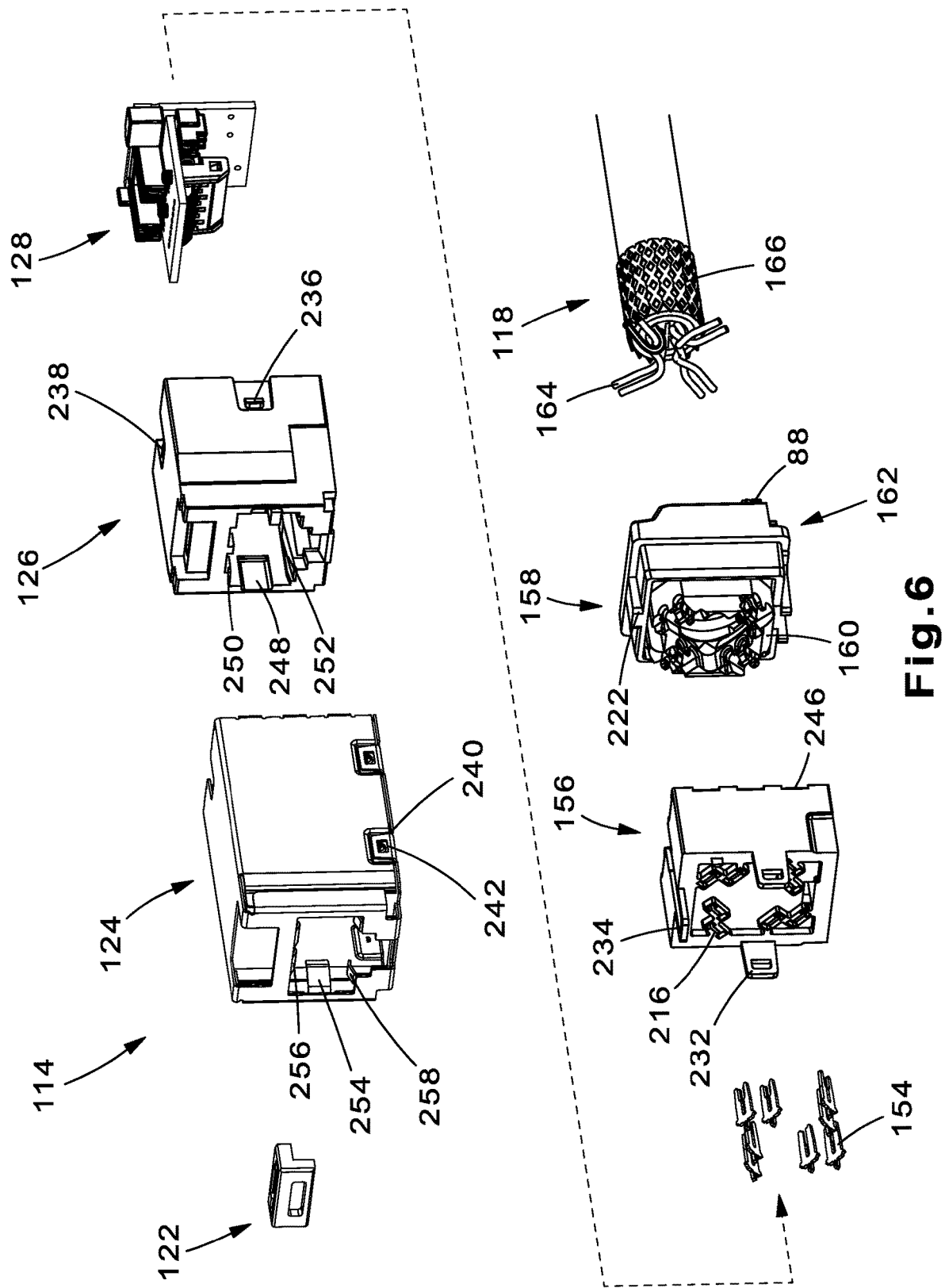
FIGS. 6-8 are isometric exploded views of an RJ45 jack according to an embodiment of the present invention.
Figure 7:
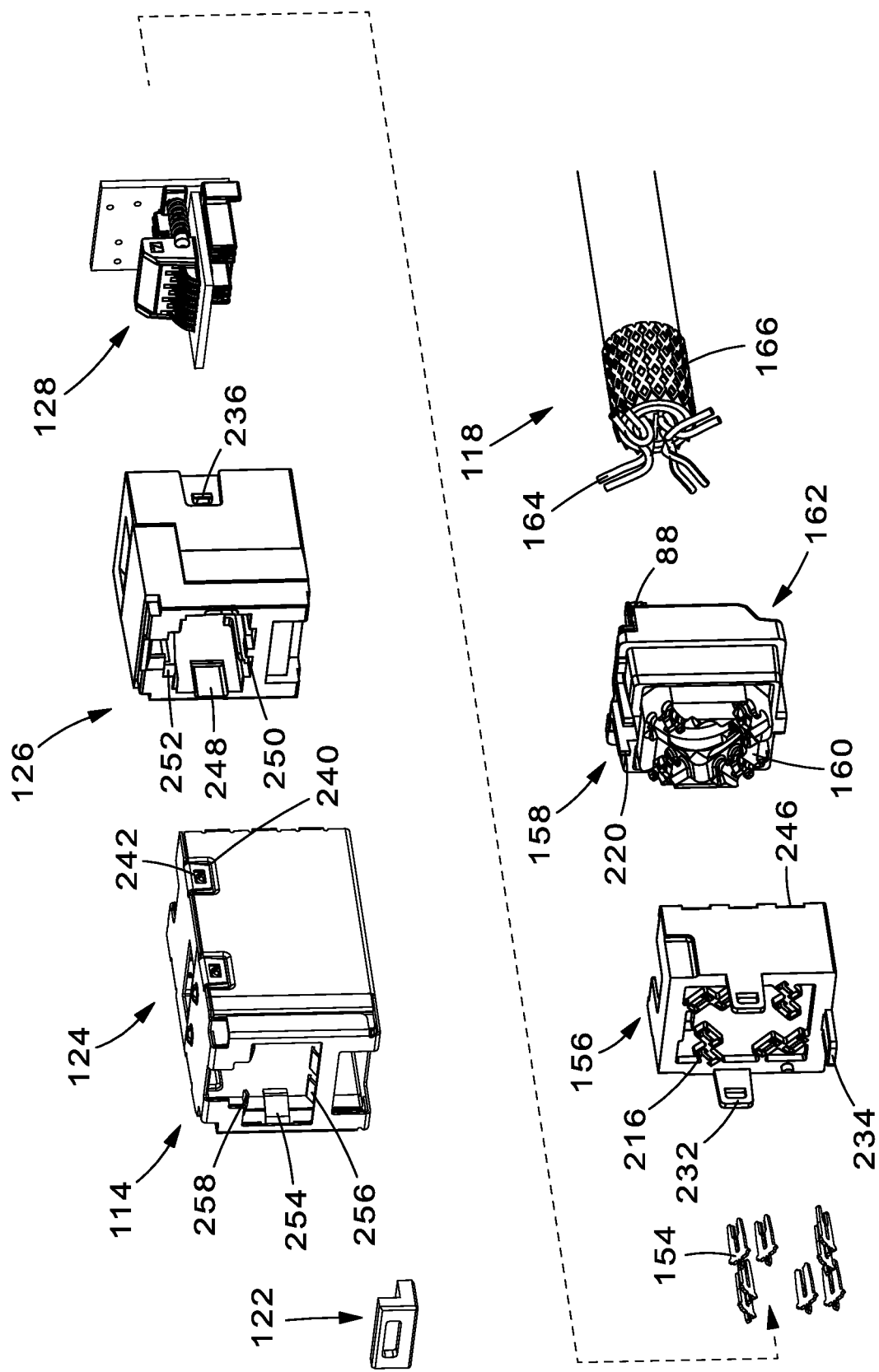
Figure 8:
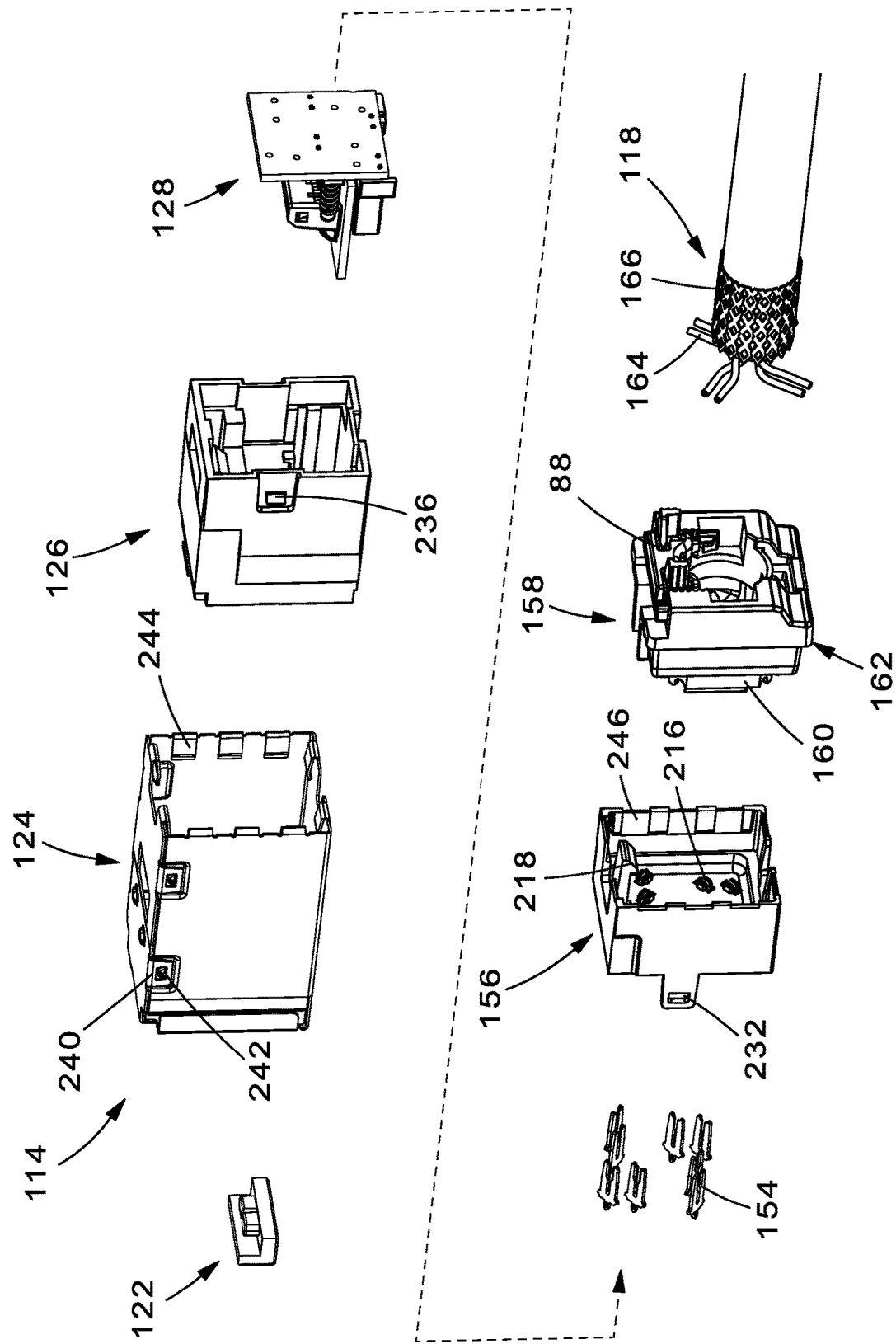

As shown in FIGS. 6-8, the RJ45 jack 114 includes identification icon 122, jack shield 124, conductive housing 126, sled assembly 128, insulation displacement contacts (IDCs) 154, rear sled 156, wire cap assembly 158 (which includes wire containment cap 160, conductive rear cap 162, and conductive strain relief clip 88). Jack 114 is used to terminate cable 118 which includes conductors 164 and conductive braid 166.

Figure 9:
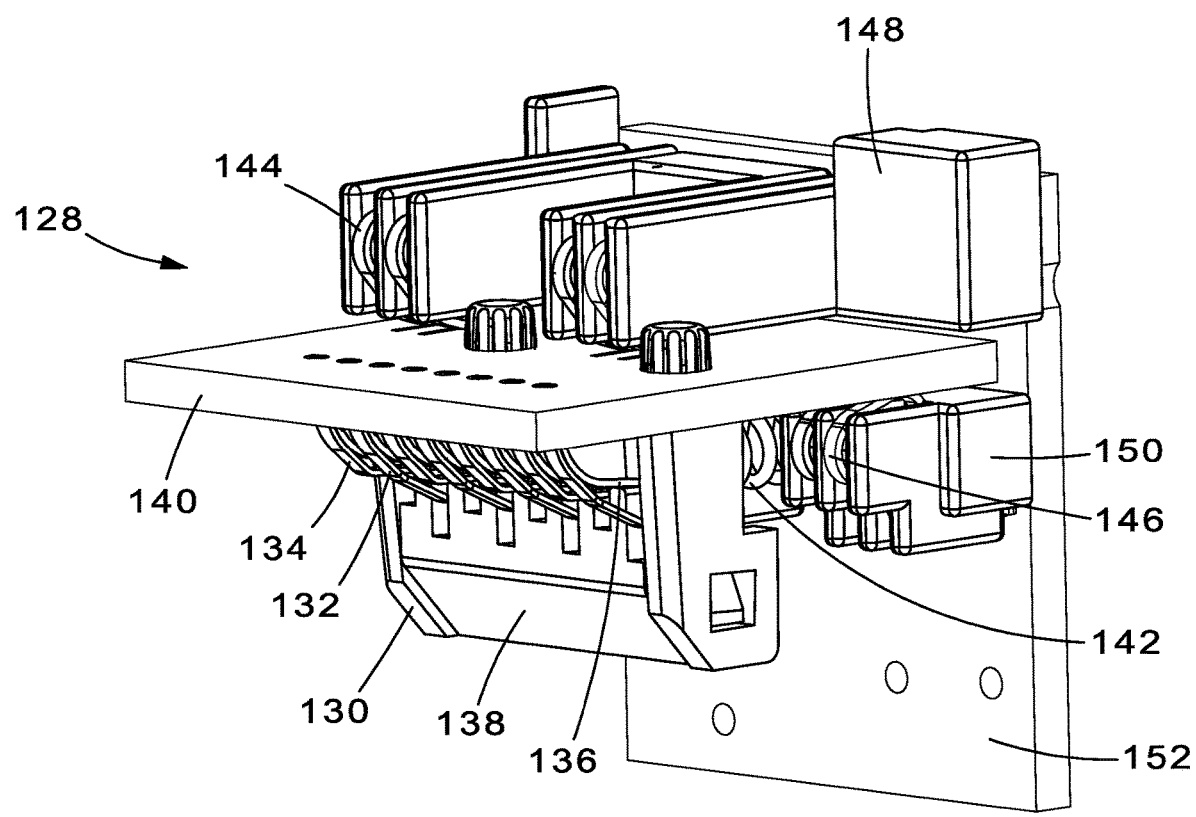
FIGS. 9-11 are isometric view of a sled assembly according to an embodiment of the present invention.
Figure 10:
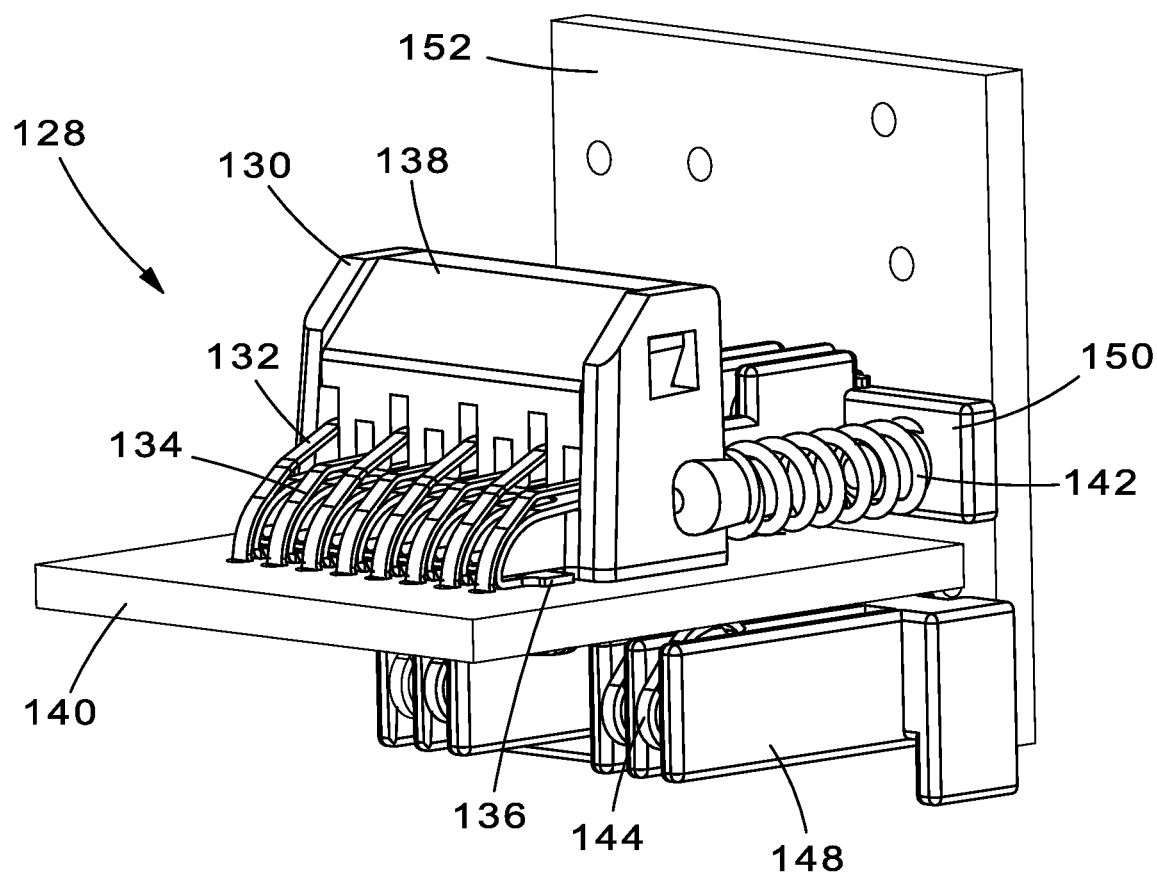
Figure 11:
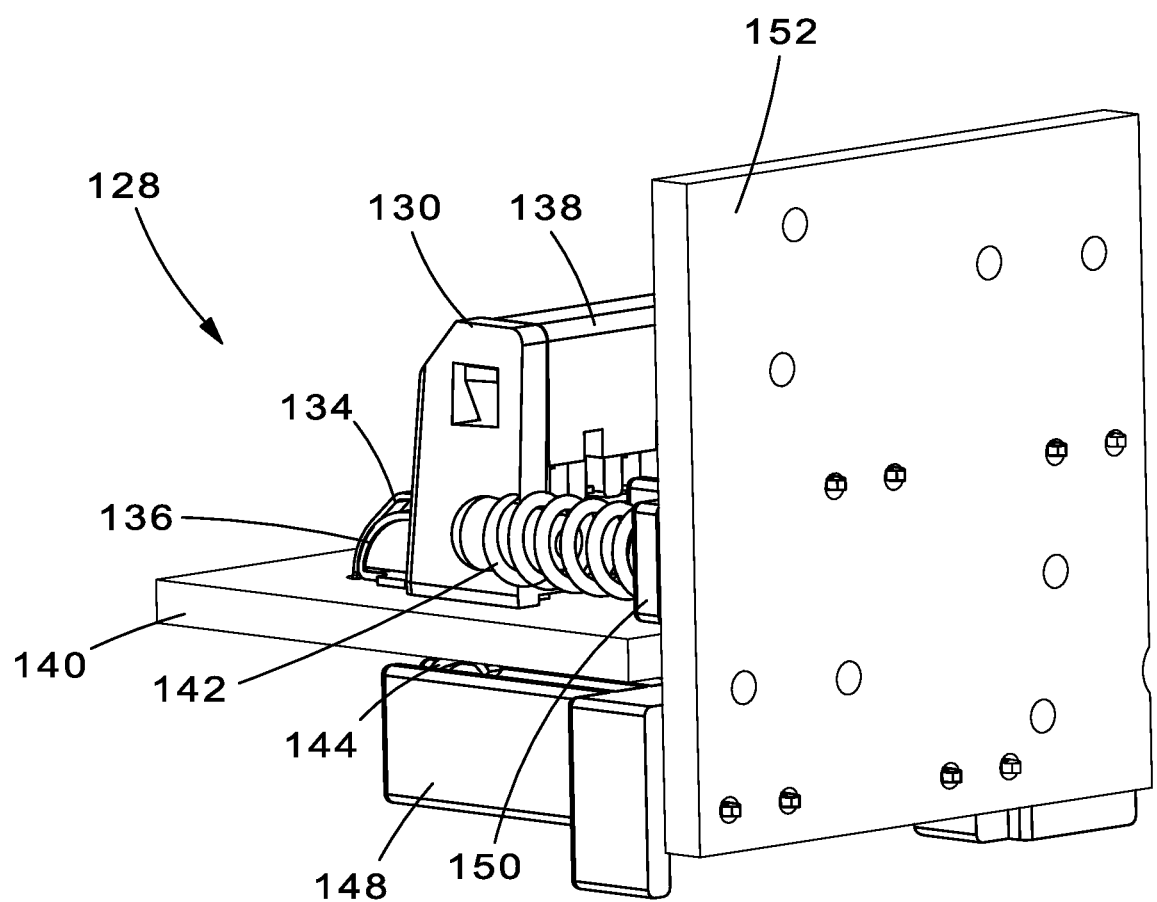

The sled assembly 128 is illustrated in greater detail in FIGS. 9-11. As shown therein, it includes a first sled support 130, first plug interface contacts (PICs) 132, second PICs 134, flexible PCB 136, second sled support 138, first rigid PCB 140, springs 142, first wiping contacts 144, second wiping contacts 146, first contact support 148, second contact support 150, and second rigid PCB 152.

Figure 12:
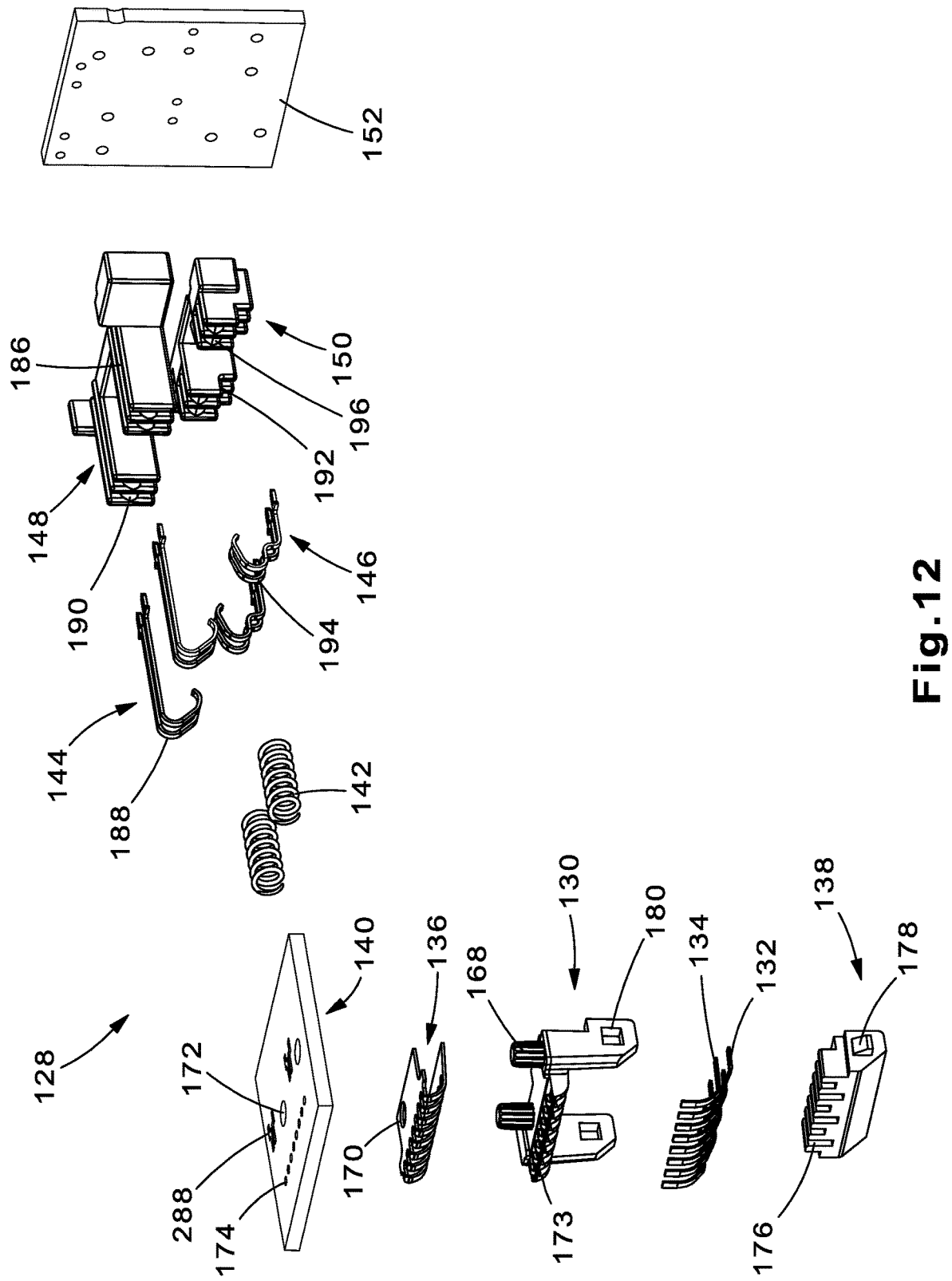
FIGS. 12-14 are isometric exploded views of the sled assembly of FIGS. 9-11.
Figure 13:
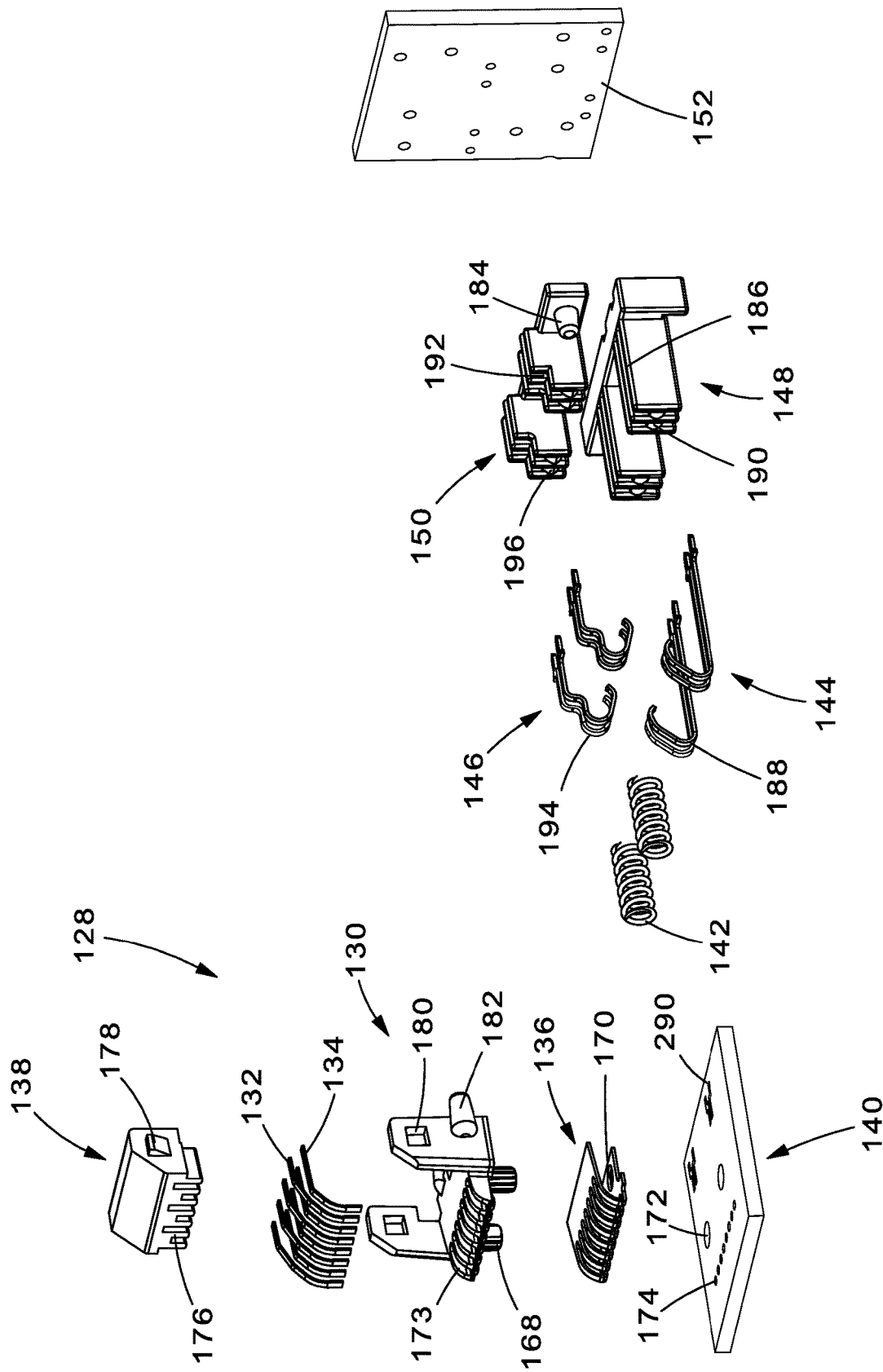
Figure 14:
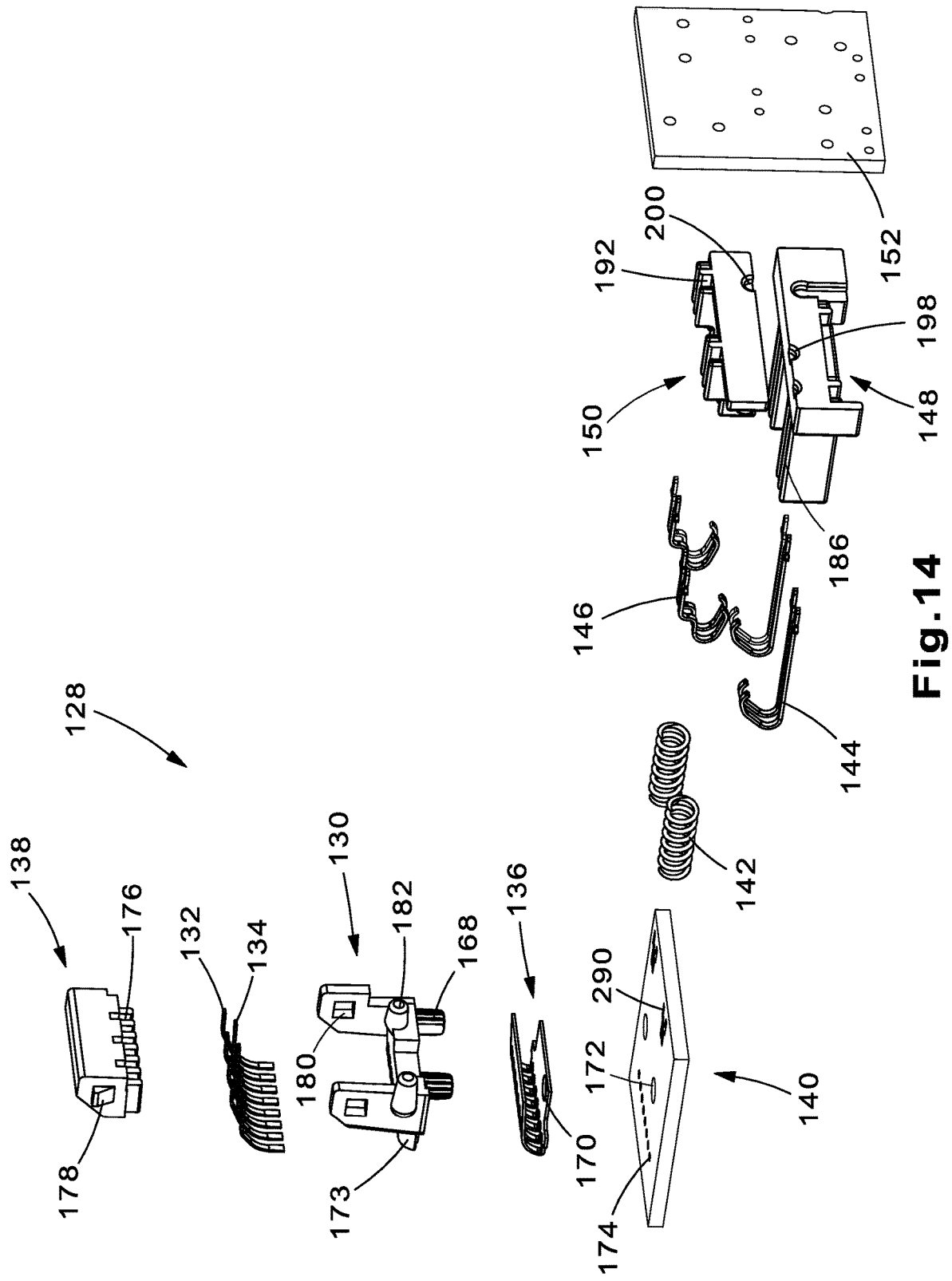

Referring to the exploded views of the sled assembly 128 shown in FIGS. 12-14, during the assembly of sled assembly 128, a portion of the flexible PCB 136 is trapped between first rigid PCB 140 and first sled support 130. Press posts 168 of first sled support 130 align with holes 170 and 172 of respective flexible PCB 136 and first rigid PCB 140, and flexible PCB 136 is wrapped around mandrel 173 of first sled support 130. First PICs 132 and second PICs 134 are installed into vias 174 of first rigid PCB 140, and comb features 176 of second sled support 138 align with both first PICs 132 and second PICs 134. Snaps 178 of second sled support 138 align with and join snap pockets 180 of first sled support 130 to secure the two pieces together. When second sled support 138 and first sled support 130 are secured, flexible PCB 136, first PICs 132, and second PICs 134 become trapped and are thereby secured. Front spring posts 182 of first sled support 130 and back spring posts 184 of second contact support 150 capture springs 142 during final assembly. First wiping contacts 144 align with respective contact slots 186 of first contact support 148 and have a controlled bend 188 around mandrel 190. Second wiping contacts 146 align with respective contact slots 192 of second contact support 150 and have a controlled bend 194 around mandrel 196. Relief slots 198 and 200 on respective first contact support 148 and second contact support 150, provide clearance for IDCs 154 during final assembly.

Figure 15:
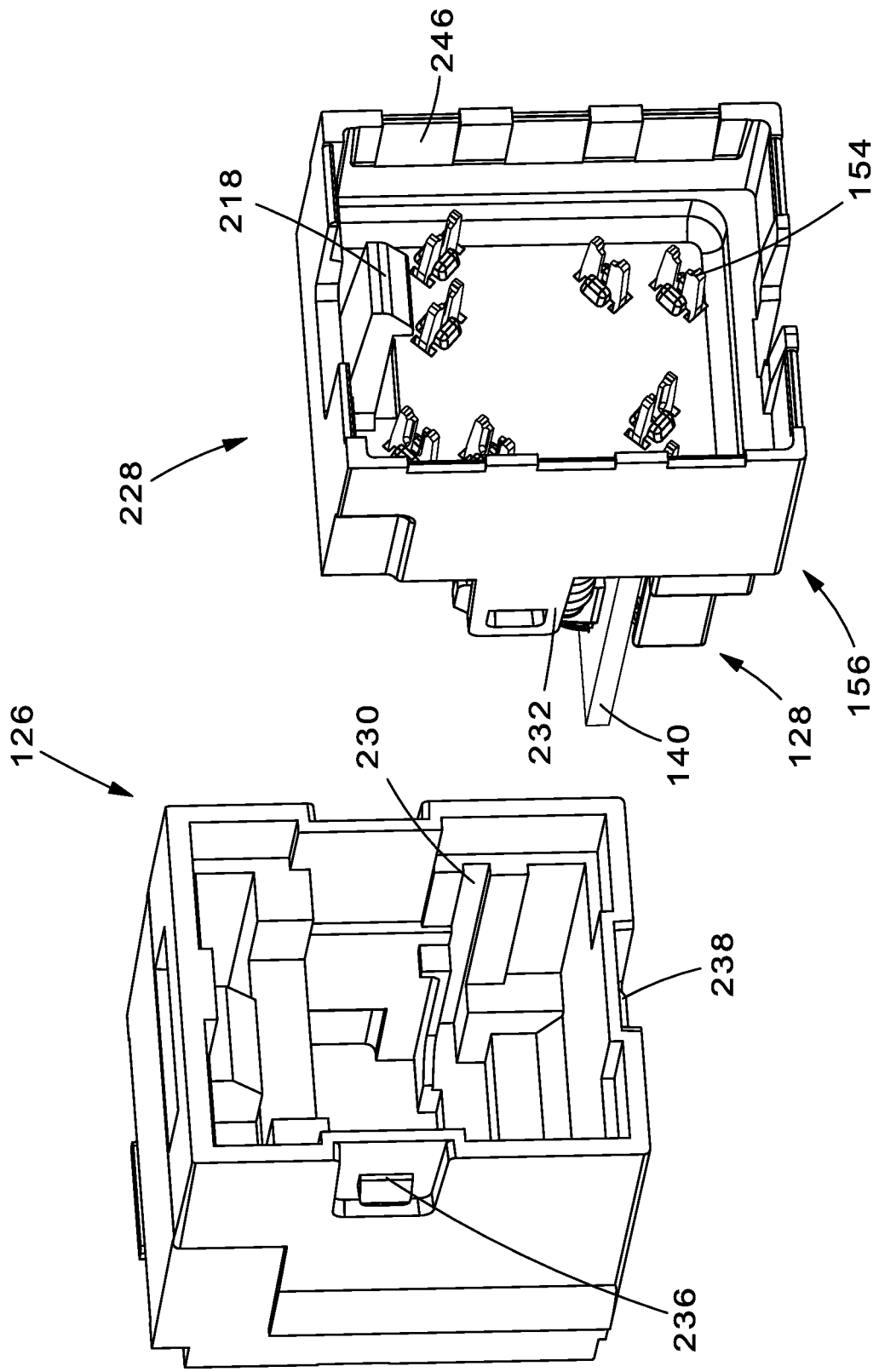
FIG. 15 is a rear isometric view of the RJ45 jack with back end assembly exploded.
Figure 16:
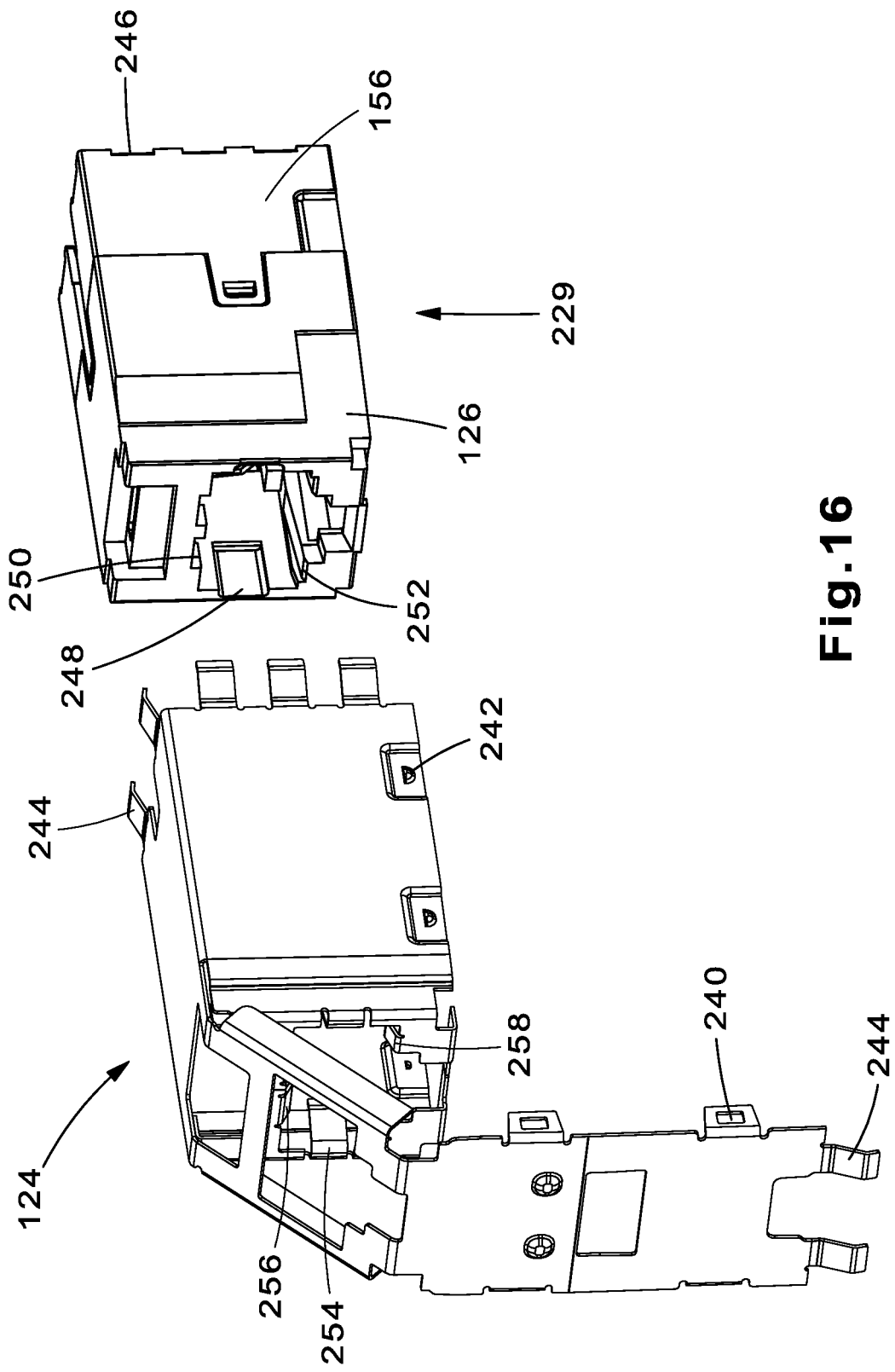
FIGS. 16 and 17 are isometric views of partial jack assembly and jack shield in the open state.
Figure 17:
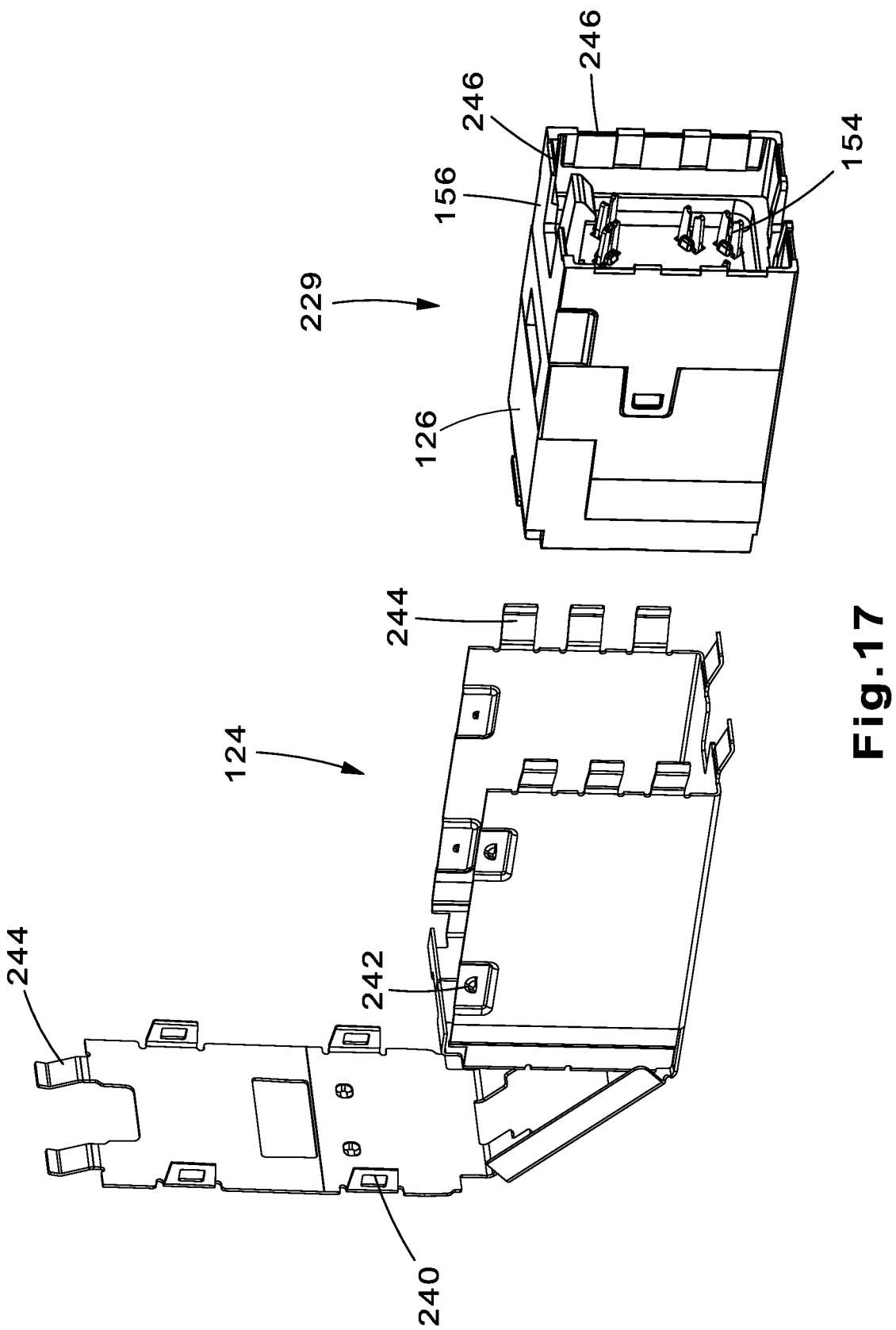

After assembly of the sled assembly 128, IDCs 154 are placed in IDC slots 216 of rear sled 156 and are then secures to second rigid PCB 152 making the back end assembly 228 as shown in FIG. 15. Back end assembly 228 is then assembled into conductive housing 126 forming partial jack assembly 229 show in FIG. 16. Referring again to FIG. 15, rails 230 of conductive housing 126 align back end assembly 228 and match up with the edges of first rigid PCB 140. Latch arms 232 and 234 of rear sled 156 align with and secure to latch pockets 236 and 238 of conductive housing 126. Once partial jack assembly 229 is assembled, it is joined with the jack shield 124 as shown in FIGS. 16 and 17. Jack shield 124 wraps around partial jack assembly 229 and shield latches 240 align and join with shield snaps 242 to partially enclose the assembly. Thereafter, wire cap grounding flanges 244 of jack shield 124 are wrapped around grounding flange slots 246 of rear sled 156. When assembled to a cable, wire cap grounding flanges 244 make contact with conductive rear cap 162 to provide an appropriate grounding connection. Plug grounding flange slots 248, 250, and 252 of conductive housing 126 align with respective plug grounding flanges 254, 256, and 258 of jack shield 124.

Figure 18:
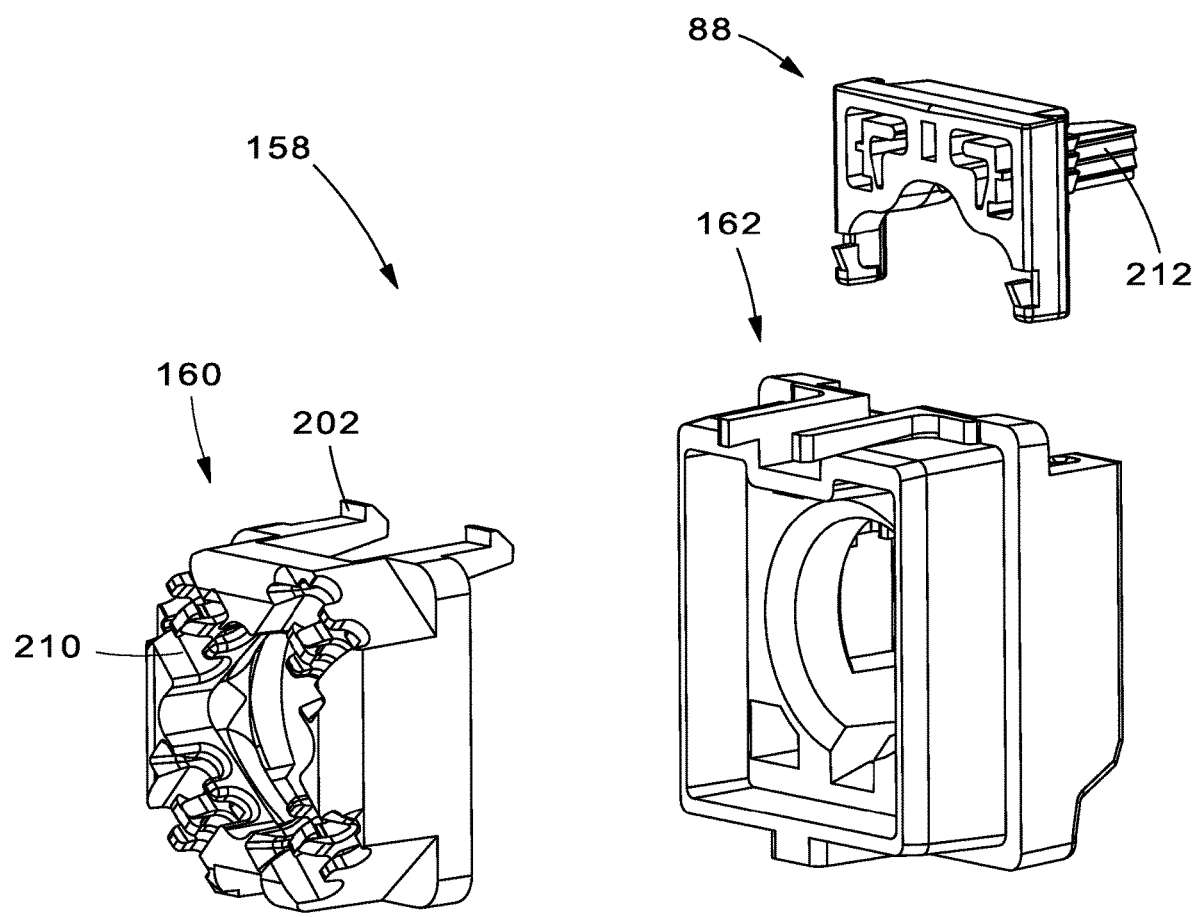
FIGS. 18 and 19 are exploded views of a wire cap assembly.
Figure 19:
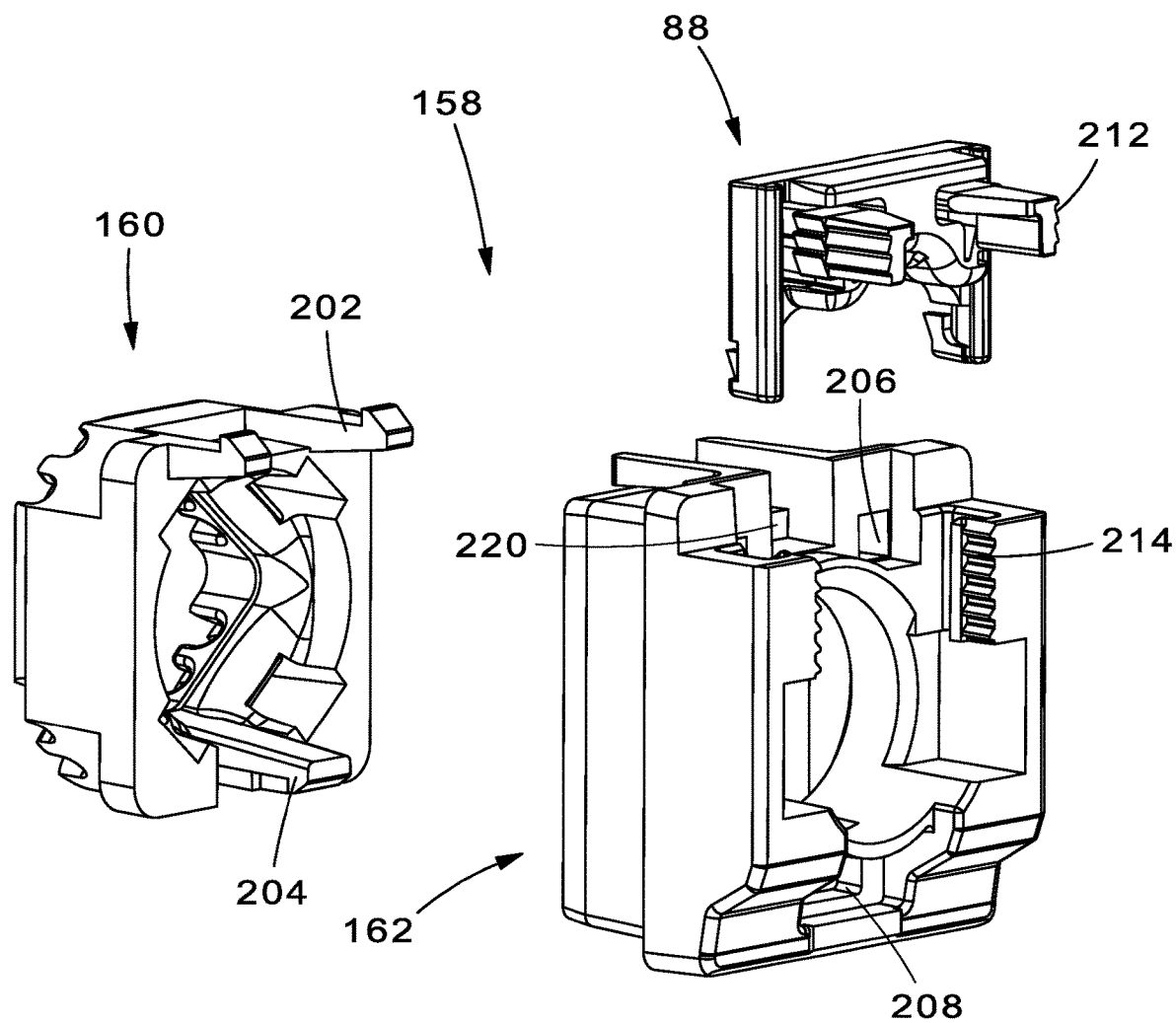

Referring now to FIGS. 18 and 19, to connect the partially assembled jack to a data cable, cable 118 is strung through rear conductive cap 162 and the wire containment cap 160 with conductor slots 210 enabling alignment of conductors 164 during assembly. Wire containment cap 160 is secured to conductive rear cap 162 through latches 202 and 204 which align with latch pockets 206 and 208, respectively. In their default state, flexible arms 212 of conductive strain relief clip 88 engage with teeth 214 of conductive rear cap 162. To disengage, the flexible arms 212 are compressed inward towards each other. As the wire cap assembly 158 is assembled, conductors 164 are positioned in preparation for joining with the partially assembled jack. Thereafter, wire cap assembly 158 is secured to rear sled 156 through the engagement of the flexible latch 218 of rear sled 156 with a corresponding latching feature 220. The mating of the wire cap assembly 158 and the rear sled 156 causes the IDCs 154 to make contact with the conductors 164 of the cable 118 and thereby establish a communication link through the jack.

Figure 20:
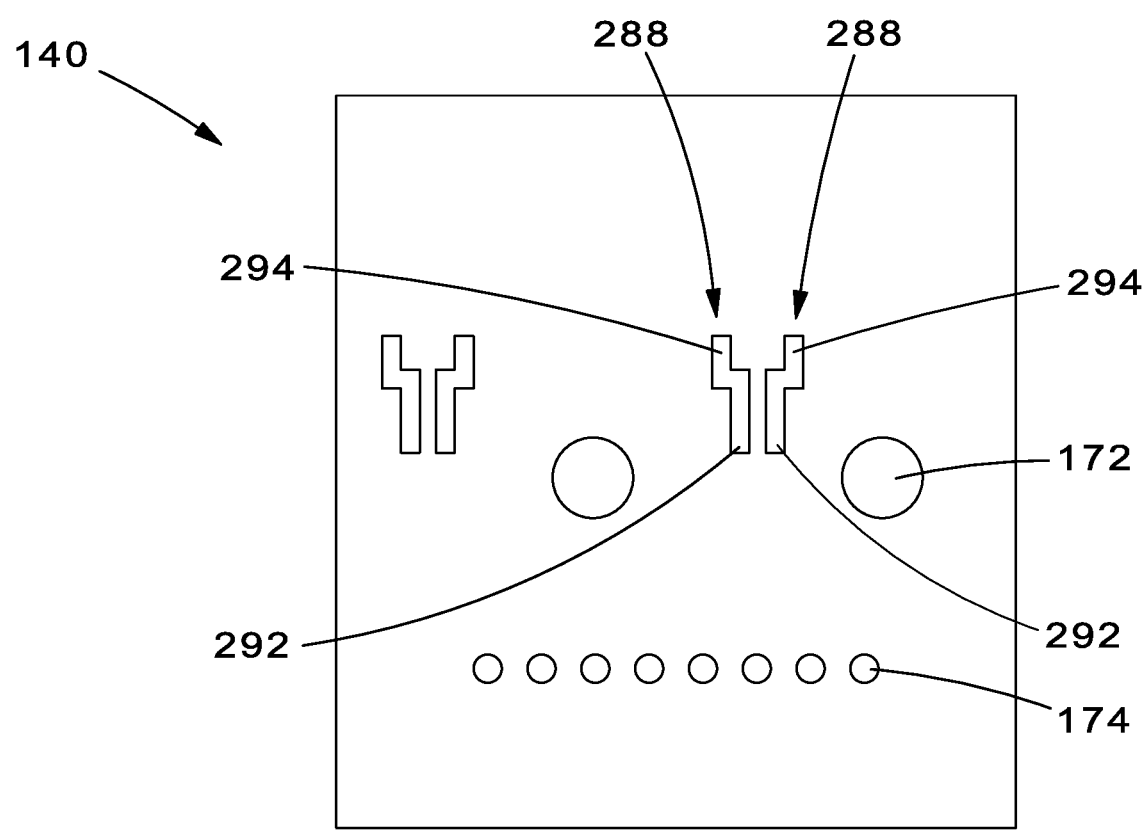
FIGS. 20 and 21 are views of a first and second sides, respectively of a first rigid PCB according to an embodiment of the present invention.
Figure 21:
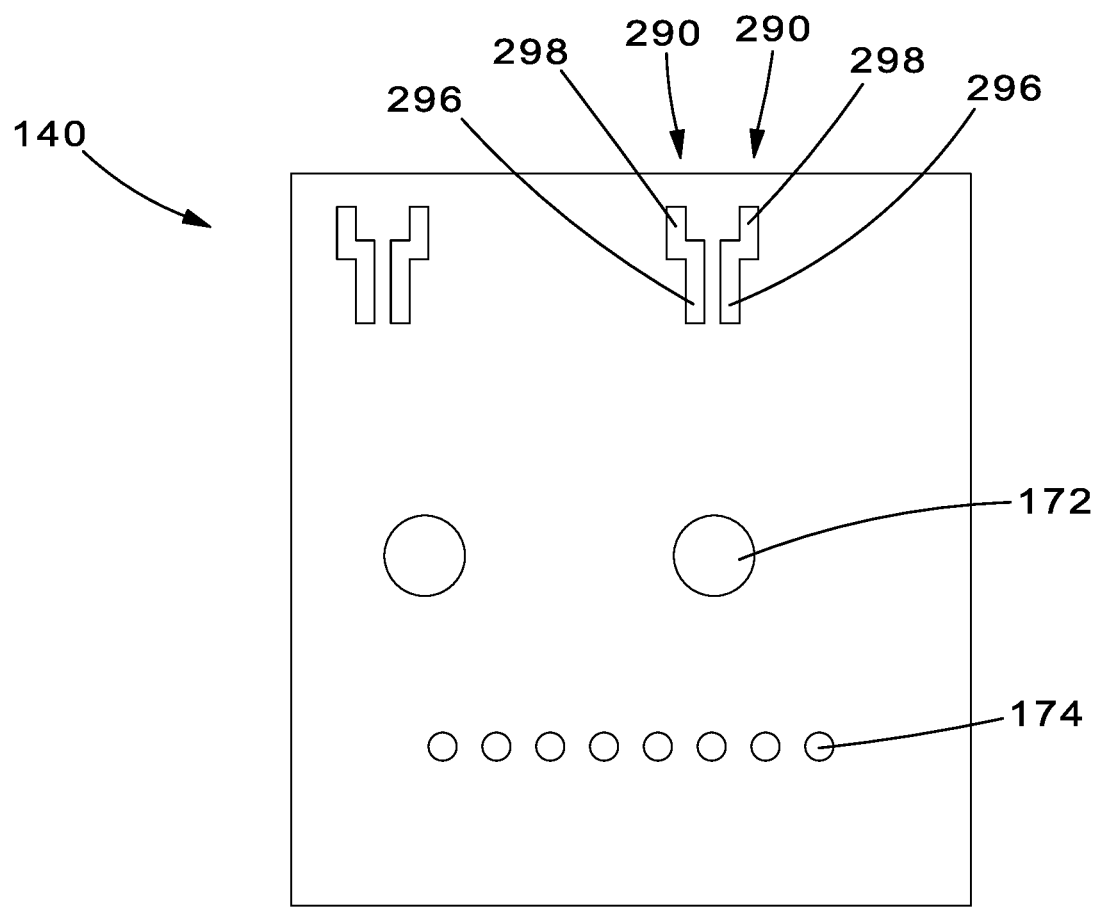

To achieve the improved levels of reliability, jack 114 utilizes first and second wiping contacts 144, 146 in conjunction with specifically designed contacts on the rigid PCB 140. FIG. 20 is first side of first rigid PCB 140 and FIG. 21 is a second side of first rigid PCB 140. First rigid PCB 140 includes first contact pads 288 and second contact pads 290. Each contact pad contains a mating portion and a disconnect portion. The mating portion is the section of the contact pad with which a respective wiping contact is engaged during the mated and over-travel states. The disconnect portion is the section of the contact pad with which a respective wiping contact is engaged between the pre-release and release states. In the currently described embodiment, contact pads 288 have a mating portion 292 and a disconnect portion 294, and contact pads 290 have a mating portion 296 and a disconnect portion 298. For each contact pad, the mating portion and the disconnect portion is positioned such that each portion comes into direct contact with an alternate side of a respective wiping contact. This configuration allows for potential arcing or corona damage to occur on one side of the wiping contact, leaving the other side unharmed.

FIGS. 22-30 illustrate the interaction between the contact pads and the wiping contacts throughout various stages of the plug/jack mating process. It is worth noting that in the section views of FIGS. 22, 24, 26, 28, and 30, sled assembly 128 and plug PCB assembly 274 are not sectioned to show the plug/jack mating interaction between wire contacts 276, 278 and PICs 132, 134, and the interaction between the wiping contacts 144 and contact pads 288. In addition, press posts 168 have been leveled off along the surface of respective first rigid PCB 140 in all section views for clarity.

Figure 22:
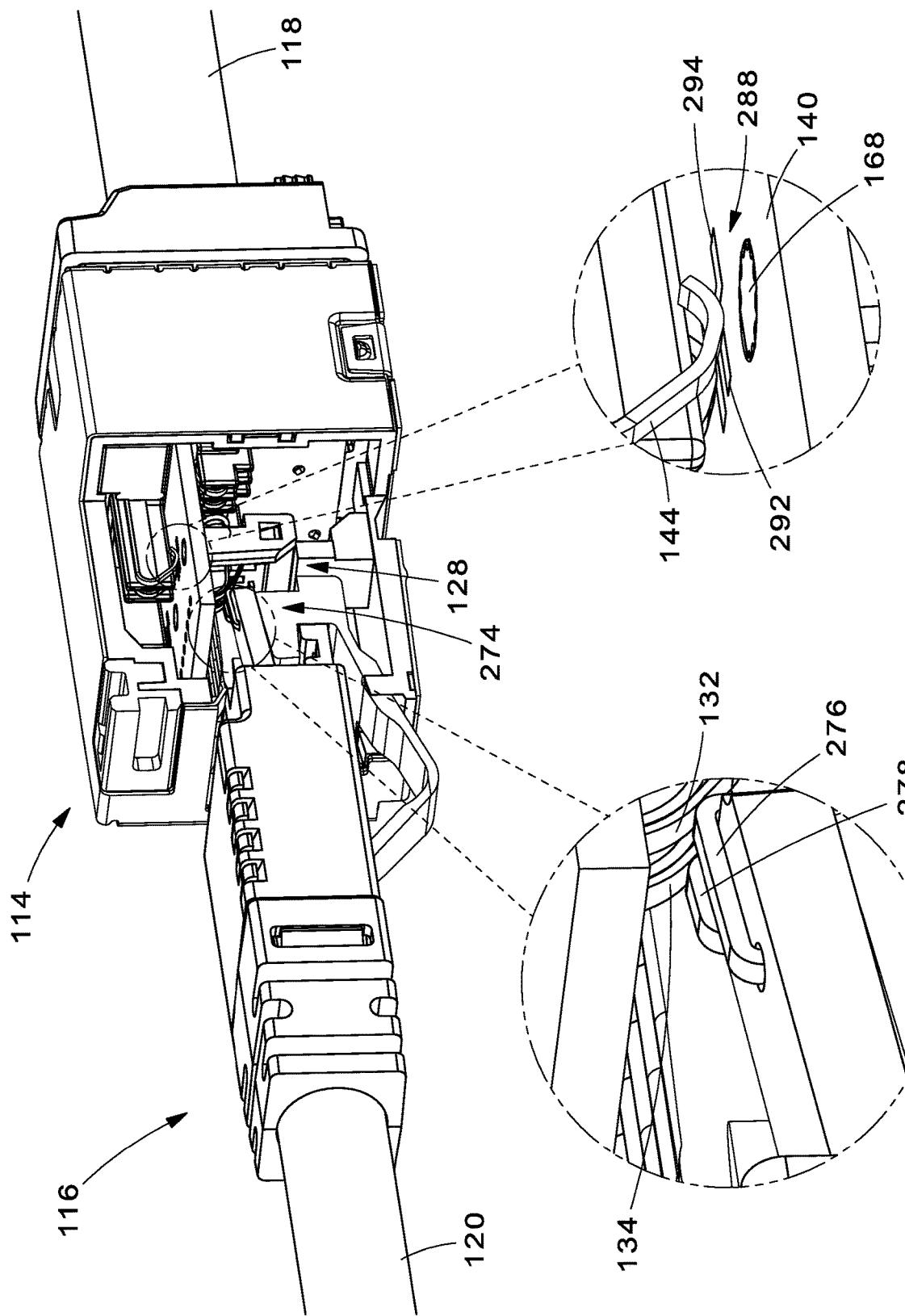
FIG. 22 is a cross-section view across the mating interface of RJ45 jack and RJ45 plug assembly in a mated state.

FIG. 22 is a cross-section view, taken along section line 22-22 of FIG. 2, across the mating interface of shielded RJ45 network jack 114 and shielded RJ45 plug assembly 116. In this state wire contacts 276 and 278 are in electrical contact with respective first PICs 132 and second PICs 134, and first wiping contacts 144 are in contact with mating portion 292 of first contact pads 288. Second wiping contacts 146 are in contact with mating portion 296 of second contact pads 290 (not shown). As illustrated in the detailed view of the wiping contacts and contact pads, wiping contacts 144 interface with the mating portion along the wiping contacts' first side. This is the static state of a mated RJ45 plug 116/jack 114 combination.

Figure 23:
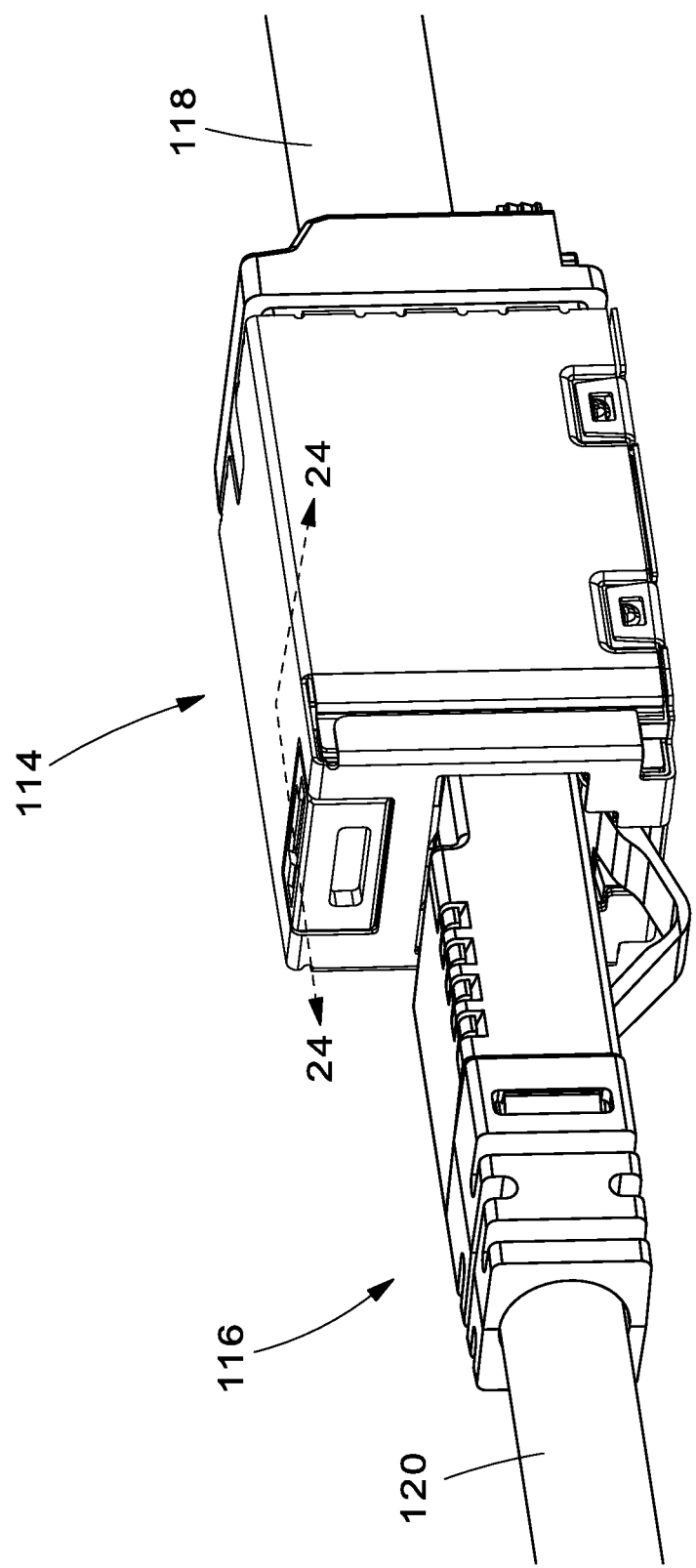
FIG. 23 is a front isometric view of RJ45 jack and RJ45 plug assembly in an over-travel state.
Figure 24:
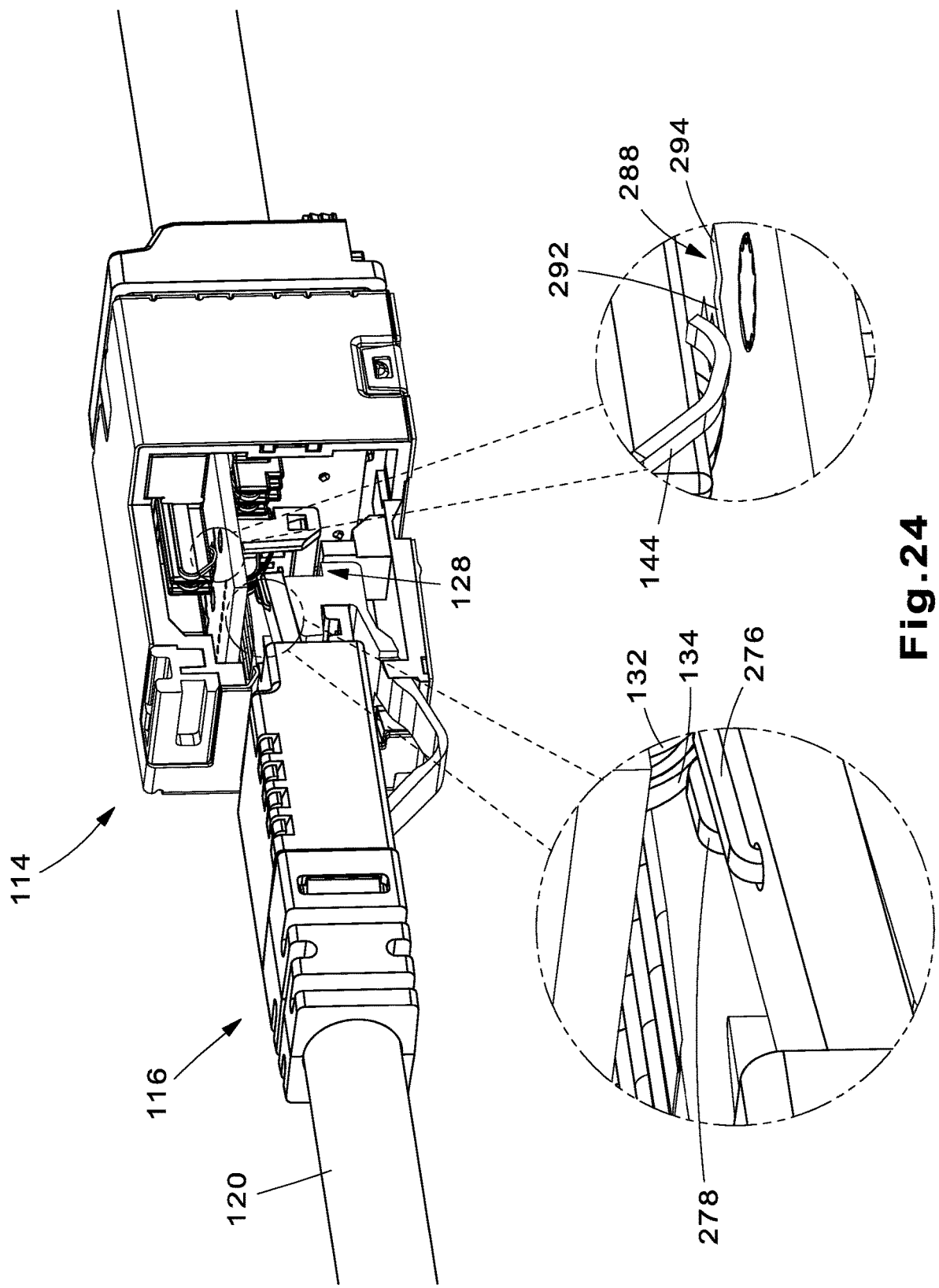
FIG. 24 is a cross-section view across the mating interface of RJ45 jack and RJ45 plug assembly in an over-travel state.

FIG. 23 is a front isometric view of RJ45 network jack 114 and RJ45 plug assembly 116 and respective cables 118 and 120 in the over-travel state. The over-travel state allows for insertion of RJ45 plug assembly 116 into shielded RJ45 network jack 114. RJ45 plug assembly 116 is inserted roughly 0.032 inches further into RJ45 network jack 114 when compared to the mated static state shown in FIG. 2. FIG. 24 is a cross-section view, taken along section line 24-24 of FIG. 23 across the mating interface of RJ45 network jack 114 and RJ45 plug assembly 116 in the over-travel state. In this state wire contacts 276 and 278 are in electrical contact with respective first PICs 132 and second PICs 134. First wiping contacts 144 are in contact with mating portion 292 of first contact pads 288. Second wiping contacts 146 are in contact with mating portion 296 of second contact pads 290 (not shown). Similar to the static state, wiping contacts 144 interface with the mating portion along the wiping contacts' first side. In between the mated state and the over-travel state there is no mechanical/electrical disconnection between any plug/jack interfaces.

Figure 25:
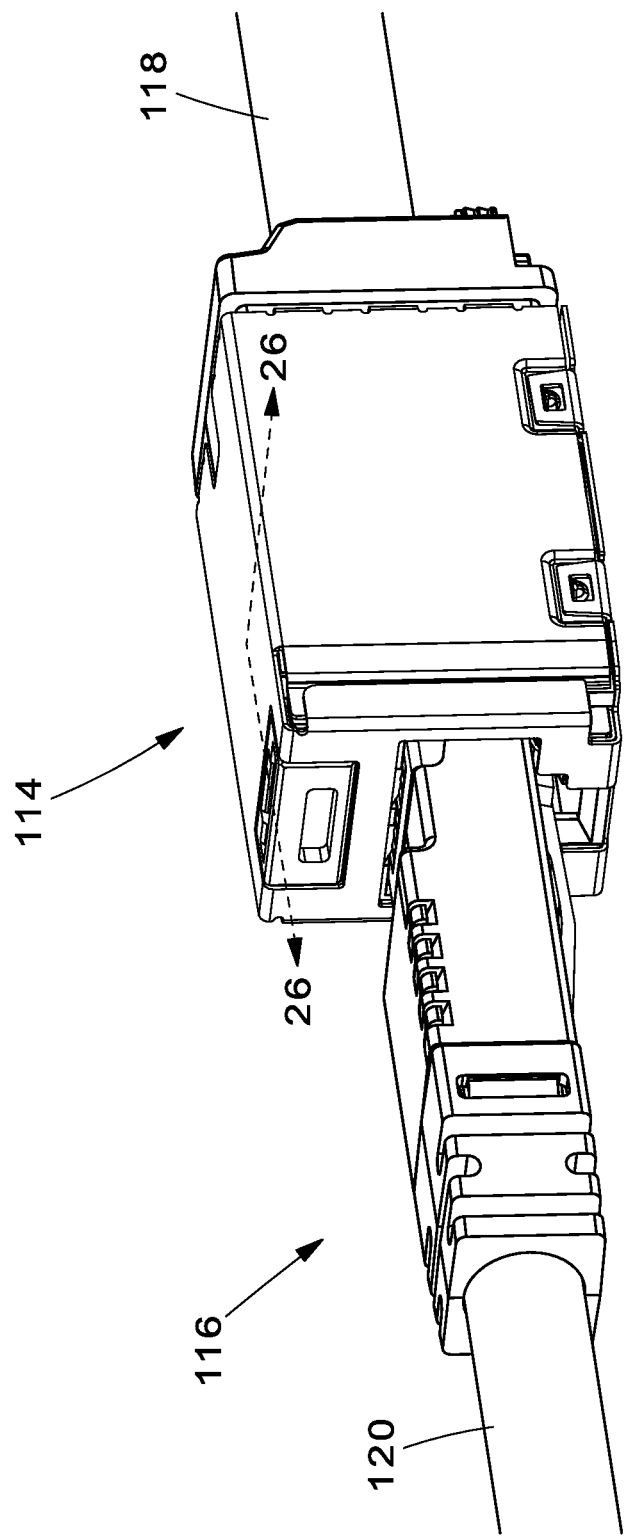
FIG. 25 is a front isometric view of RJ45 jack and RJ45 plug assembly in a pre-release state.
Figure 26:
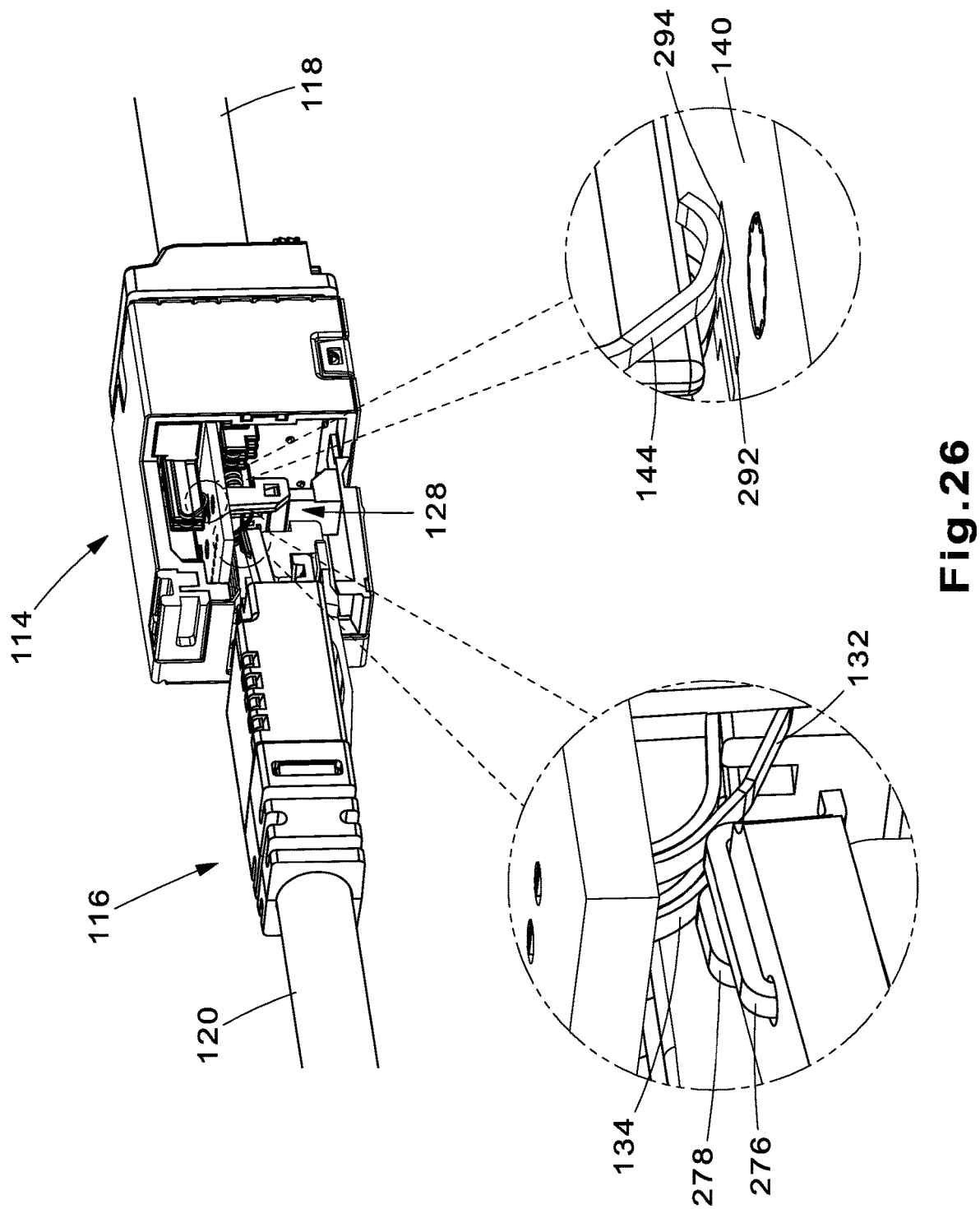
FIG. 26 is a cross-section view across the mating interface of RJ45 jack and RJ45 plug assembly in a pre-release state.

FIG. 25 is a front isometric view of RJ45 network jack 114 and RJ45 plug assembly 116 and respective cables 118 and 120 in the pre-release state. The pre-release state is a period where the wiping contacts are in contact with the disconnect portion of their respective contact pads but prior to the release state in the retraction cycle (this position is equivalent to the position during initial insertion of shielded RJ45 plug assembly 116 into shielded RJ45 network jack 114 prior to the over-travel and mated states). FIG. 26 is a cross-section view, taken along section line 26-26 of FIG. 25 across the mating interface of RJ45 network jack 114 and RJ45 plug assembly 116 in the pre-release state. In this state wire contacts 276 and 278 are in electrical contact with respective first PICs 132 and second PICs 134. First wiping contacts 144 are in contact with disconnect portion 294 of first contact pads 288. Second wiping contacts 146 are in contact with disconnect portion 298 of second contact pads 290 (not shown). As illustrated in the detailed view of the wiping contacts and contact pads, wiping contacts 144 interface with the disconnect portion along the wiping contacts' second (alternate) side as compared to the static and over-travel states.

Figure 27:
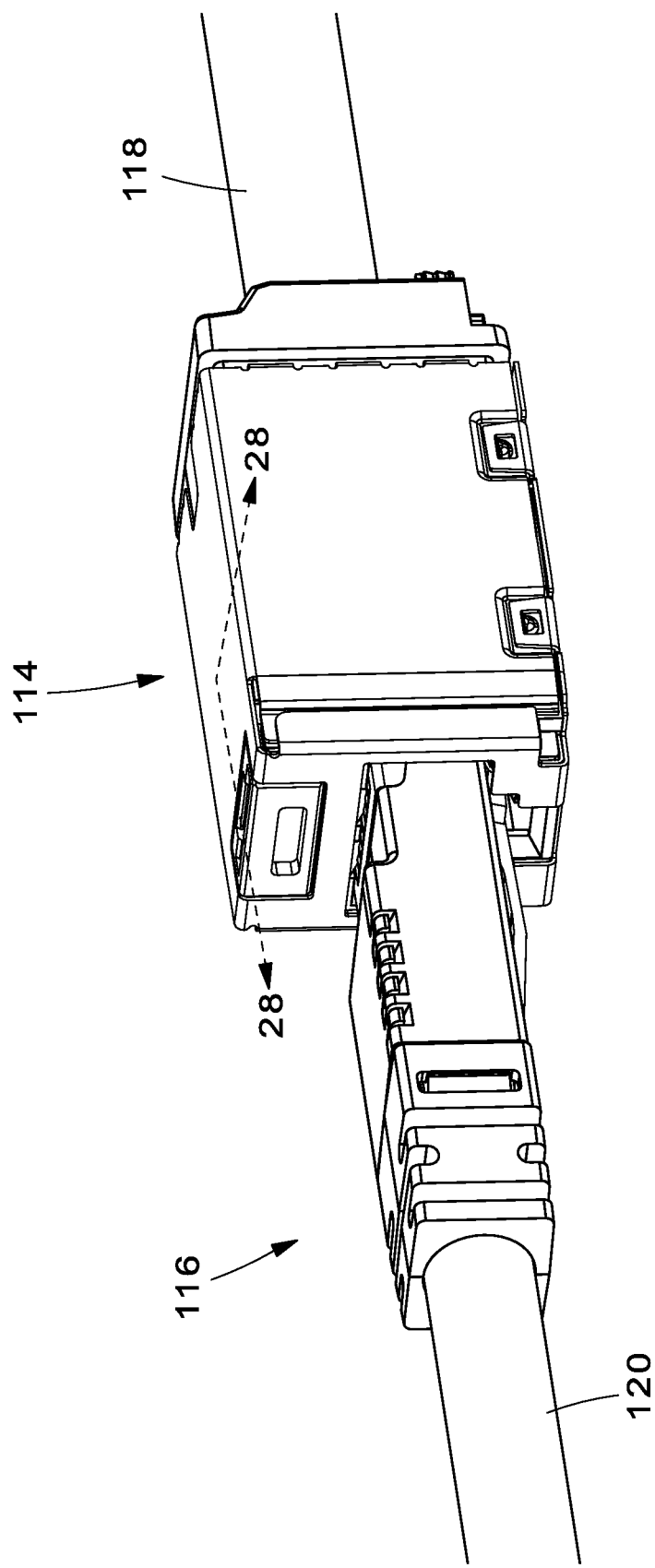
FIG. 27 is a front isometric view of RJ45 jack and RJ45 plug assembly in a release state.
Figure 28:
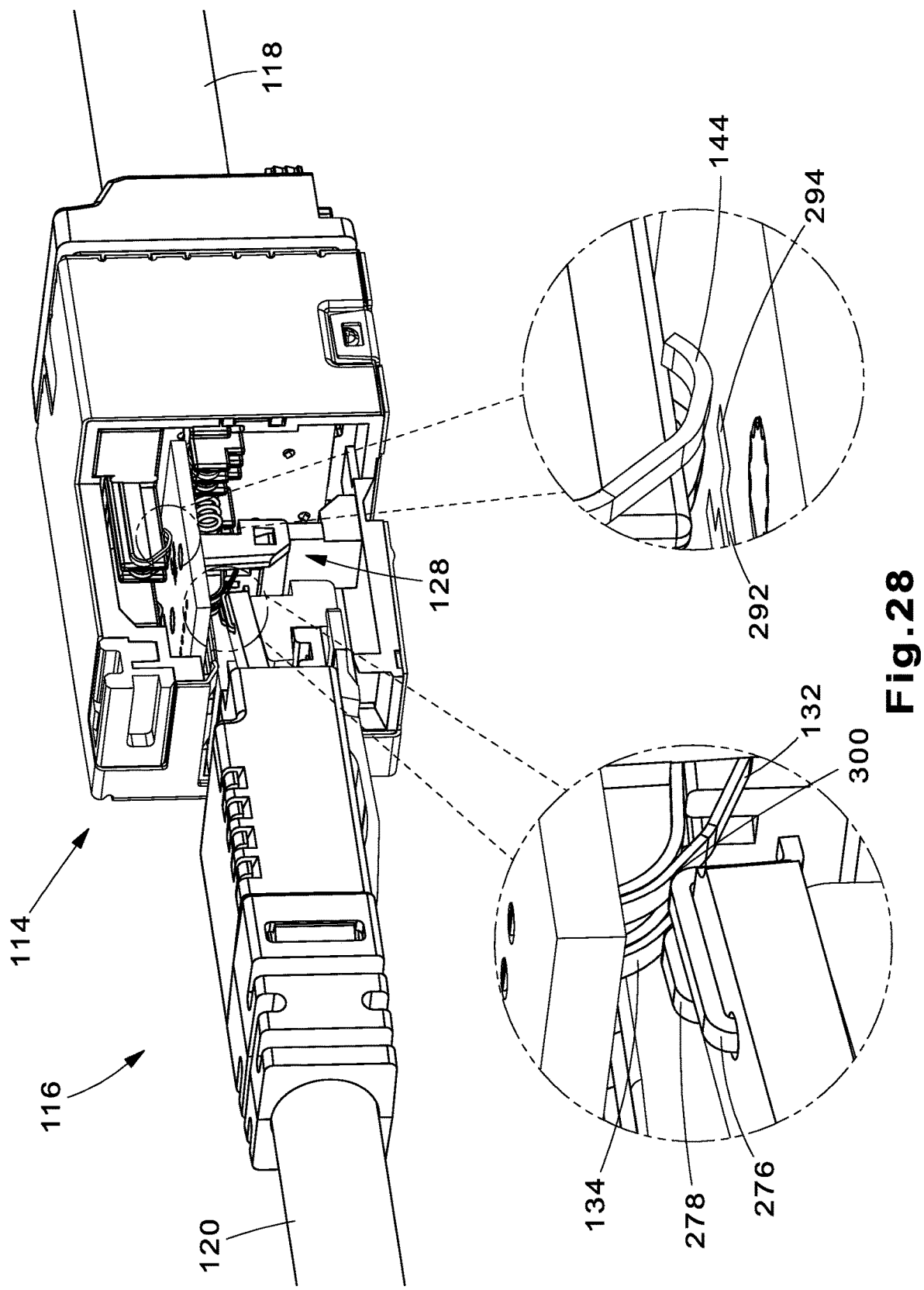
FIG. 28 is a cross-section view across the mating interface of RJ45 jack and RJ45 plug assembly in a release state.

FIG. 27 is a front isometric view of RJ45 network jack 114 and RJ45 plug assembly 116 and respective cables 118 and 120 in the release state. The release state is the moment before wire contacts 276 and 278 are no longer in electrical contact with respective first PICs 132 and second PICs 134 (this position is equivalent to the position during initial insertion of shielded RJ45 plug assembly 116 into shielded RJ45 network jack 114 just after the wire contacts 276 and 278 come into electrical contact with respective first PICs 132 and second PICs 134). FIG. 28 is a cross-section view, taken along section line 28-28 of FIG. 27 across the mating interface of RJ45 network jack 114 and RJ45 plug assembly 116 in the release state. In this state wire contacts 276 and 278 are in electrical contact with respective first PICs 132 and second PICs 134. First wiping contacts 144 are no longer in contact with disconnect portion 294 of first contact pads 288. Second wiping contacts 146 are no longer in contact with disconnect portion 298 of second contact pads 290 (not shown). In between the pre-release state and the release state respective wiping contacts disconnect from contact pads along the disconnect portion of the contact pad. The electrical discharge that occurs upon disconnection of the wiping contacts and the contact pads occurs on the disconnect portion of the contact pad and corresponding side of the wiping contact. This is opposite of the mating side of the contact and controls where the damage to the contact occurs in the case of PoE damage during use. Contact point 300, between wire contacts 276 and 278 and respective first PICs 132 and second PICs 134, remains relatively the same between mated, over-travel, pre-release, and release states with a minimal wiping zone as this helps reduce the electrical distance to compensation that may be implemented on the PCB 140.

Figure 29:
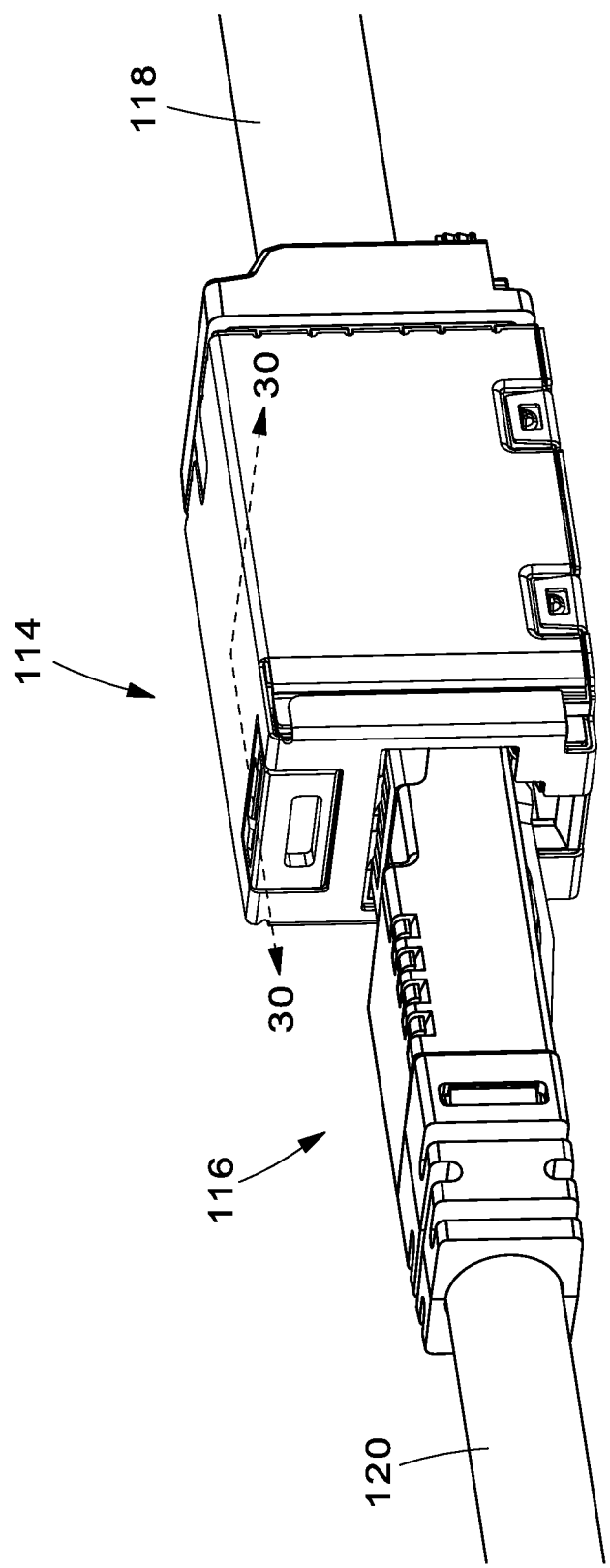
FIG. 29 is a front isometric view of RJ45 jack and RJ45 plug assembly in an unmated state.
Figure 30:
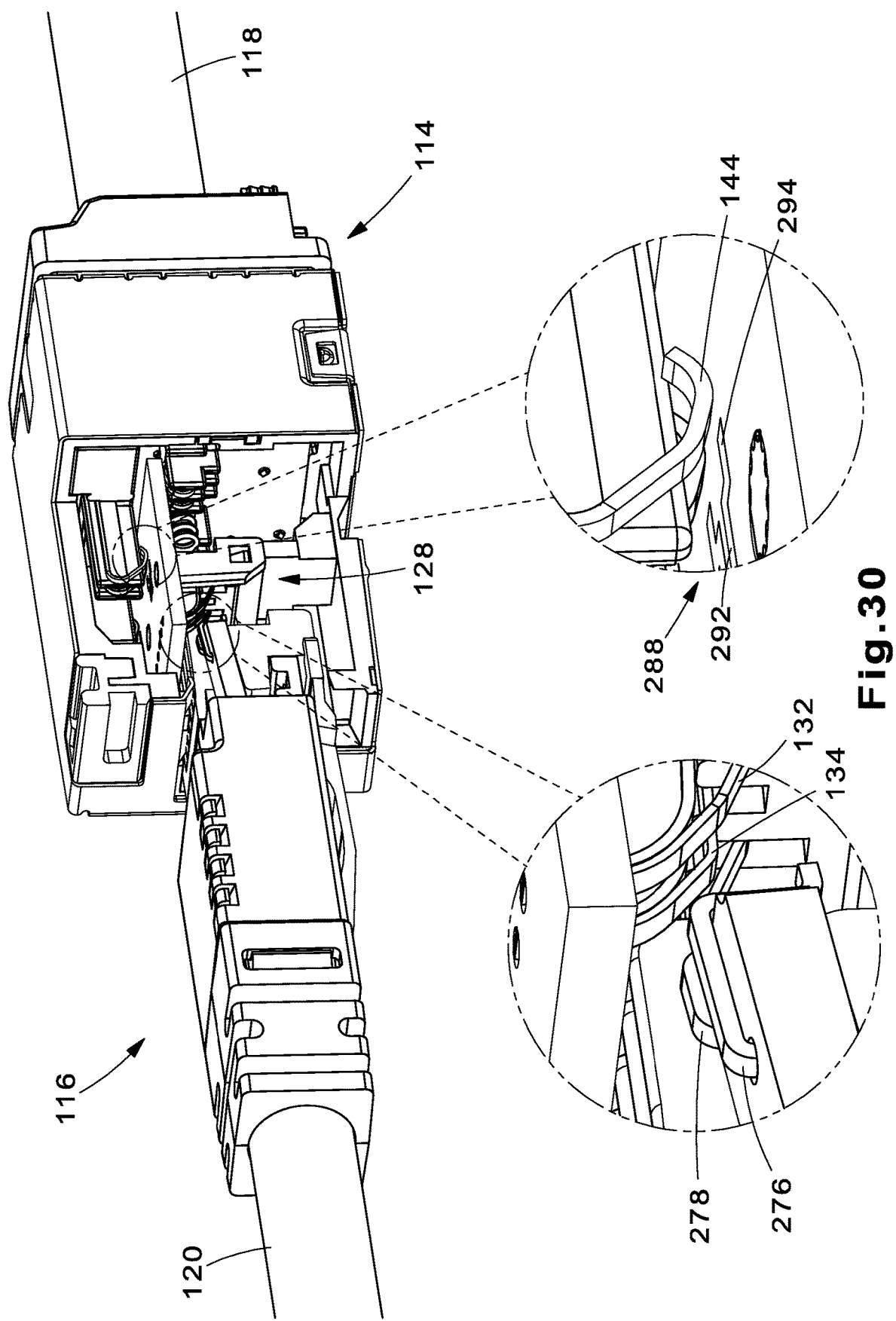
FIG. 30 is a cross-section view across the mating interface of RJ45 jack and RJ45 plug assembly in an unmated state.

FIG. 29 is a front isometric view of RJ45 network jack 114 and RJ45 plug assembly 116 and respective cables 118 and 120 in the unmated state. FIG. 30 is a cross-section view, taken along section line 30-30 of FIG. 29 across the mating interface of shielded RJ45 network jack 114 and shielded RJ45 plug assembly 116 in the unmated state. In this state wire contacts 276 and 278 are no longer in electrical contact with respective first PICs 132 and second PICs 134. First wiping contacts 144 are no longer in contact with first contact pads 288. Second wiping contacts 146 are no longer in contact with second contact pads 290 (not shown). Sled assembly 128 is in approximately the same position in the unmated state as in the release state.

In order to ensure contact on a specific side of either first contact pads 288 or second contact pads 290, it is preferred that first contact pads 288 or second contact pads 290 be raised with respect to the rest of the PCB in the area of contact. Some non-limiting means of ensuring reliable contact can include increasing the plating thickness on contact pads 288 and 290, or removing/lowering the adjacent solder mask.

Figure 31:
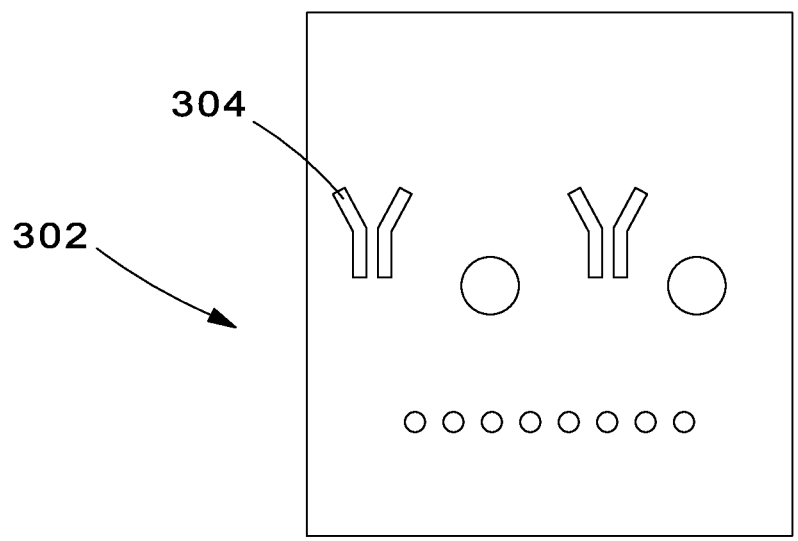
FIGS. 31 and 32 are views of a first and second sides, respectively, of a first rigid PCB according to an embodiment of the present invention.
Figure 32:
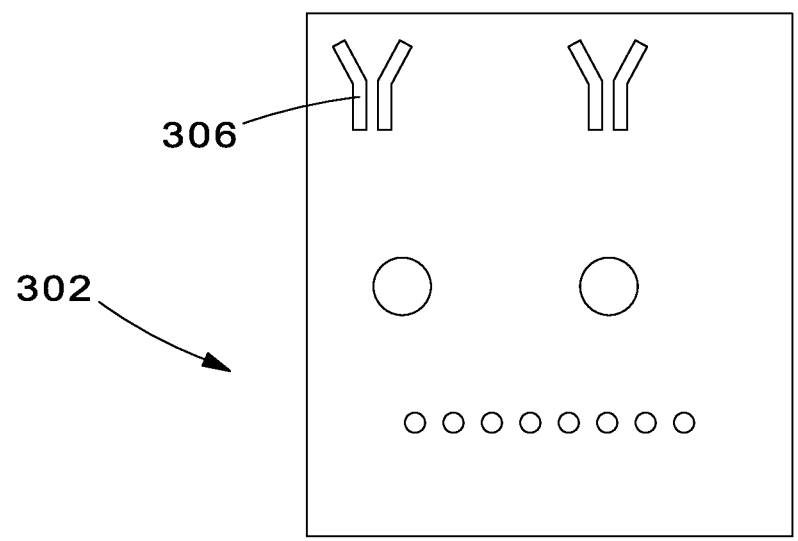

An alternative embodiment of the first rigid PCB 302 is shown in FIGS. 31 and 32 with FIG. 31 showing a first side of first rigid PCB 302 and FIG. 32 showing a second side of first rigid PCB 302. First rigid PCB 302 includes first contact pads 304 and second contact pads 306. As with first rigid PCB 140, each contact pad contains a mating portion and a disconnect portion, except there is no perpendicular section linking the two portions on the contact pads of PCB 302. Instead, PCB 302 uses an angled section. It should be noted that the shape of the contact pads may take any form so long as the mating portion and the disconnect portion are positioned such that the wiping contact maintains a constant electrical bond with the contact pad as it travels between the mating and disconnect portions and such that different sections of the wiping contacts make contact with the mating and disconnect portions.

Figure 33:
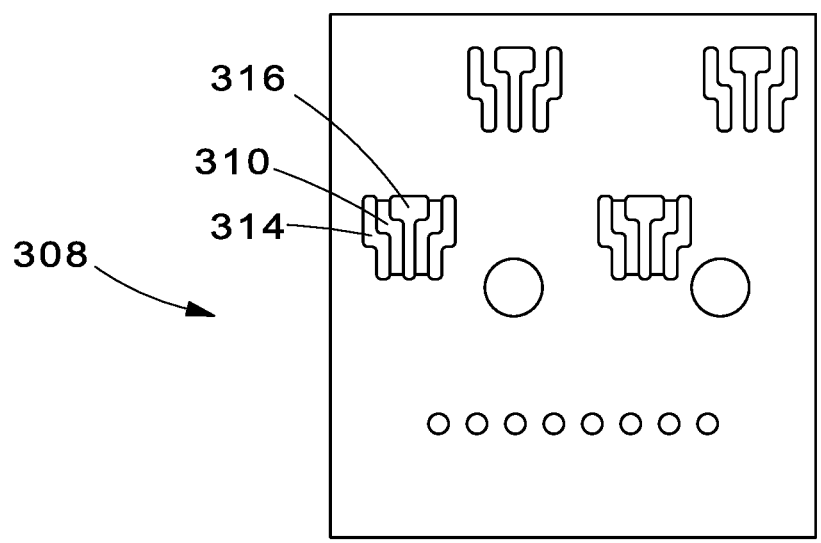
FIGS. 33 and 34 are views of a first and second sides, respectively, of a first rigid PCB according to an embodiment of the present invention.
Figure 34:
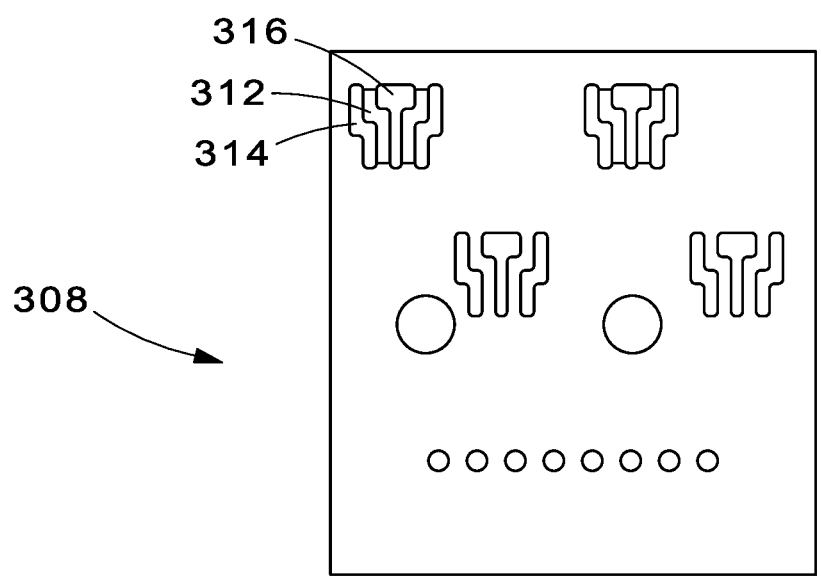
Figure 35:
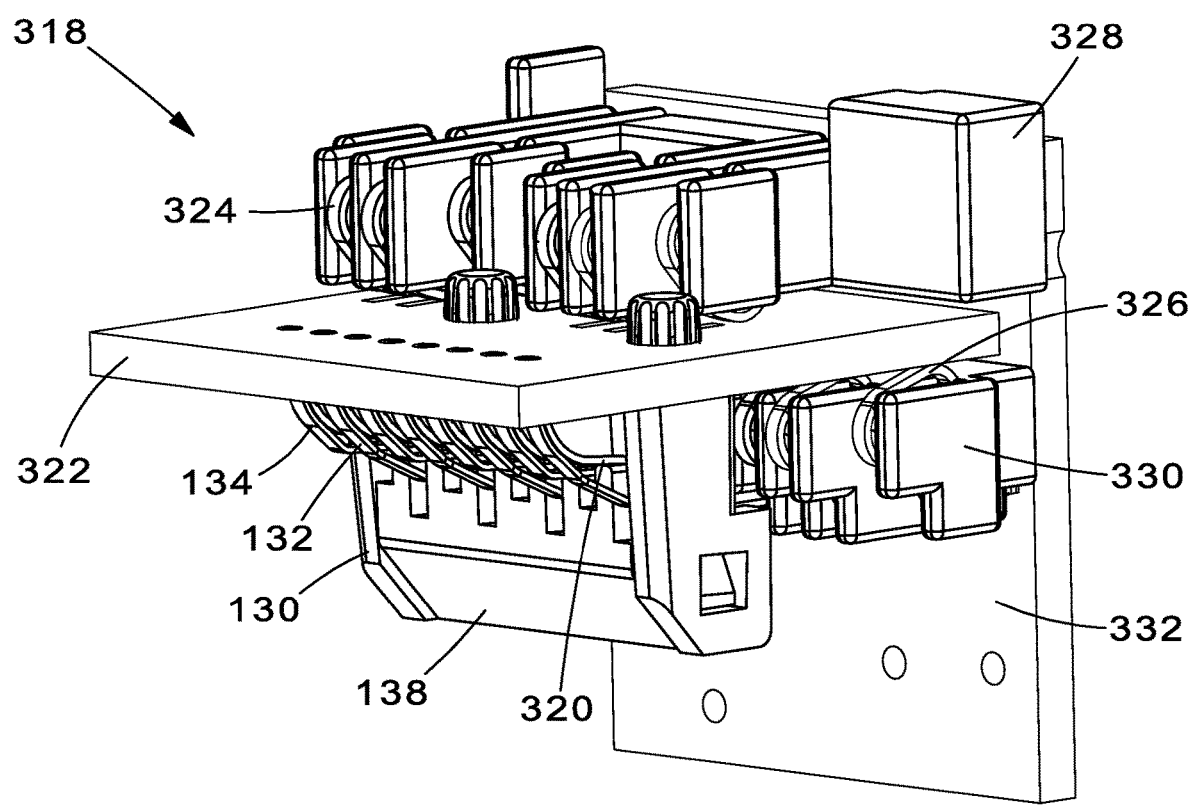
FIGS. 35 and 36 are isometric view of a sled assembly according to an embodiment of the present invention.
Figure 36:
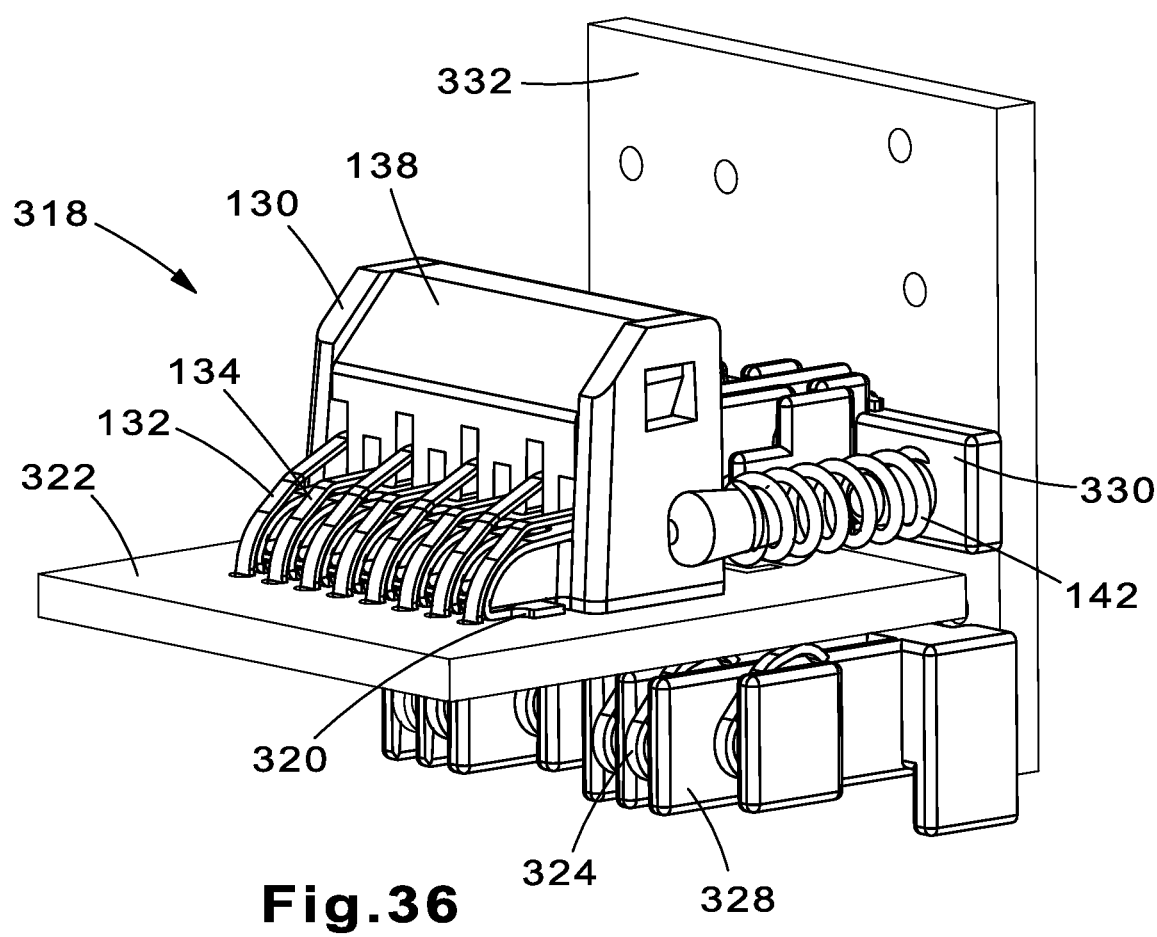
Figure 37:
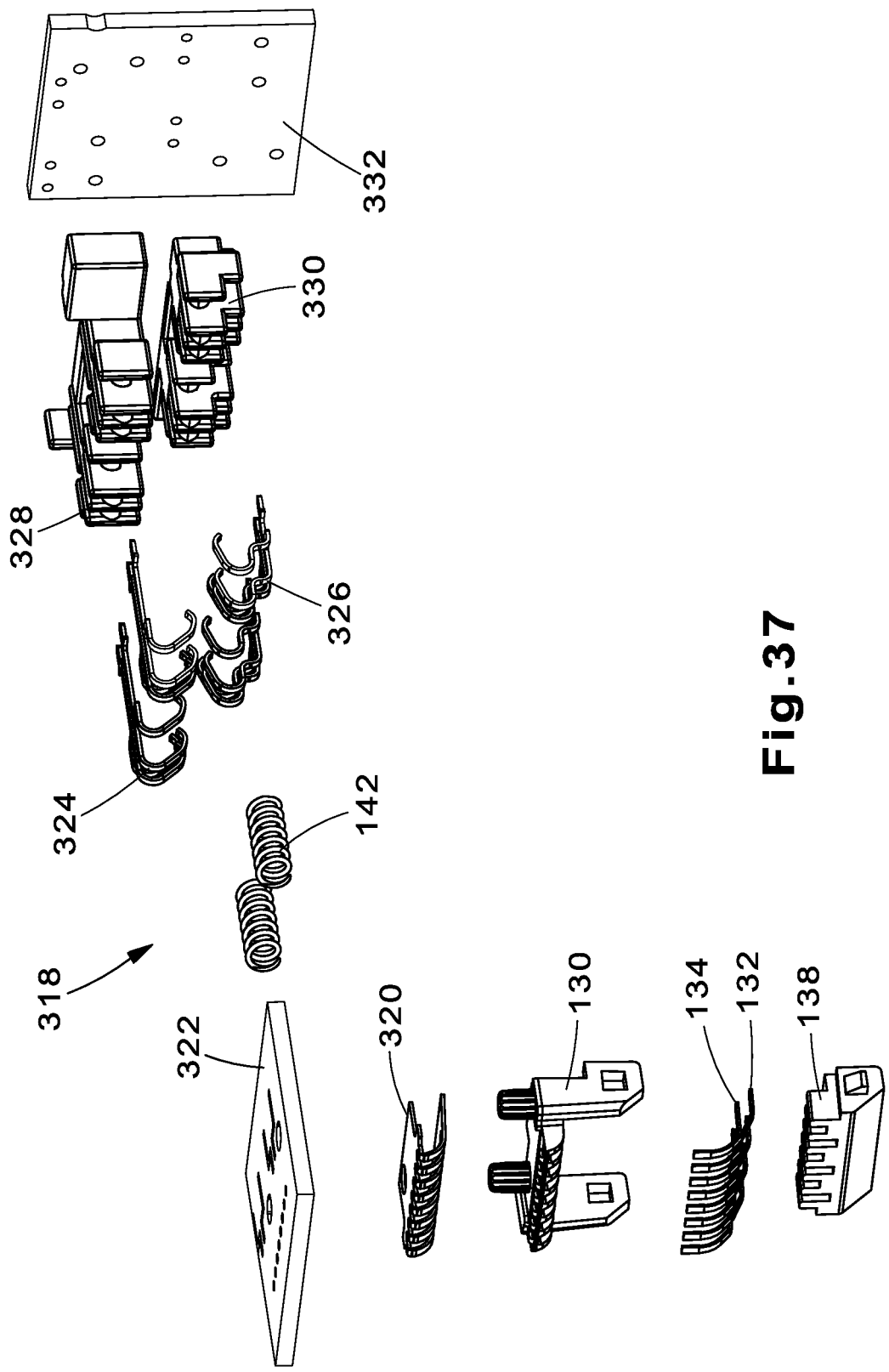
FIGS. 37-39 are isometric exploded views of the sled assembly of FIGS. 35 and 36.
Figure 38:
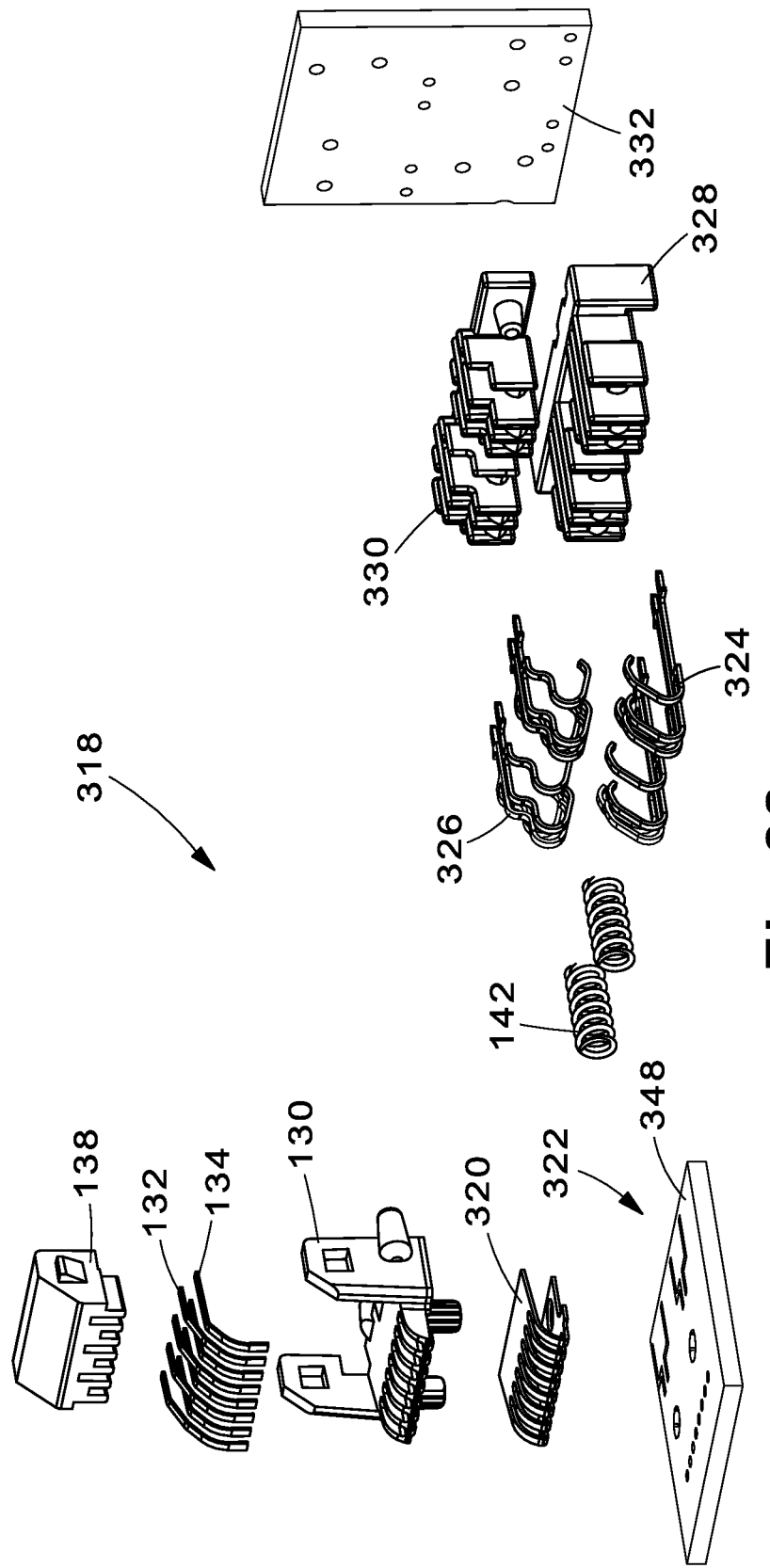
Figure 39:
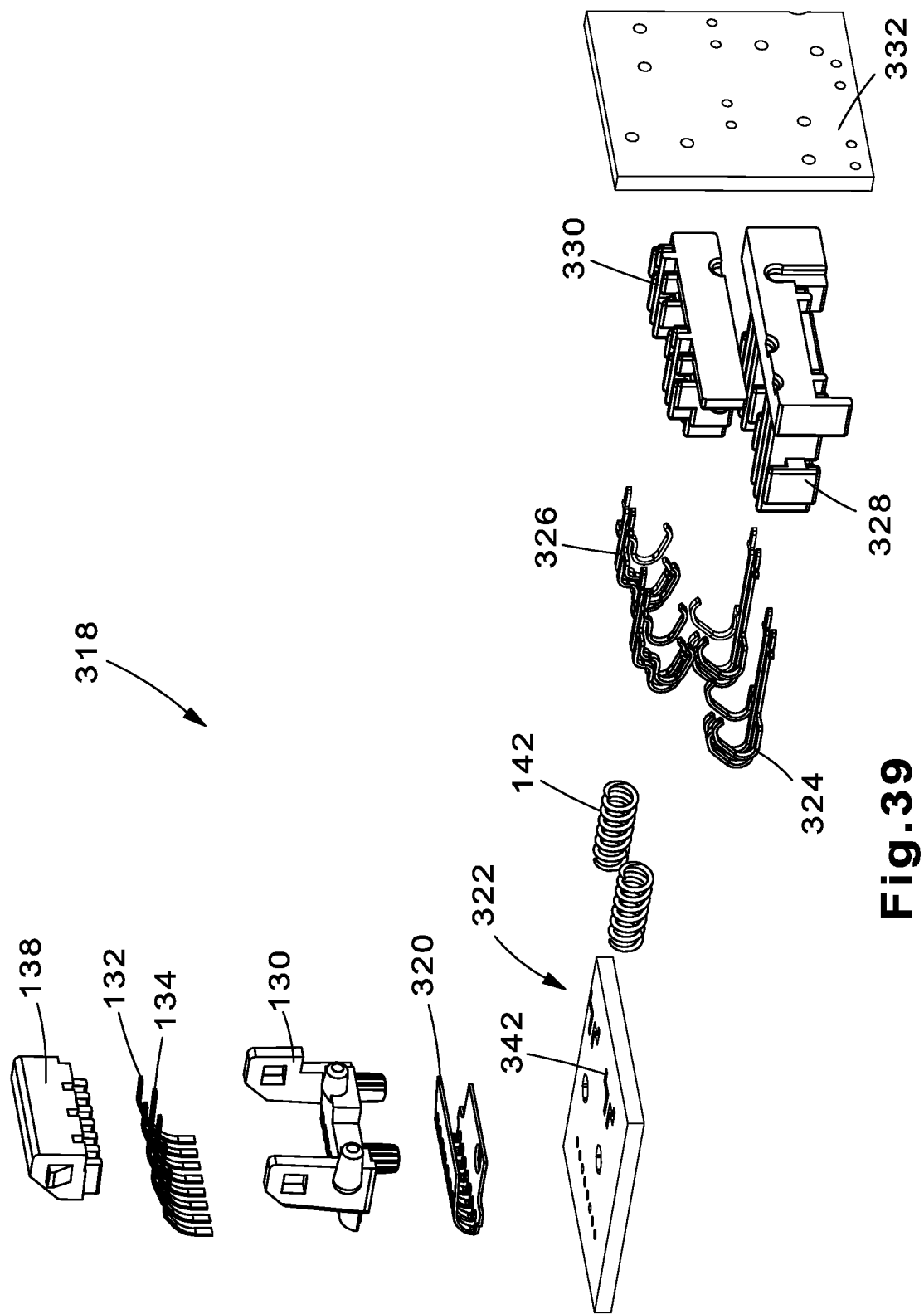

Yet another alternative embodiment of the first rigid PCB 308 is shown in FIGS. 33 and 34 with FIG. 33 showing a first side of first rigid PCB 308 and FIG. 34 showing a second side of first rigid PCB 308. First rigid PCB 308 includes first contact pads 310 and second contact pads 312. Cutouts 314 and 316 on first rigid PCB 308 are a secondary mechanical alternative that is less dependent on minor changes in plating or solder mask to ensure reliable electrical contact on the specific side of wiping contacts and contact pads. The shape of the cut out sections can be any shape so long as the contact pads provide appropriate functionality as described previously.

FIGS. 35-39 illustrate an alternative embodiment of a sled assembly 318 that could be used in jack 354 (which is similar in construction to jack 114). Sled assembly 318 includes first sled support 130, first PICs 132, second PICs 134, flexible PCB 320, second sled support 138, first rigid PCB 322, springs 142, first dual wiping contacts 324, second dual wiping contacts 326, first dual contact support 328, second dual contact support 330, and second rigid PCB 332. While flexible PCB 320 and second rigid PCB 332 may be mechanically the same as respective flexible PCB 136 and second rigid PCB 152, with the added crosstalk the electrical design of these boards may be different.

The primary difference between sled assembly 318 and the previously described sled assembly 128 is in the design of the wiping contacts and the design of the contact pads on the first rigid PCB 322.

Figure 40:
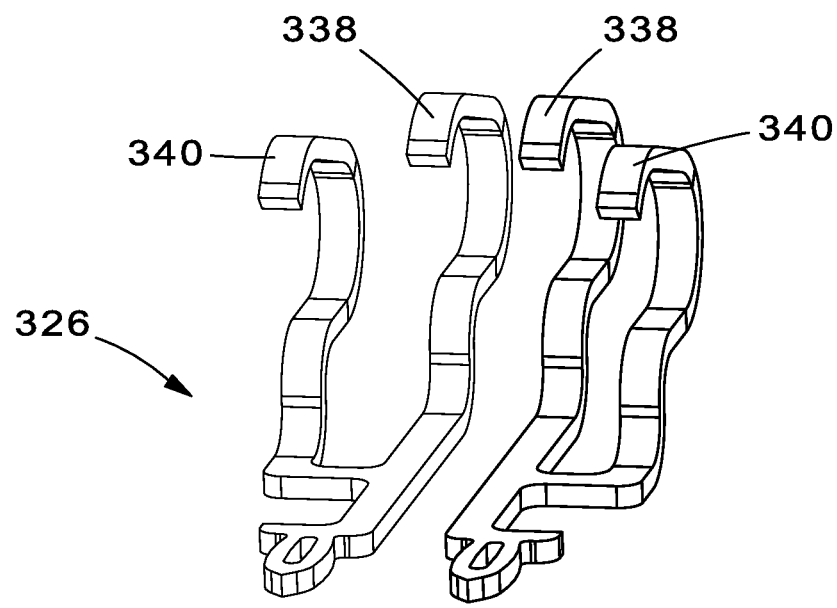
FIGS. 40 and 41 are trimetric views of dual contacts of the sled assembly of FIGS. 35 and 36.
Figure 41:
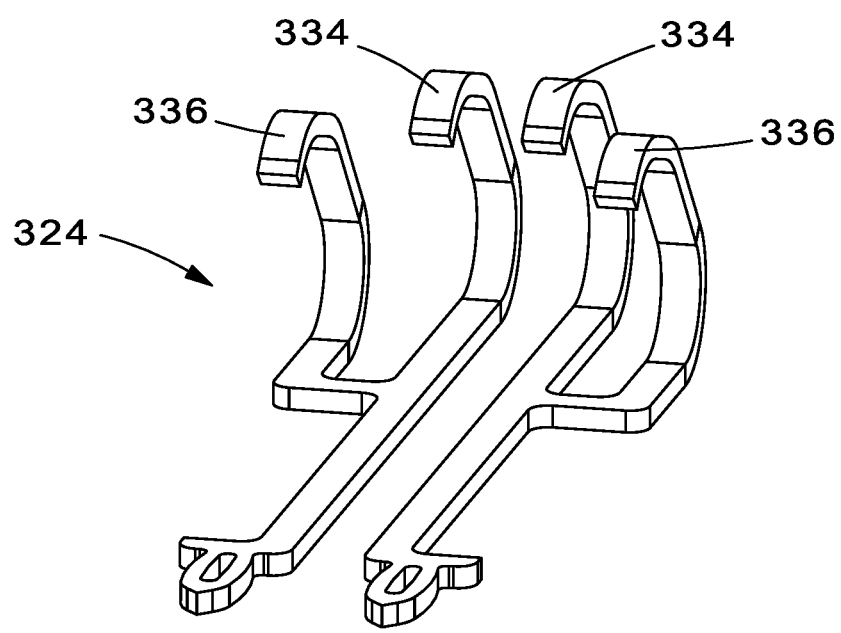
Figure 42:
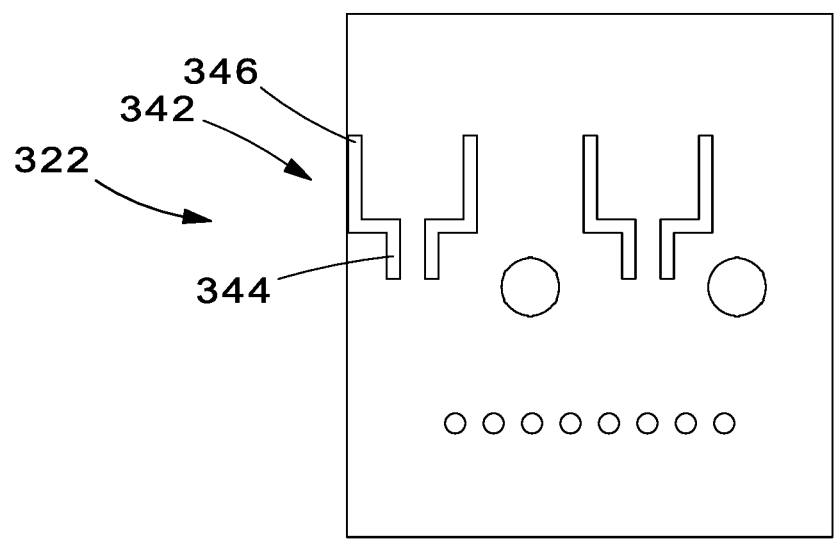
FIGS. 42 and 43 are views of a first and second sides, respectively, of a first rigid PCB of the sled assembly of FIGS. 35 and 36.
Figure 43:
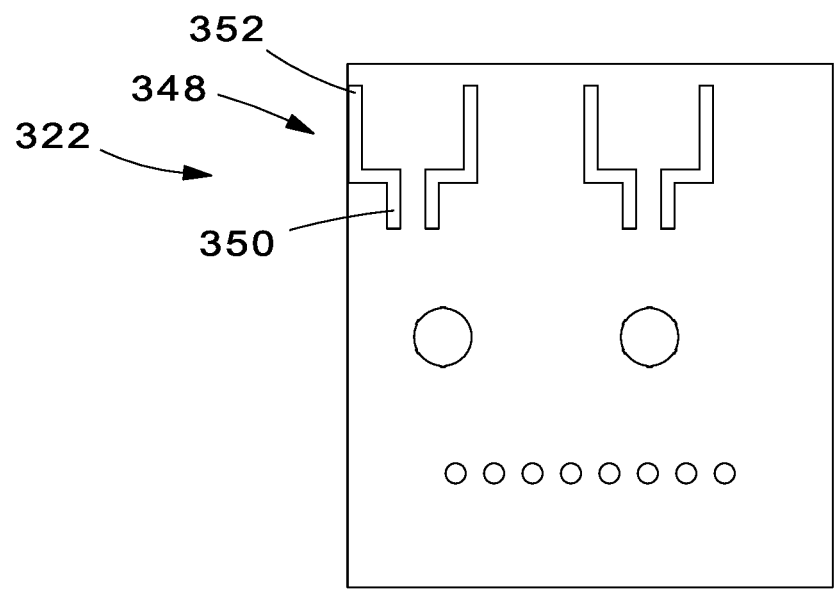

FIG. 40 is a trimetric view of second dual contacts 326 and FIG. 41 is a trimetric view of first dual contacts 324. Second dual wiping contacts 326 include two wiping contacts comprised of a preferred mating leg 338 and a sacrificial leg 340. Likewise, first dual wiping contacts 324 include two wiping contacts comprised of a preferred mating leg 334 and sacrificial leg 336. FIG. 42 illustrates a first side of first rigid PCB 322 and FIG. 43 illustrates a second side of first rigid PCB 322. It includes first dual contact pads 342, which include a mating portion 344 and sacrificial portion 346, and second dual contact pads 348, which include a mating portion 350 and sacrificial portion 352.

Figure 44:
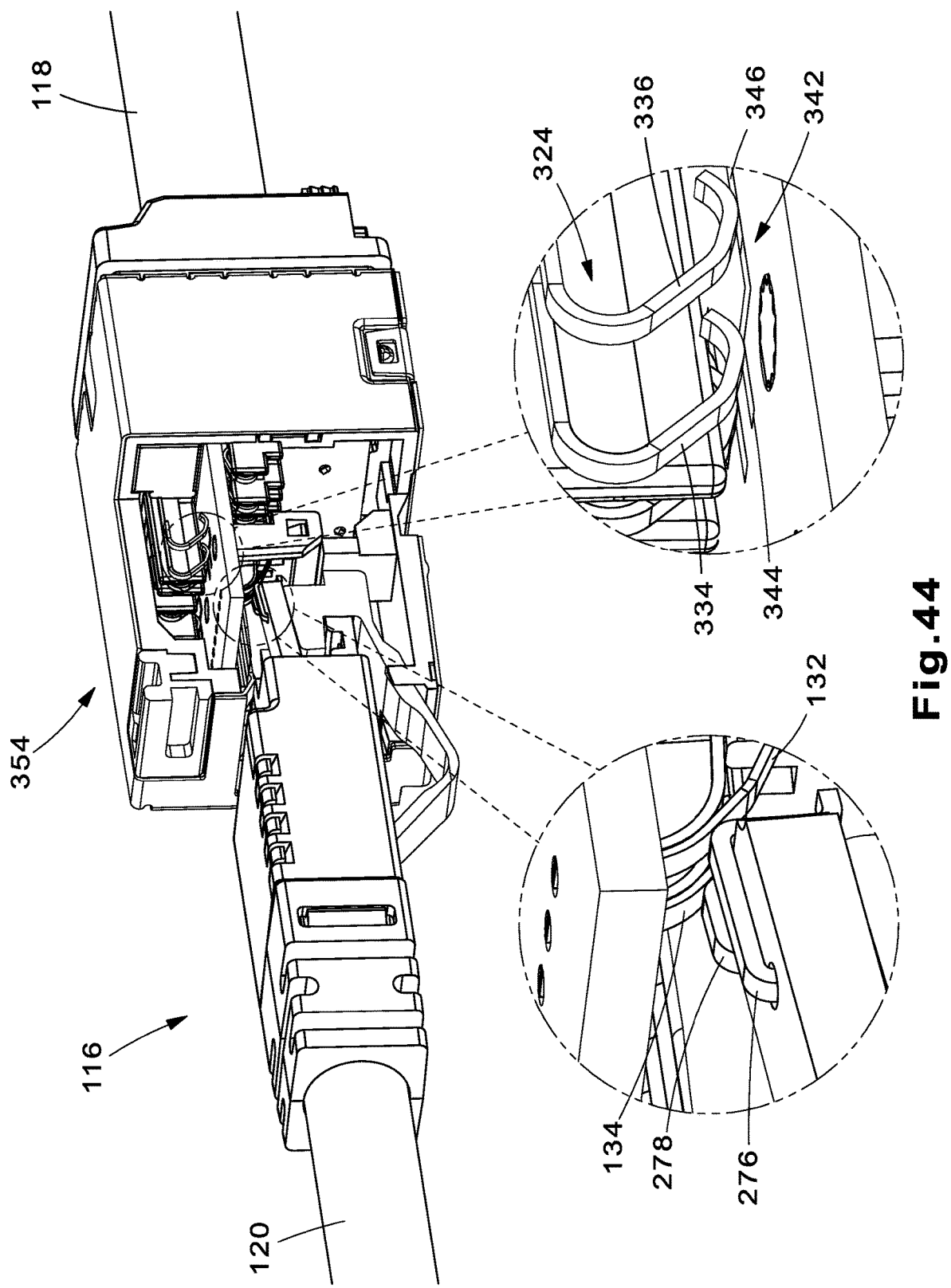
FIG. 44 is a cross-section view across the mating interface of RJ45 jack and RJ45 plug assembly in a mated state.

The interaction of the dual wiping contacts and the dual contact pads is shown in FIGS. 44-48 which illustrate cross-section views of jack 354 and plug 116 at different mating states. FIG. 44 shows the jack 354 and the plug 116 in a fully mated state. In this state wire contacts 276 and 278 are in electrical contact with respective first PICs 132 and second PICs 134. Preferred mating leg 334 of first dual wiping contacts 324 is in contact with mating portions 344 of first dual contact pads 342. Sacrificial mating leg 336 of first dual wiping contacts 324 is in superfluous contact with sacrificial portion 346 of first dual contact pads 342. Preferred mating leg 338 of second dual wiping contacts 326 is in contact with mating portion 350 of second dual contact pads 348 (not shown). Sacrificial mating leg 340 of second dual wiping contacts 326 is in superfluous contact with sacrificial leg 352 of second dual contact pads 348 (not shown).

Figure 45:
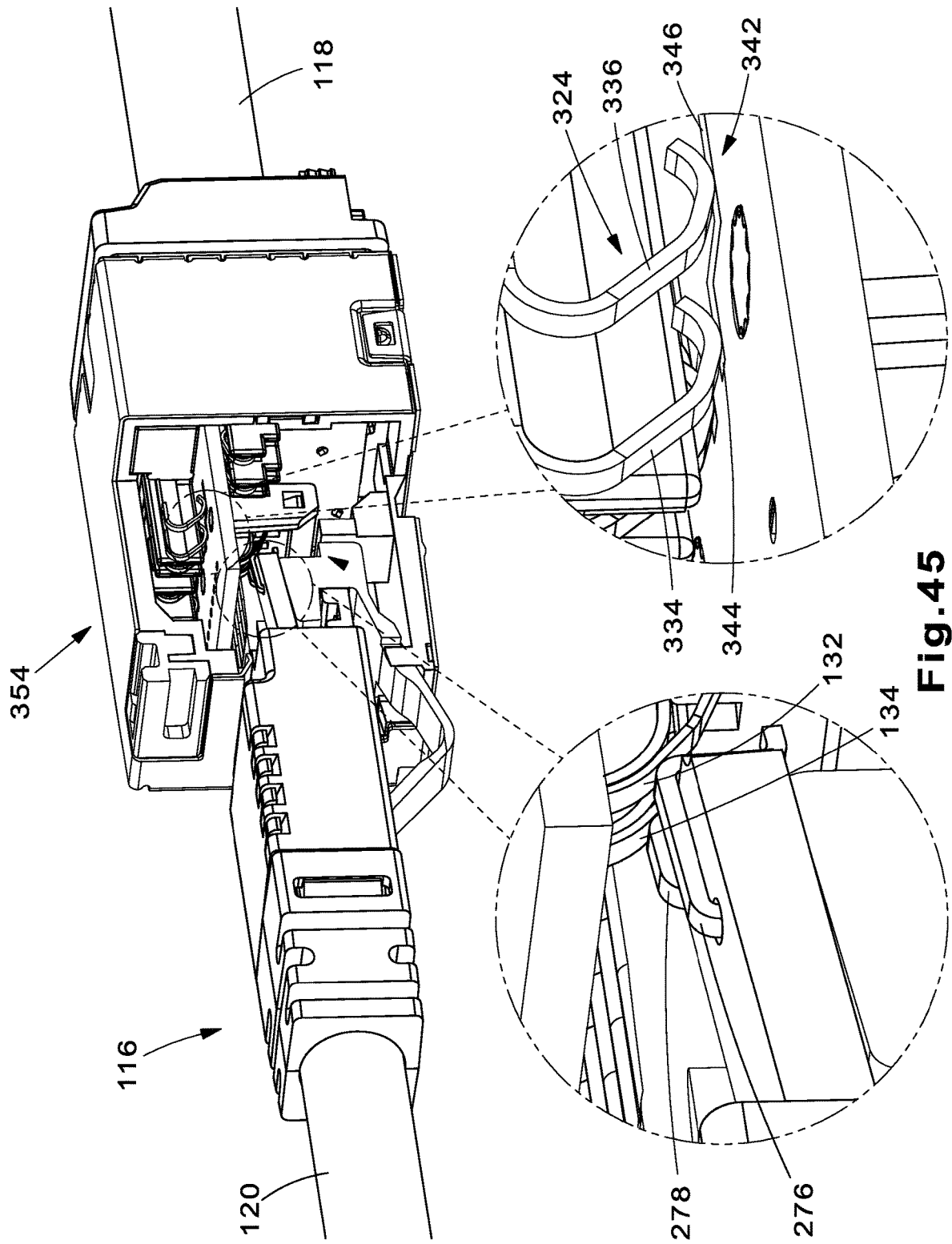
FIG. 45 is a cross-section view across the mating interface of RJ45 jack and RJ45 plug assembly in an over-travel state.

FIG. 45 is a cross-section view of RJ45 network jack 354 and RJ45 plug assembly 116, with respective cables 118 and 120, shown in the over-travel state. In this state wire contacts 276 and 278 are in electrical contact with respective first PICs 132 and second PICs 134. Preferred mating legs 334 of first dual wiping contacts 324 are in contact with mating portions 344 of first dual contact pads 342. Sacrificial mating legs 336 of first dual wiping contacts 324 are in superfluous contact with sacrificial portions 346 of first dual contact pads 342. Preferred mating legs 338 of second dual wiping contacts 326 are in contact with mating portions 350 of second dual contact pads 348 (not shown). Sacrificial mating legs 340 of second dual wiping contacts 326 are in superfluous contact with sacrificial portions 352 of second dual contact pads 348 (not shown). In between the mated state and the over-travel state there is no mechanical/electrical disconnection between the plug/jack interfaces.

Figure 46:
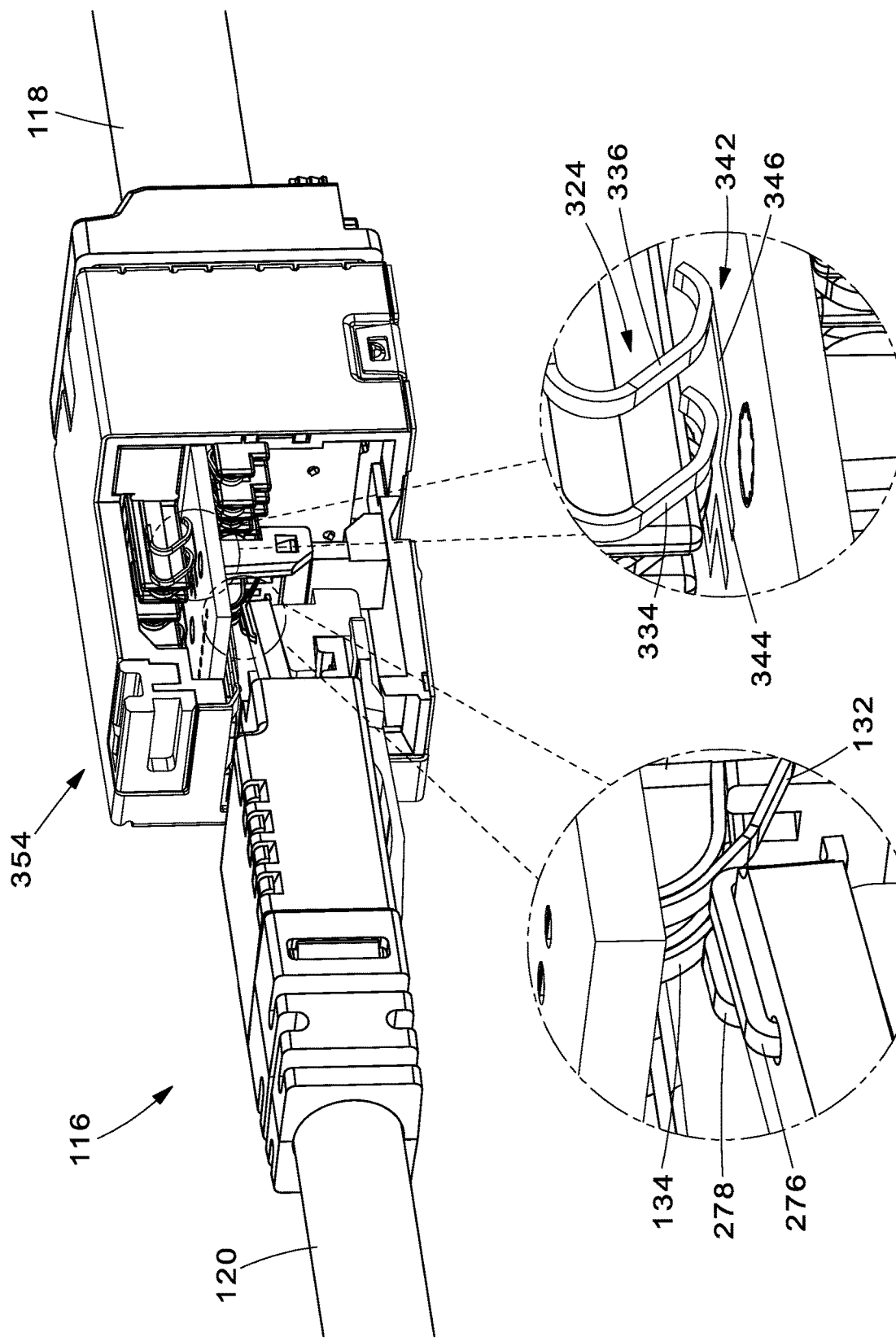
FIG. 46 is a cross-section view across the mating interface of RJ45 jack and RJ45 plug assembly in a pre-release state.

FIG. 46 is a cross-section view of RJ45 network jack 354 and RJ45 plug assembly 116, with respective cables 118 and 120, shown in the pre-release state. In this state wire contacts 276 and 278 are in electrical contact with respective first PICs 132 and second PICs 134. Preferred mating legs 334 of first dual wiping contacts 324 are no longer in contact with mating portions 344 of first dual contact pads 342. However, sacrificial mating legs 336 of first dual wiping contacts 324 are still in contact with sacrificial portions 346 of first dual contact pads 342. Likewise, while preferred mating legs 338 of second dual wiping contacts 326 are no longer in contact with mating portions 350 of second dual contact pads 348 (not shown), sacrificial mating legs 340 of second dual wiping contacts 326 are still in contact with sacrificial portions 352 of second dual contact pads 348. Given that continuity between the dual wiping contacts and the dual contact pads is still maintained at this this stage, the disconnection (or connection in case of plug insertion) of the preferred mating legs from the respective mating portions of the dual contact pads does not result an arcing or corona discharge, preventing potential damage to the respective surfaces.

Figure 47:
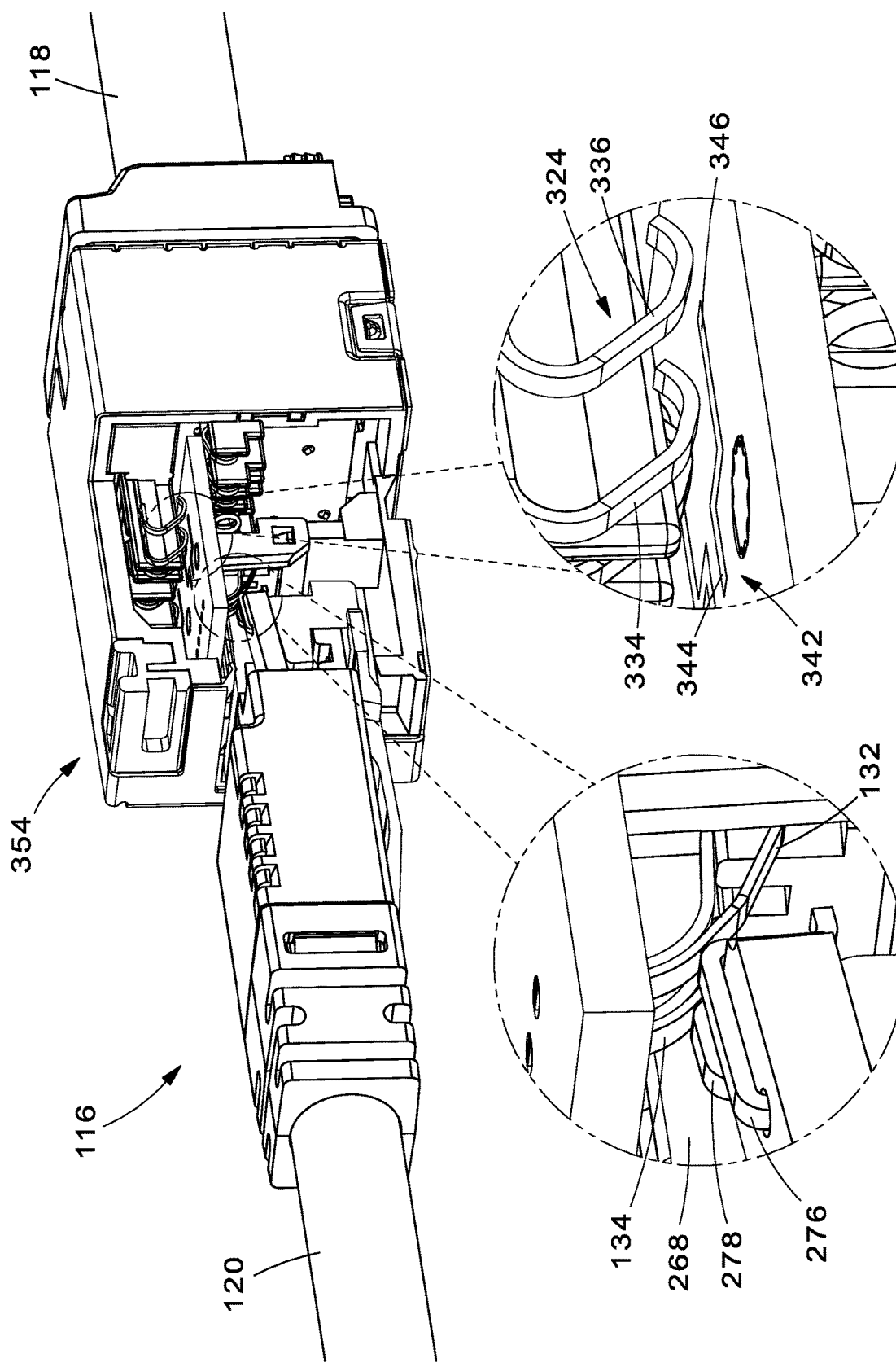
FIG. 47 is a cross-section view across the mating interface of RJ45 jack and RJ45 plug assembly in a release state.

FIG. 47 is a cross-section view of RJ45 network jack 354 and RJ45 plug assembly 116, with respective cables 118 and 120, shown in the release state. In this state wire contacts 276 and 278 are in electrical contact with respective first PICs 132 and second PICs 134. Preferred mating legs 334 of first dual wiping contacts 324 are no longer in contact with mating portions 344 of first dual contact pads 342. Sacrificial mating legs 336 of first dual wiping contacts 324 are no longer in contact with sacrificial portions 346 of first dual contact pads 342. Preferred mating legs 338 of second dual wiping contacts 326 are no longer in contact with mating portions 350 of second dual contact pads 348 (not shown). Sacrificial mating legs 340 of second dual wiping contacts 326 are no longer in contact with sacrificial portions 352 of second dual contact pads 348 (not shown). In between the pre-release state and the release state respective sacrificial mating legs disconnect from sacrificial portions of contact pads (during the insertion of the plug into the jack the respective sacrificial mating legs connect to sacrificial portions of contact pads). The electrical discharge upon disconnection/connection of the sacrificial mating legs and the sacrificial portions of the contact pads occurs outside of the preferred mating zone and in the sacrificial areas. This helps maintain the integrity of the preferred mating legs of the dual wiping contacts and the mating portion of the dual contact pads.

Figure 48:
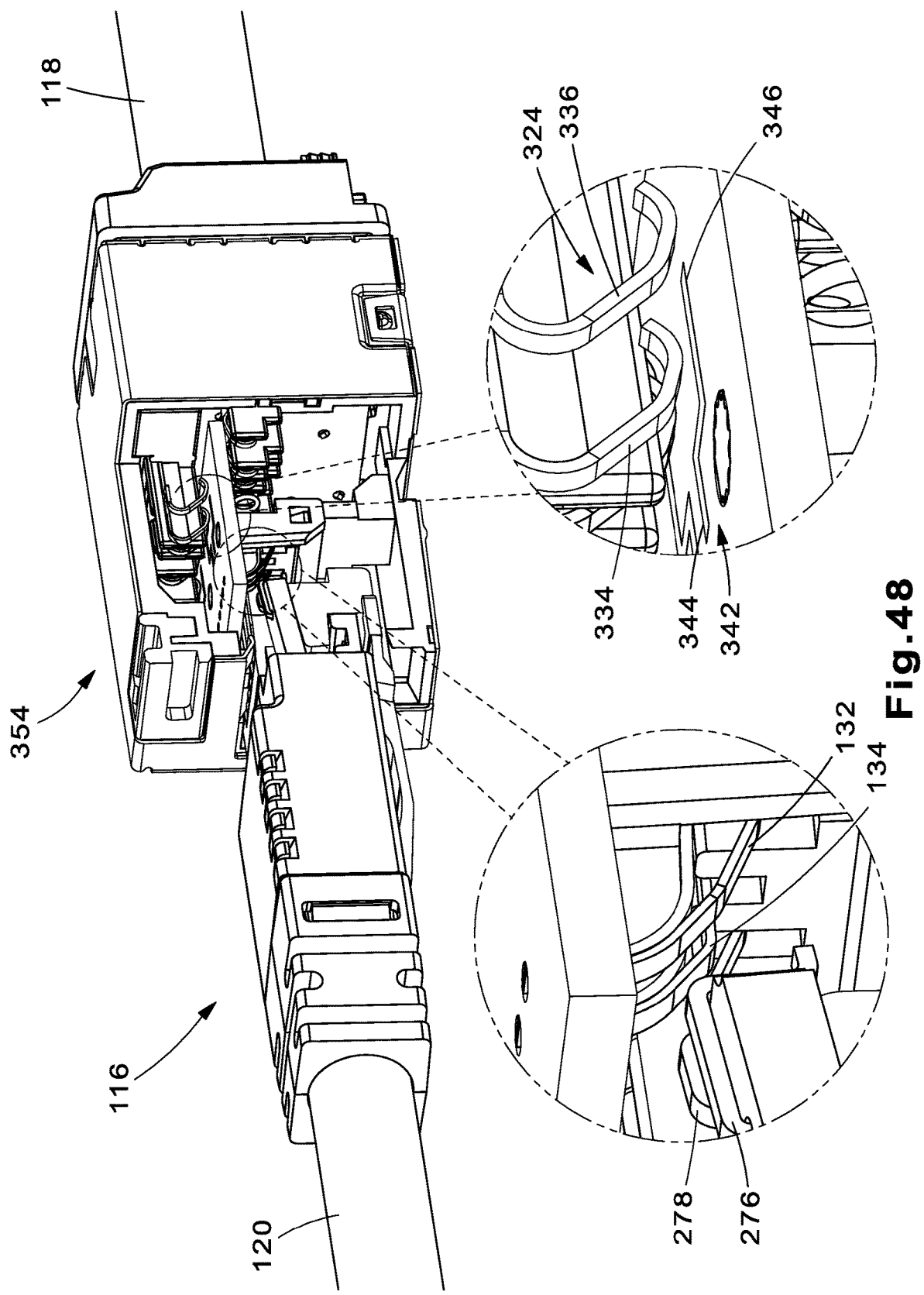
FIG. 48 is a cross-section view across the mating interface of RJ45 jack and RJ45 plug assembly in an unmated state.

FIG. 48 is a cross-section view of RJ45 network jack 354 and RJ45 plug assembly 116, with respective cables 118 and 120, shown in the unmated state. In this state wire contacts 276 and 278 are no longer in electrical contact with respective first PICs 132 and second PICs 134. Preferred mating legs 334 of first dual wiping contacts 324 are no longer in contact with mating portions 344 of first dual contact pads 342. Sacrificial mating legs 336 of first dual wiping contacts 324 are no longer in contact with sacrificial portions 346 of first dual contact pads 342. Preferred mating legs 338 of second dual wiping contacts 326 are no longer in contact with mating portions 350 of second dual contact pads 348 (not shown). Sacrificial mating legs 340 of second dual wiping contacts 326 are no longer in contact with sacrificial portions 352 of second dual contact pads 348. Sled assembly 318 is in approximately the same position in the unmated state and the release state.

First wiping contacts 144, second wiping contacts 146, first dual wiping contacts 324, and second dual wiping contacts 326 are shown with compliant pins but may be attached to respective second rigid PCBs through any non-limiting means. First PICs 132 and second PICs 134 are shown with solder connections but may be attached to respective first rigid PCBs through any non-limiting means. Cable 118 and 120 are shown as shielded cable but may be any other non-limiting form of cable including but not limited to F/UTP or UTP cabling.

Figure 49:
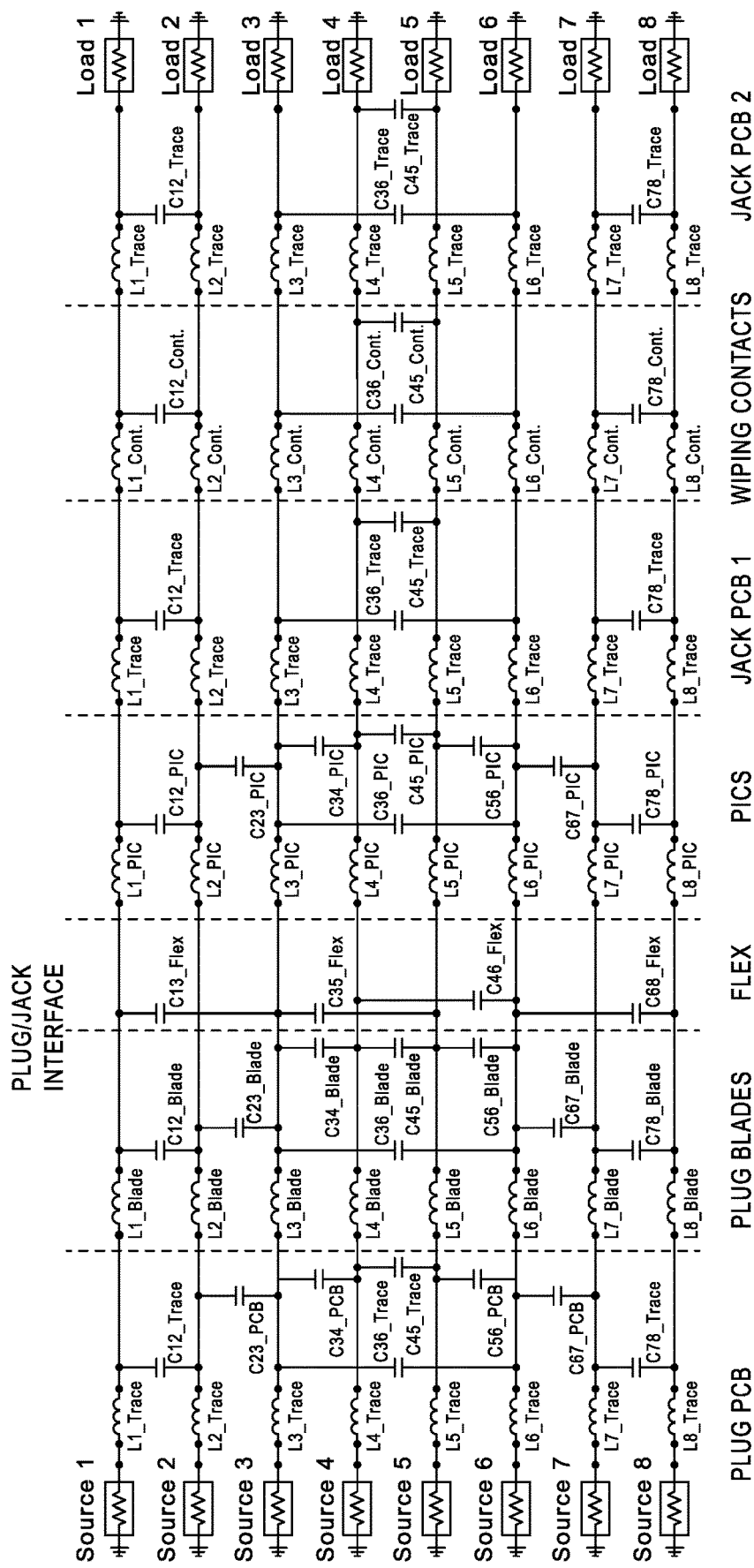
FIG. 49 is schematic for the plug/jack combination according to an embodiment of the present invention.

An exemplary schematic for the plug 116/jack 114,354 combination is shown in FIG. 49.

Figure 50:
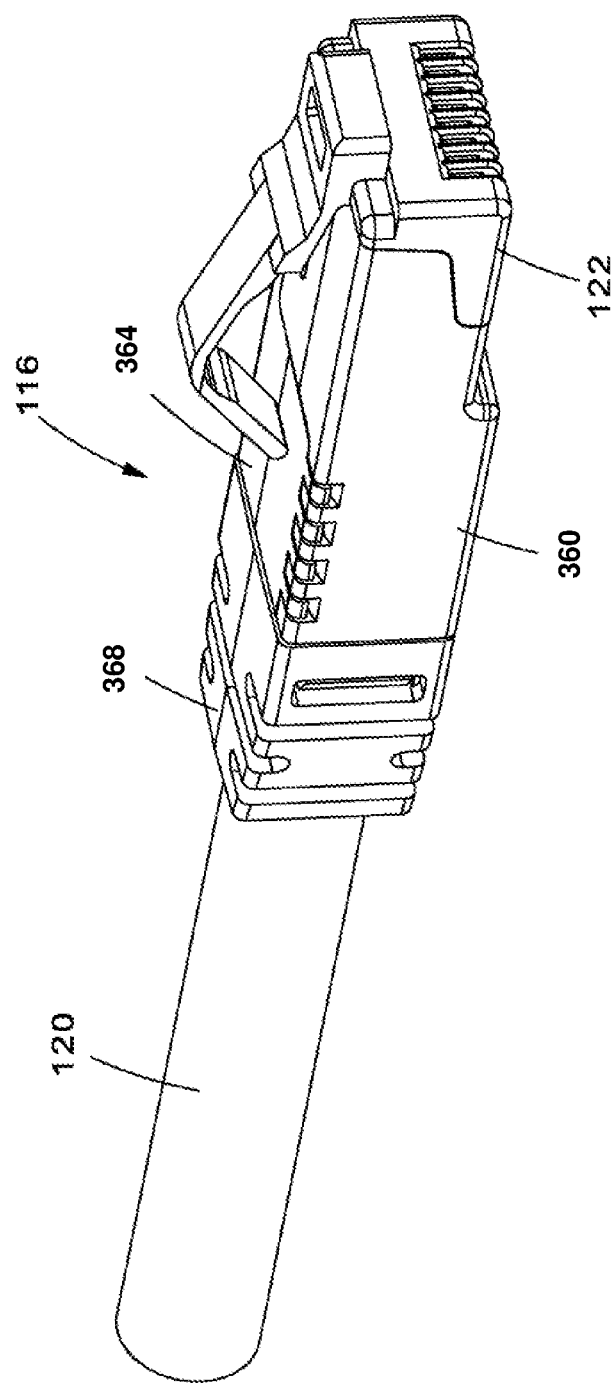
FIG. 50 is an isometric view of an RJ45 plug according to an embodiment of the present invention.
Figure 52:
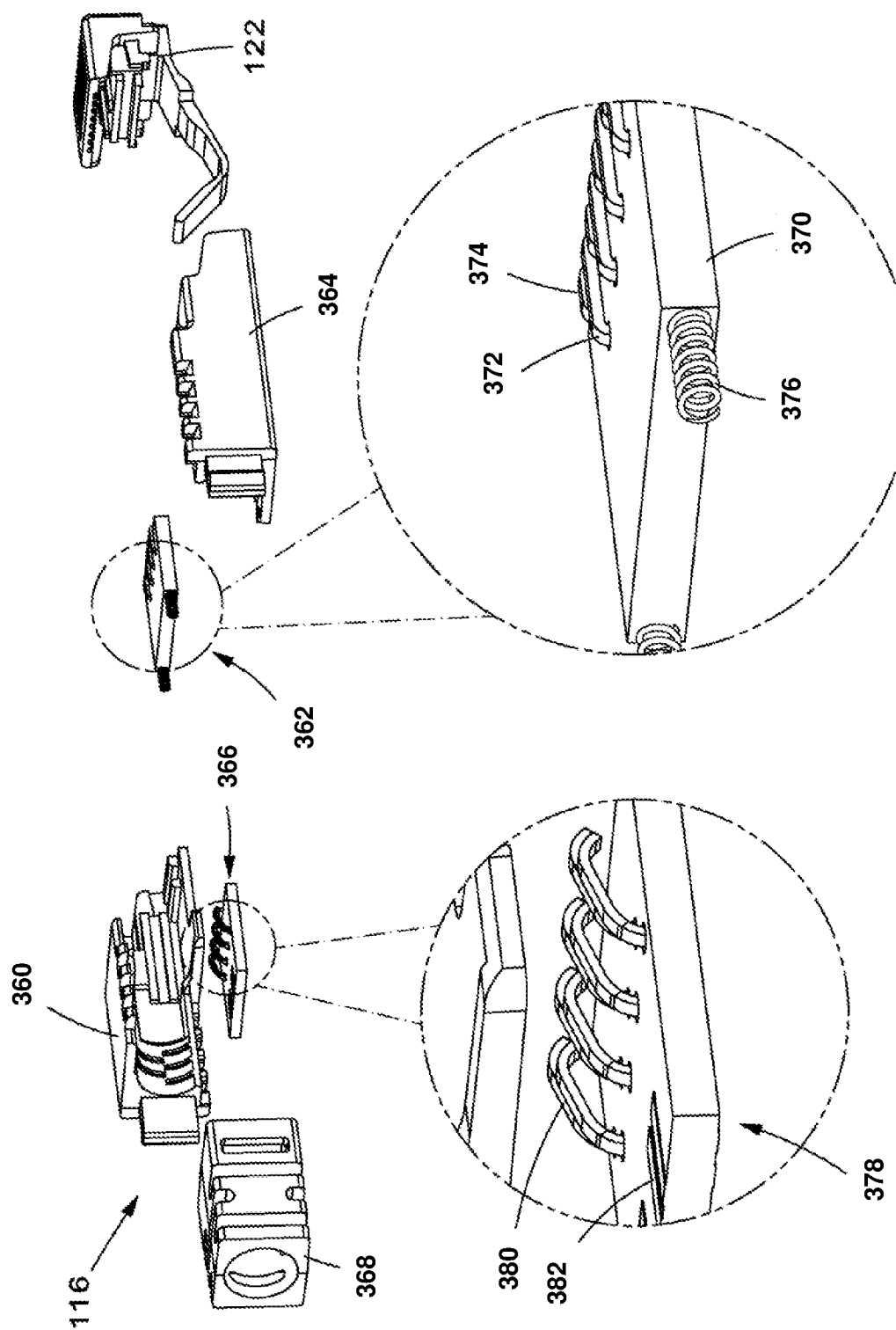
Figure 53:
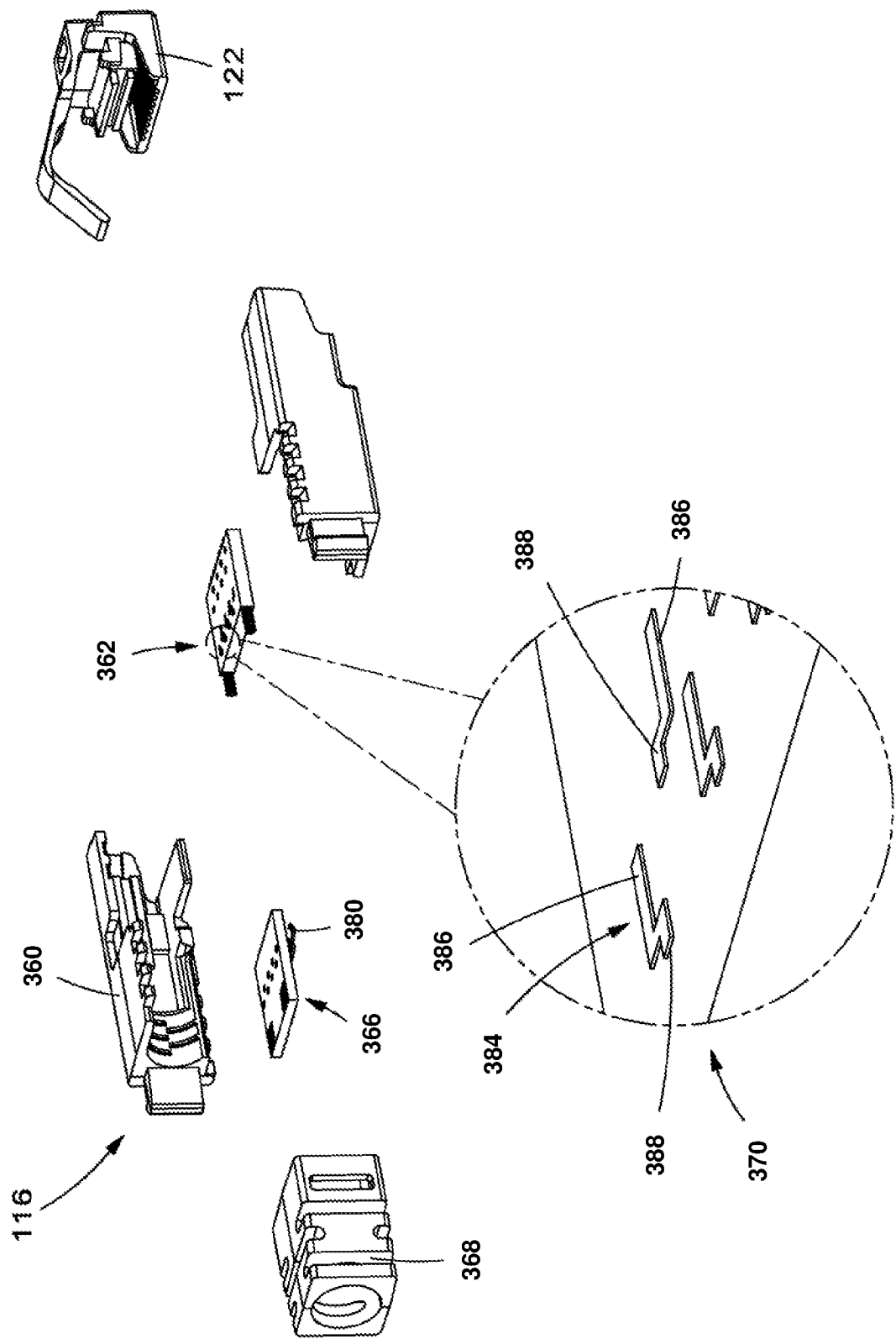

While the above-described embodiments illustrate examples of jacks with improved robustness for PoE, it is also possible to provide improved designs in the plug. FIG. 50 illustrates an isometric view of one such plug 116 by way of an exemplary embodiment. Plug 116 includes front housing 122, left housing 360, right housing 364, and bend radius control boot 368. FIGS. 51-53 provide exploded views of the plug 116. As shown therein, plug 116 also includes a first PCB assembly 362 with first plug contacts 372, second plug contacts 374, first rigid PCB 370, and springs 376, and a second PCB assembly 366 with wiping contacts 380 and second rigid PCB 378. Back PCB pads 382 on second rigid PCB 378 are used to terminate cable 120; through other non-limiting means of termination may be used. During mating/un-mating with a corresponding jack, while second rigid PCB 378 remains stationary relative to the plug's housings, the first rigid PCB assembly 362 translates between different positions. The first rigid PCB 370 and second rigid PCB 378 are electrically linked to each other via wiping contacts 380 and contact pads 384.

Figure 54:
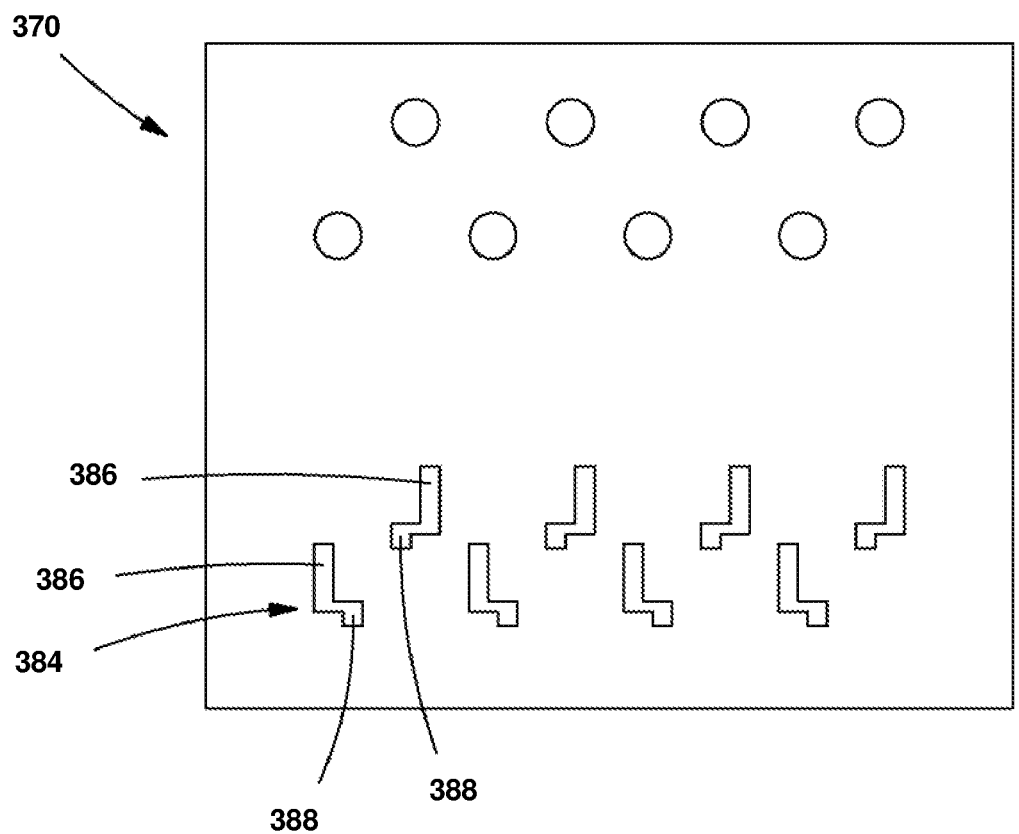
FIG. 54 is a first side of a first rigid PCB according to an embodiment of the present invention.

FIG. 54 illustrates a first side of first rigid PCB 370. Each contact pad 384 contains a mating portion 386 and a disconnect portion 388. The mating portion is the portion of a contact pad that is engaged with a respective wiping contact during the mated and over-travel state (the over-travel state allows for insertion of RJ45 plug assembly 116 into RJ45 network jack 54. The disconnect portion is the portion of a contact pad that is engaged with a respective wiping contact during the pre-release state. As will be made clear during the discussion of the following drawings, that each mating portion and respective disconnect portion are displaced laterally from each other. This allows a single wiping contact that is wide enough to at least partially overlap both of the portions to rely on one side thereof to make contact with the mating portion and to rely on the second side thereof to make contact with the disconnect portion. This allows the second side (i.e., the side that makes contact with the disconnect portion) to sustain most of the damage that may be caused by PoE, leaving the first side (i.e., the side that makes contact with the mating portion) unscathed.

Figure 55:
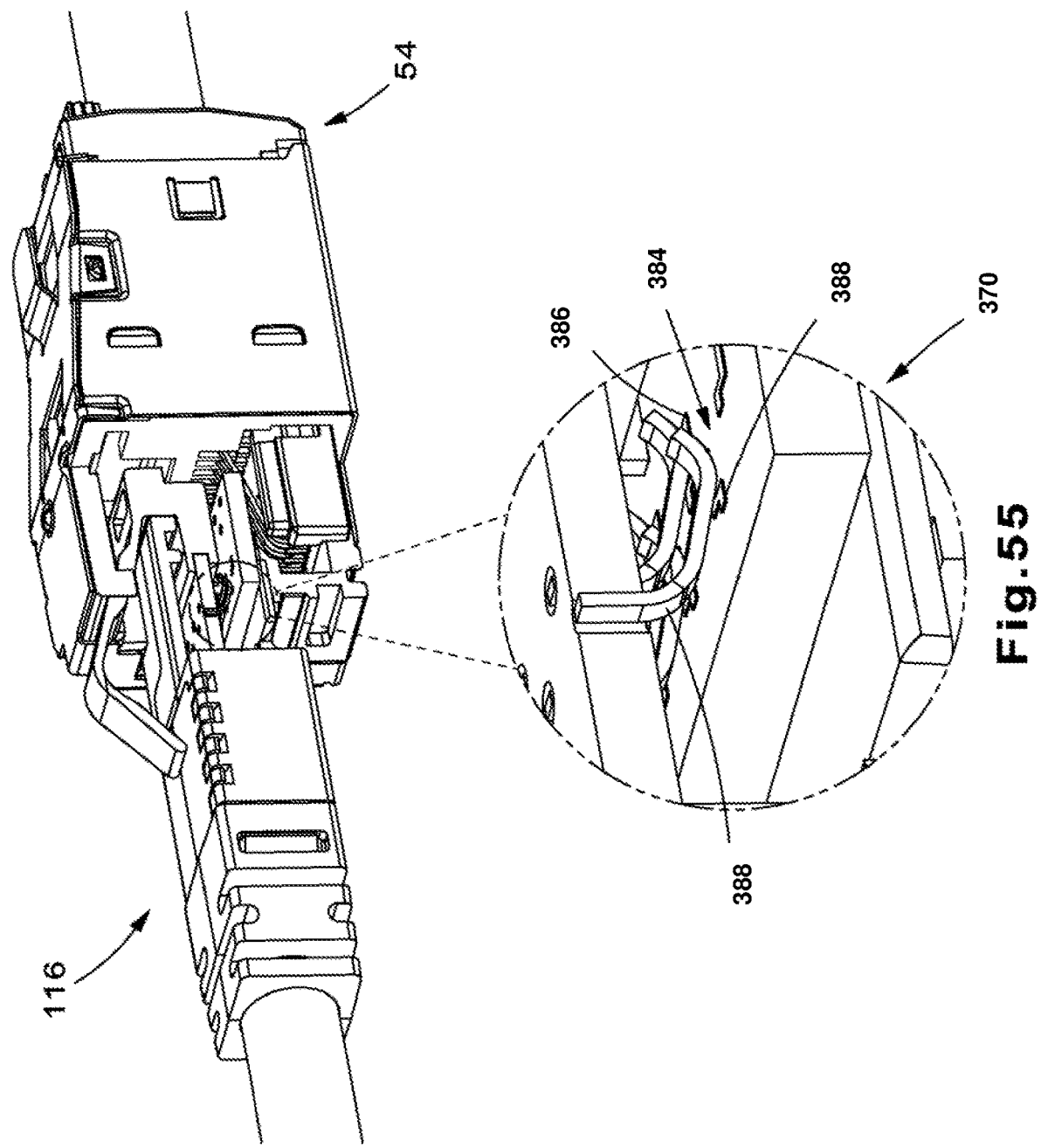
FIG. 55 is a cross-section view across the mating interface of RJ45 jack and RJ45 plug assembly in a mated state.

FIG. 55 is a cross-section view across the mating interface of shielded RJ45 network jack 54 and RJ45 plug assembly 116 (wiping contacts 380 and first rigid PCB 370 are not sectioned to show the interface between wiping contacts 380 and first rigid PCB 370). In this state plug contacts 372 and 374 are in electrical contact with respective PICs 70. Wiping contacts 380 are in contact with mating portion 386 of contact pads 384. This is the static (mated) state of an RJ45 network plug 116 mated with an RJ45 network jack 54.

Figure 56:
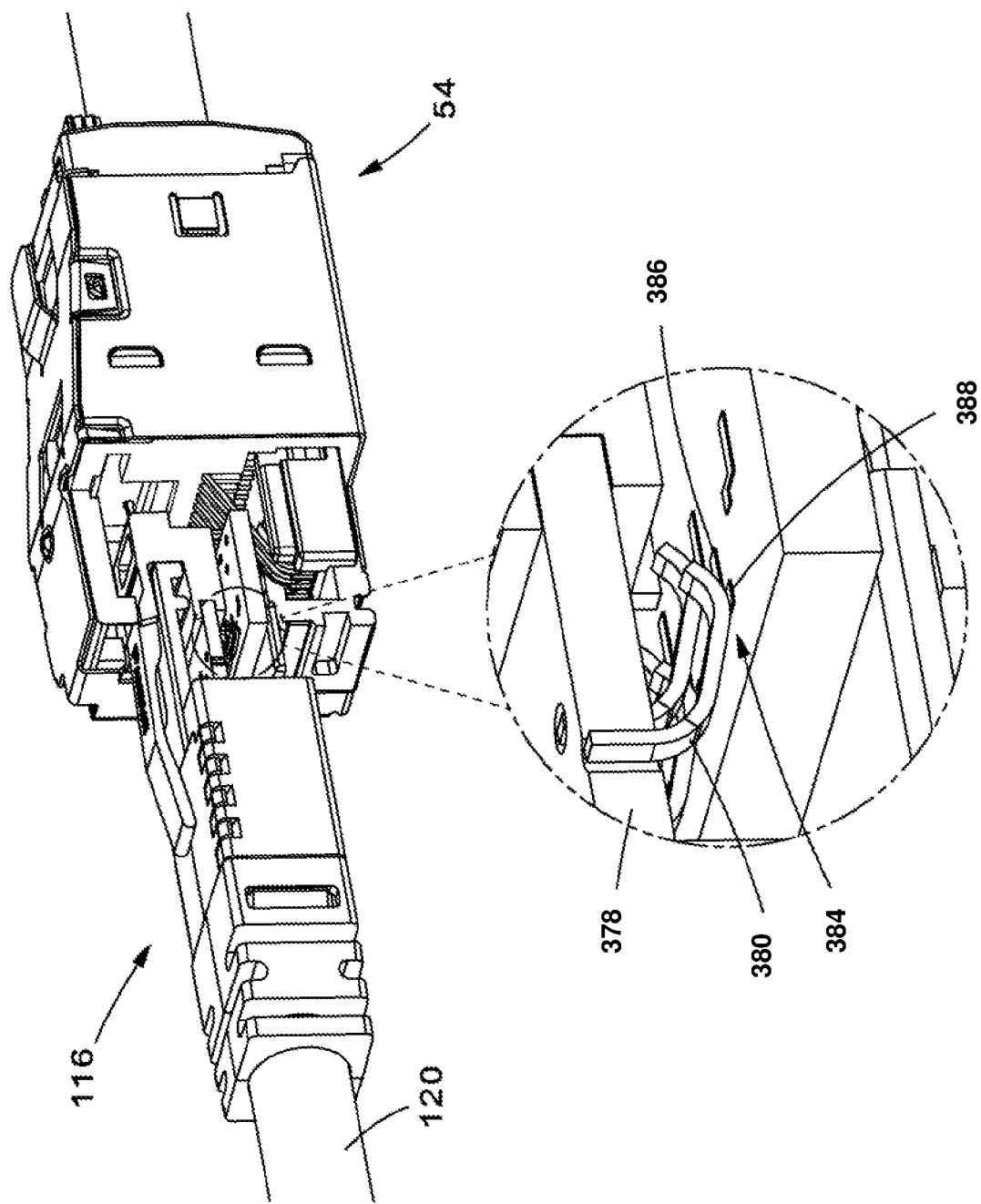
FIG. 56 is a cross-section view across the mating interface of RJ45 jack and RJ45 plug assembly in a pre-release state.

FIG. 56 is a cross-section view across the mating interface of shielded RJ45 network jack 54 and RJ45 plug assembly 116 shown in the pre-release state. In this state plug contacts 372 and 374 are in electrical contact with respective PICs 70. Wiping contacts 380 are in contact with disconnect portion 388 of contact pads 384. In the pre-release state there is still an electrical connection throughout the channel, but it is not a static state of installed RJ45 network jack 54 and RJ45 plug assembly 116. This state occurs either during insertion of RJ45 plug assembly 116 into RJ45 network jack 54 prior to the mated state, or upon retraction of RJ45 plug assembly 116 from RJ45 network jack 54 prior to the release state.

Figure 57:
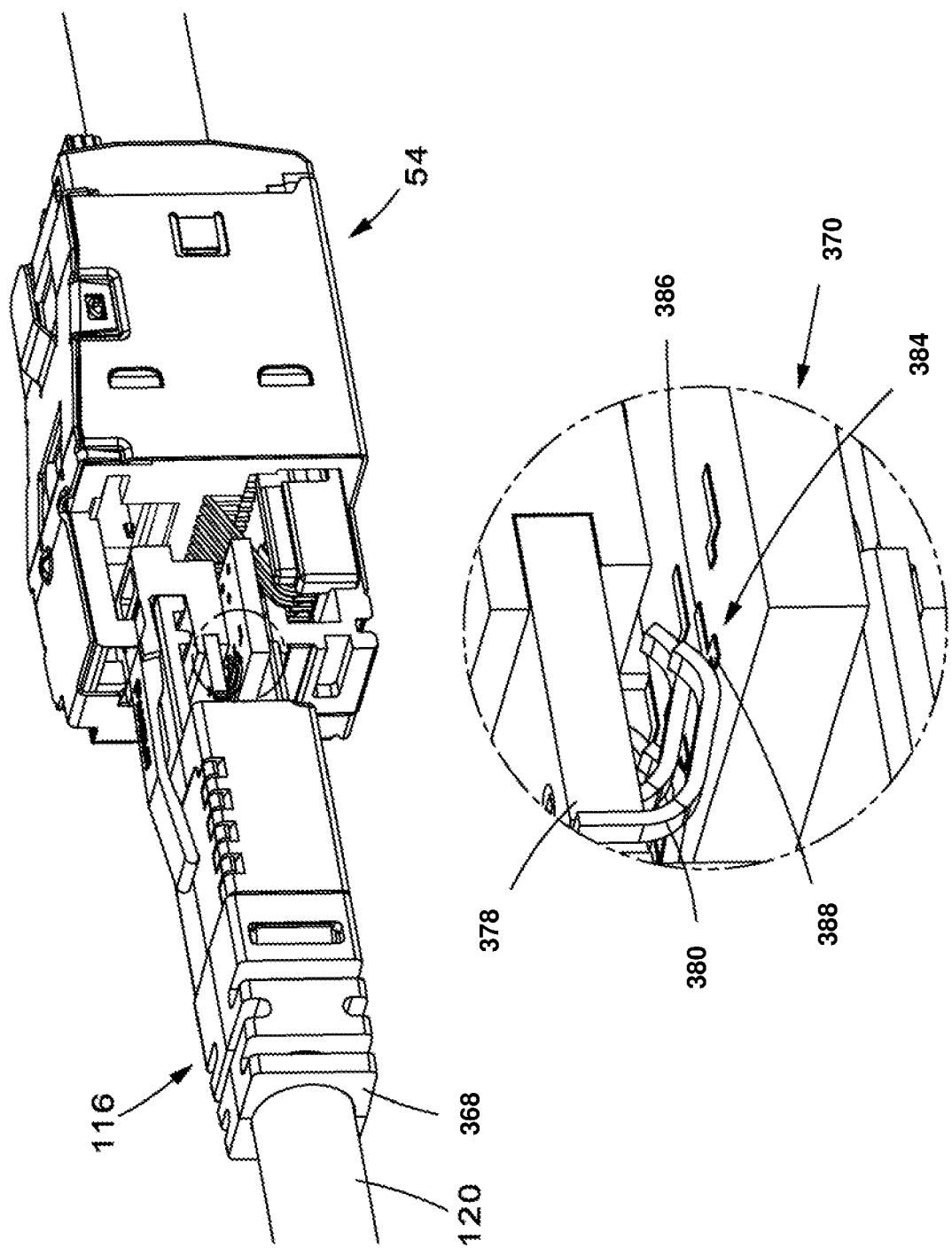
FIG. 57 is a cross-section view across the mating interface of RJ45 jack and RJ45 plug assembly in a release state.

FIG. 57 is a cross-section view across the mating interface of shielded RJ45 network jack 54 and RJ45 plug assembly 116 in the release state. In this state, while plug contacts 372 and 374 are in electrical contact with respective PICs 70, wiping contacts 380—are no longer in contact with contact pads 384. In the release state there is no longer an electrical connection throughout the channel. This state occurs either during insertion of RJ45 plug assembly 116 into RJ45 network jack 54 prior to the pre-release state or upon retraction of RJ45 plug assembly 116 from RJ45 network jack 54 after the pre-release state. In between the pre-release state and the release state, respective wiping contacts 380 disconnect from contact pads 384 along the disconnect portions 388. The electrical discharge upon disconnection of wiping contacts 380 and contact pads 384 occurs on disconnect portion 388 and corresponding side of wiping contact 380. This is opposite of the side of the wiping contact 380 that contacts the mating portion, controlling where the damage to the contact occurs in the case of PoE.

In between the mated state and the release state there is approximately 0.040" of travel for first rigid PCB assembly. In the mated/over-travel state the plug/jack interface is approximately in the IEC-60603-7:2010 preferred electrical mating point location. In all other states the plug/jack interface is typically not in the IEC-60603-7:2010 preferred electrical mating point location, and the force between PICs 70 and plug contacts 372 and 374 overcomes the force from springs 376. After the release state, the unmated state follows in which plug contacts 372 and 374 are no longer in electrical contact with respective PICs 70.

To ensure contact on a specific side of contact pads 384, it is preferred that contact pads 384 be raised with respect to the rest of the PCB in the area of contact. Some non-limiting means of ensuring reliable contact can include increasing the plating thickness on contact pads 384 or removing/lowering the adjacent solder mask.

Figure 58:
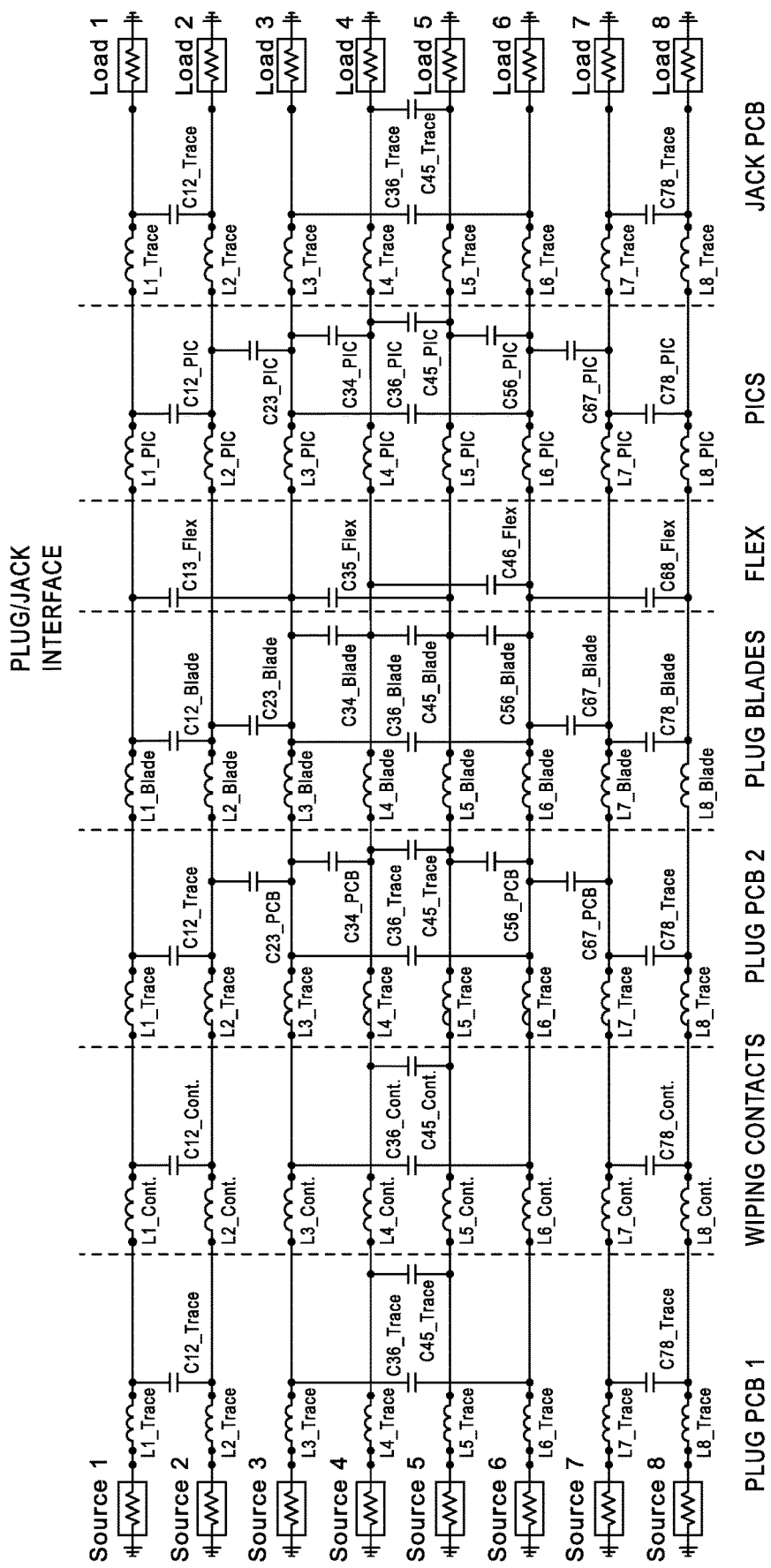
FIG. 58 is schematic for the plug/jack combination according to an embodiment of the present invention.

FIG. 58 illustrates an exemplary schematic for the plug 116/jack 54 combination.

Note that while this invention has been described in terms of several embodiments, these embodiments are non-limiting (regardless of whether they have been labeled as exemplary or not), and there are alterations, permutations, and equivalents, which fall within the scope of this invention. For example, while references have been made to rigid PCBs, one of ordinary skill in the art would recognize that the use of flexible PCBs or combinations of flex/rigid PCBs would also be within the scope of the disclosure. Additionally, the described embodiments should not be interpreted as mutually exclusive, and, should instead be understood as potentially combinable if such combinations are permissive. Furthermore, in some cases like same numbers are used to refer to similar elements in different embodiment. It should also be noted that there are many alternative ways of implementing the methods and apparatuses of the present invention. It is therefore intended that claims that may follow be interpreted as including all such alterations, permutations, and equivalents as fall within the true spirit and scope of the present invention.

We claim:

1. A communication connector comprising:
    a housing with an opening;
    a sled assembly contained within the housing wherein the sled assembly has a horizontally oriented printed circuit board (PCB), a sled support connected to the PCB, a set of plug interface contacts connected to the sled support, contact pads located on the PCB wherein the contact pads have a mating portion and a disconnect portion electrically connected to each other wherein the sled assembly is configured to move in a horizontal direction; and
    a plurality of wiping contacts within the housing, held in a fixed position relative to the housing, and configured to engage the mating portion of the contact pads when the wiping contact is in a mated or over travel state and further configured to engage the disconnect portion when the wiping contact is in a pre-release or release state.

2. The connector of claim 1, wherein the sled support comprises a first sled support and a second sled support.

3. The connector of claim 2, further comprising a flexible printed circuit board secured between the first sled support and the second sled support.

4. The connector of claim 1, wherein the mating portion and the disconnect portion are positioned to contact alternate sides of the wiping contact.

\* \* \* \* \*